(12) United States Patent
Wilensky et al.

(10) Patent No.: US 11,409,423 B1
(45) Date of Patent: Aug. 9, 2022

(54) DYNAMIC IMAGE FILTERS FOR MODIFYING A DIGITAL IMAGE OVER TIME ACCORDING TO A DYNAMIC-SIMULATION FUNCTION

(71) Applicant: Adobe Inc., San Jose, CA (US)

(72) Inventors: Gregg Wilensky, New York, NY (US); Russell Preston Brown, Los Altos, CA (US); Michael Kaplan, Bowen Island, CA (US); David Tristram, Santa Cruz, CA (US)

(73) Assignee: Adobe Inc., San Jose, CA (US)

( * ) Notice: Subject to any disclaimer, the term of this patent is extended or adjusted under 35 U.S.C. 154(b) by 0 days.

(21) Appl. No.: 17/156,994

(22) Filed: Jan. 25, 2021

(51) Int. Cl.
| | |
|---|---|
| *G06F 3/0482* | (2013.01) |
| *G06F 3/04845* | (2022.01) |
| *G06T 11/00* | (2006.01) |
| *G06T 1/00* | (2006.01) |
| *G06F 3/04847* | (2022.01) |
| *G06T 5/50* | (2006.01) |
| *G06F 30/28* | (2020.01) |
| *G06T 5/20* | (2006.01) |

(52) U.S. Cl.
CPC ........ *G06F 3/04845* (2013.01); *G06F 3/0482* (2013.01); *G06F 3/04847* (2013.01); *G06F 30/28* (2020.01); *G06T 1/0007* (2013.01); *G06T 5/20* (2013.01); *G06T 5/50* (2013.01); *G06T 11/001* (2013.01); *G06T 2200/24* (2013.01); *G06T 2207/20104* (2013.01); *G06T 2207/20212* (2013.01); *G06T 2210/24* (2013.01)

(58) Field of Classification Search
CPC .... G06F 3/04845; G06F 30/28; G06F 3/0482; G06F 3/04847; G06T 1/0007; G06T 5/20; G06T 5/50; G06T 11/001
See application file for complete search history.

(56) References Cited

U.S. PATENT DOCUMENTS

| | | | |
|---|---|---|---|
| 2012/0147163 A1* | 6/2012 | Kaminsky | G09G 5/028 345/590 |
| 2018/0342085 A1* | 11/2018 | Balestrieri | G06T 11/001 |
| 2018/0365865 A1* | 12/2018 | Zhang | H04N 5/278 |

OTHER PUBLICATIONS

Mark J. Harris in Fast Fluid Dynamics Simulation on the GPU, GPU Gems, Ch. 38, Published Sep. 2007, archived at developer.download.nvidia.com/books/HTML/gpugems/gpugems_ch38.html.
(Continued)

*Primary Examiner* — Anil K Bhargava
(74) *Attorney, Agent, or Firm* — Keller Preece PLLC

(57) ABSTRACT

The present disclosure relates to systems, non-transitory computer-readable media, and methods that provide and apply dynamic image filters to modify digital images over time to simulate a dynamical system. Such dynamic image filters can modify a digital image to progress through different frames depicting visual effects mimicking natural and/or artificial qualities of a fluid, gas, chemical, cloud formation, fractal, or various physical matters or phenomena according to a dynamic-simulation function. Upon detecting a selection of a dynamic image filter, the disclosed systems can identify a dynamic-simulation function corresponding to the dynamical system. Based on selecting a portion of the (or entire) digital image at which to apply the dynamic image filter, the disclosed systems incrementally modify the digital image across time steps to simulate the dynamical system according to the dynamic-simulation function.

20 Claims, 36 Drawing Sheets

(56) References Cited

OTHER PUBLICATIONS

Abelson, Adams, Coore, Hanson, Nagpal, and Sussman in Gray Scott Model of Reaction Diffusion; Date downloaded Mar. 15, 2021; archived at groups.csail.mit.edu/mac/projects/amorphous/GrayScott/.
Anatol M. Zhabotinsky in Belousov-Zhabotinsky Reaction, (2007), Scholarpedia, 2(9):1435, archived at scholarpedia.org/article/Belousov-Zhabotinsky_reaction.
Christina Kuttler in Reaction-Diffusion Equations With Applications, (2011) archived at www-m6.ma.tum.de/~kuttler/script_reaktdiff.pdf.
Ronald Fedkiw, Jos Stam, and Henrik W. Jensen, Visual Simulation of Smoke, In Proceedings of SIGGRAPH 2001, archived at graphics.ucsd.edu/~henrik/papers/smoke/smoke.pdf.
Mark J. Harris. William V. Baxter III, Thorsten Scheuermann, and Anselmo Lastra in Simulation of Cloud Dynamics on Graphics Hardware, in Proceedings of Graphics Hardware (2003), Eurographics Association, pp. 92-101, archived at users.cg.tuwien.ac.at/bruckner/ss2004/seminar/A3b/Harris2003%20-%20Simulation%20of%20Cloud%20Dynamics%20on%20Graphics%20Hardware.pdf.
Scott Draves and Erik Reckase in the Fractal Flame Algorithm, Sep. 2003, archived at flam3.com/flame_draves.pdf—Part 1.
Scott Draves and Erik Reckase in the Fractal Flame Algorithm, Sep. 2003, archived at flam3.com/flame_draves.pdf—Part 2.
Cellular Automata Laboratory; Date downloaded Mar. 15, 2021; archived at fourmilab.ch/cellab/manual/rules.html.

\* cited by examiner

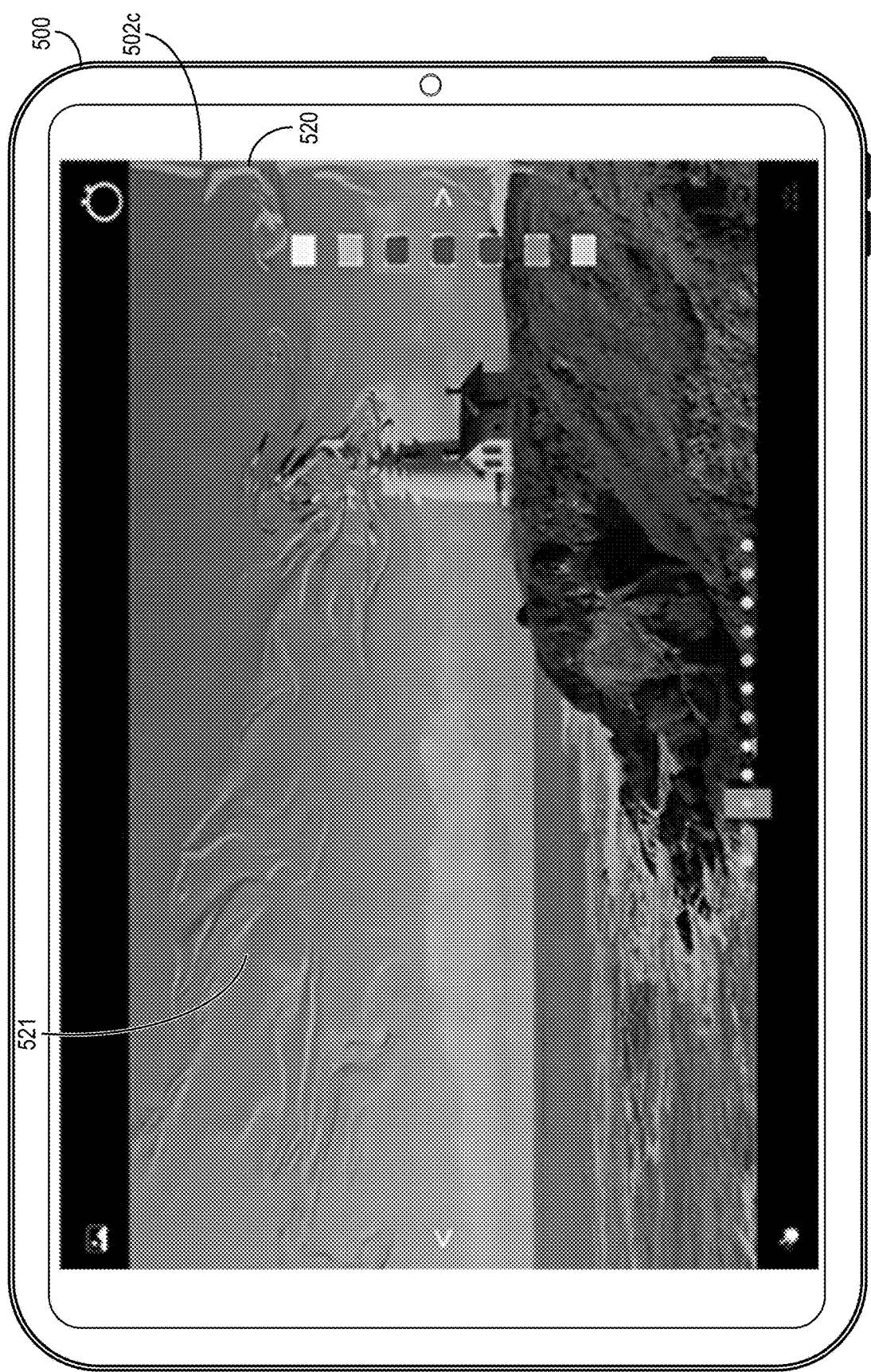

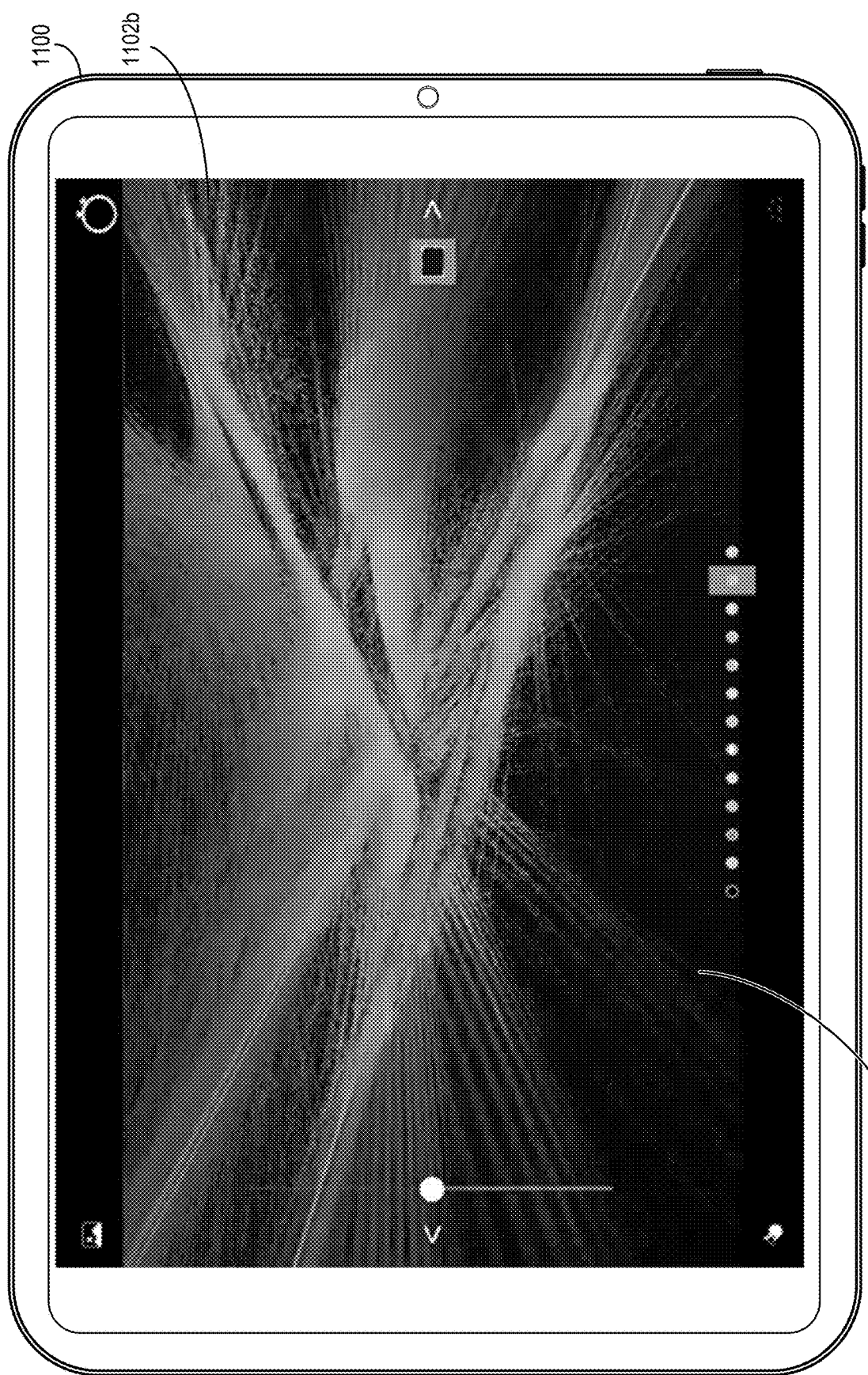

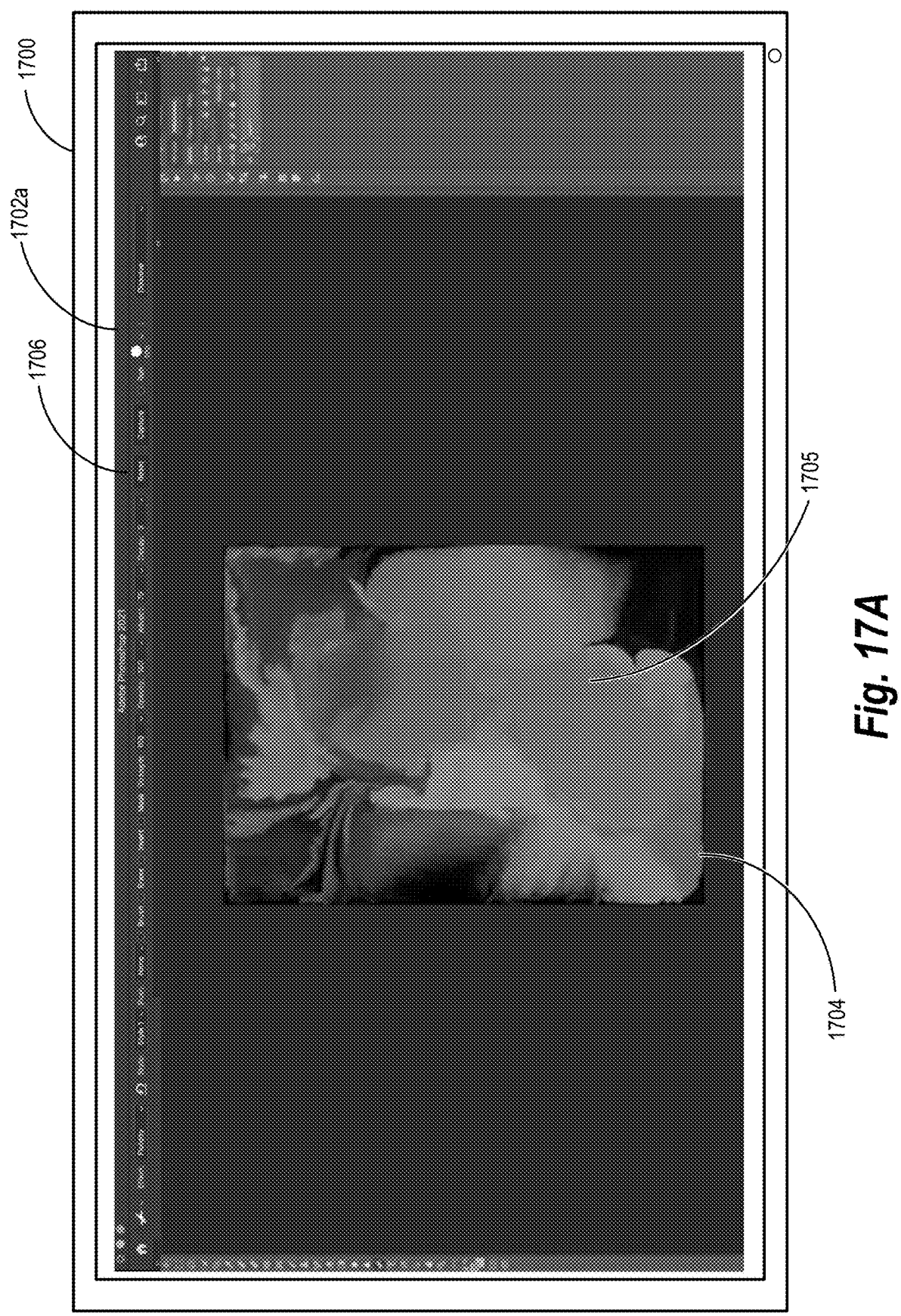

DYNAMIC IMAGE FILTERS FOR MODIFYING A DIGITAL IMAGE OVER TIME ACCORDING TO A DYNAMIC-SIMULATION FUNCTION

BACKGROUND

In recent years, image editing systems have improved filters and visual effects for rendering digital visual media. Indeed, with advancements in digital cameras, smart computing devices, and other technology, conventional image editing systems have improved the capture, creation, artistic filtering, and rendering of digital images and videos. For example, some image editing systems can apply static filters to digital images. Static filters apply artistic effects to digital images, such as filters that change an image to produce a Gaussian blur, a blur gallery, a liquification effect, distortion, noise, or other stylized effects. Other image editing systems can employ time-varying filters on a loop or a one-time pass, such as static clouds that move on a loop in the background of an image, static cartoons that move across an image, or other static content that move with time. However, these and other image editing systems often generate predictable, cookie-cutter content that lack the flexibility to produce more original and unique content with more creative control. Such conventional image editing systems often require deep expertise and tedious user interactions to generate more original content. Accordingly, conventional systems continue to suffer from a number technical deficiencies. For example, conventional image editing systems often (i) produce canned or rigid computer imagery using ready-made or cookie-cutter editing tools and (ii) foment excessive amounts of user interactions required for painstaking editing to generate original digital content with artistic editing.

BRIEF SUMMARY

This disclosure describes embodiments of systems, non-transitory computer-readable media, and methods that solve one or more of the foregoing problems in the art or provide other benefits described herein. For example, the disclosed systems provide and apply dynamic image filters to modify digital images over time to simulate a dynamical system within the digital images. Such dynamic image filters can modify a digital image to progress through different frames depicting visual effects mimicking qualities of a fluid, gas, chemical, cloud formation, fractal, or various physical matters or phenomena according to a dynamic-simulation function. Upon detecting a selection of a dynamic image filter, for instance, the disclosed systems can identify a dynamic-simulation function corresponding to the dynamical system. Based on selecting a portion of the (or entire) digital image at which to apply the dynamic image filter, the disclosed systems incrementally modify the digital image across time steps to simulate the dynamical system according to the dynamic-simulation function.

In some embodiments, the disclosed systems additionally modify the digital image according to intuitive editing tools or user gestures. By applying such editing tools or gestures with dynamic image filters, the disclosed systems can, for example, stir colors of a digital image with a brush tool or touch gesture as if the digital image were a fluid, control a speed and concentration of water vapor of a flowing cloud formation shown in a background image layer, swirl colors or shades of a digital image to mimic a smoke effect, or direct a gel-like fluid to ooze and travel over a digital image over time. When a computing device detects a selected image frame from a series of dynamic frames changing over time, the disclosed system can also capture a modified version of a digital image as a snapshot or video of an image modulation simulating a dynamical system. In this manner, the disclosed systems can flexibly and efficiently generate rich, artistic digital content with a new dynamic filter that fosters unprecedented levels of originality.

This disclosure outlines additional features and advantages of one or more embodiments of the present disclosure in the following description.

BRIEF DESCRIPTION OF THE DRAWINGS

The detailed description provides one or more embodiments with additional specificity and detail through the use of the accompanying drawings, as briefly described below.

FIGS. 5A-5C illustrate a dynamic image-filter system providing user interfaces on a computing device depicting a dynamic simulation of a gel-like fluid in accordance with one or more embodiments.

FIGS. 9A-9C illustrate a dynamic image-filter system providing user interfaces on a computing device depicting a dynamic simulation of atmospheric cloud generation in accordance with one or more embodiments.

FIGS. 11A-11B illustrate a dynamic image-filter system providing user interfaces on a computing device depicting a dynamic simulation of an iterated function system in accordance with one or more embodiments.

FIGS. 13A-13B illustrate a dynamic image-filter system providing user interfaces on a computing device depicting a dynamic simulation of image refraction in accordance with one or more embodiments.

FIGS. 17A-17B illustrate a dynamic image-filter system providing user interfaces on a computing device depicting a user-designated area for limiting image modification in accordance with one or more embodiments.

DETAILED DESCRIPTION

Figure 1:
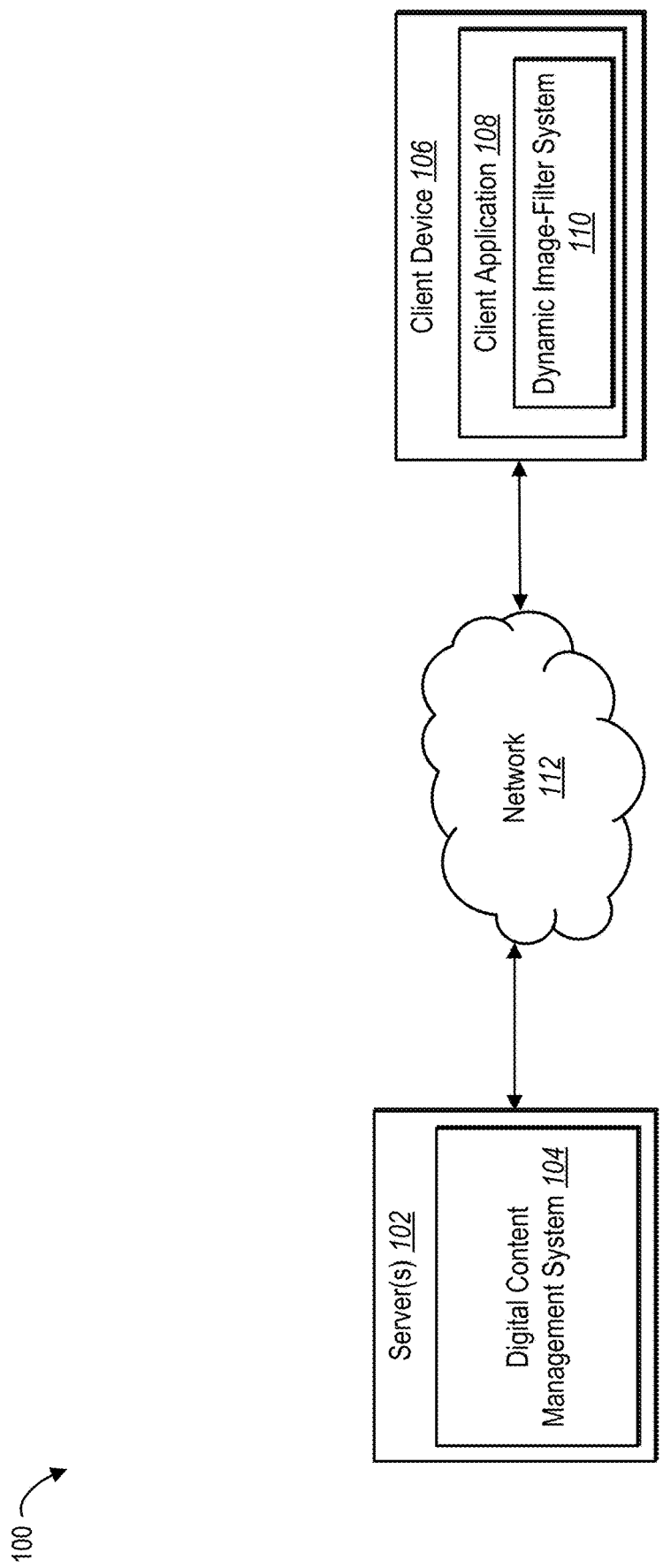
FIG. 1 illustrates a computing system environment for implementing a dynamic image-filter system in accordance with one or more embodiments.

This disclosure describes one or more embodiments of a dynamic image-filter system that provides dynamic image filters for a digital image and (upon selection of such a filter) modifies the digital image according to a dynamic-simulation function to simulate, over time and within the digital image, a dynamical system. For example, upon selection of a dynamic image filter, the dynamic image-filter system can simulate the effects or properties of gravity between objects, a fluid, smoke, fire, rain, a light ray, light refraction, an atmospheric cloud, interacting chemicals, reaction diffusion, cellular automata, an iterated function system, or an image bloom within the digital image. By simulating such physical phenomena or systems according to a dynamic image filter, the dynamic image-filter system modulates some portion or all of a digital image to exhibit the same natural or artificial qualities, movement, or color scheme of the simulated physical matter or systems.

To illustrate, in some embodiments, the dynamic image-filter system presents a digital image along with dynamic image filters for selection and detects a selection of a dynamic image filter to simulate a dynamical system. Based on detecting the selected dynamic image filter, the dynamic image-filter system identifies a dynamic-simulation function corresponding to the dynamical system and generates a simulation flow field comprising simulation values (e.g., density, velocity, temperature). The dynamic image-filter system then changes the simulation values at spatial locations in the simulation flow field over time in accordance with the dynamic-simulation function. For instance, the dynamic image-filter system advects or translates the simulation values in an amount and a direction specified by the dynamic simulation function at each time step in the simulation. As the simulation values change, in some embodiments, the dynamic image-filter system correspondingly updates pixel color values in each image frame to visually render a modified version of the digital image that reflects the simulation at a particular time step.

As noted above, in some embodiments, the dynamic image-filter system identifies at least a portion of the digital image at which to apply a selected dynamic image filter. For instance, the dynamic image-filter system identifies an entire image or an entire image layer at which to apply the dynamic image filter. In other embodiments, the dynamic image-filter system identifies particular portions of a digital image (e.g., a border, coordinate, region, object, mask, and/or layer of a digital image) at which to apply the dynamic image filter. In some cases, the identified portion corresponds to a location of a user input within the digital image (e.g., at a salient object portrayed within the digital image). In other cases, the dynamic image-filter system automatically identifies a portion of the digital image at which to apply the dynamic image filter. Further, in some instances, the dynamic image-filter system identifies a border region or other portion of a digital image at which to apply the dynamic image filter in response to a user selection of a specific portion or a specific filter option to implement a dynamic image filter.

Independent of whether or how a portion or entire image is selected, in some embodiments, the dynamic image-filter system identifies a dynamic-simulation function based on a selected dynamic image filter. For example, the dynamic image-filter system identifies one or more algorithms for representing certain components or values (e.g., a velocity value, density value, temperature value) of the simulation as a function of time. For instance, to simulate a fluid/chemical interaction, the dynamic image-filter system identifies an algorithm for fluid dynamics to accurately determine how a fluid velocity carries along or advects a chemical density.

After identifying a dynamic-simulation function for the selected dynamic image filter, the dynamic image-filter system generates a simulation flow field comprising simulation values for a an initial time step. In some embodiments, the simulation values are specific to values and/or parameters of the dynamic-simulation function corresponding to the selected dynamic image filter. For instance, one or more of the simulation values can be associated with motion, growth, or other dynamics of the simulation. Additionally or alternatively, in some cases, one or more of the simulation values can be preset values (whether default or user-selected). In other embodiments, one or more of the simulation values are tied to image characteristics of an image region (e.g., an image tonal region, an image color region, or an image edge region).

After generating the simulation flow field and simulation values for the initial time step, in one or more embodiments, the dynamic image-filter system utilizes the dynamic-simulation function to update one or more of the simulation values across the simulation flow field. In particular embodiments, the dynamic image-filter system utilizes the dynamic-simulation function that specifies how advection of a simulated dynamical system occurs over time (e.g., a direction and magnitude of translation) to determine the updated simulation values. For example, at a subsequent time step, the dynamic image-filter system updates a simulation value at a spatial location using a dynamic-simulation function. To illustrate, the dynamic image-filter system generates the updated simulation value for the spatial location to comprise a simulation value translated from a neighboring spatial location at the previous time step according to the dynamic-simulation function.

In some embodiments, as part of simulating a dynamical system, the dynamic image-filter system utilizes updated simulation values in a simulation flow field to determine updated pixel color values for each pixel of a digital image. Such pixel color values may include an "R" or red value, a "G" or green value, and a "B" or blue value. For example, in some embodiments, the dynamic image-filter system maps updated simulation values to one or more pixels at each time step. Based on the mappings, in some cases, the dynamic image-filter system generates updated pixel color values. For instance, the dynamic image-filter system renders updated pixel color values for the digital image to simulate a particular dynamical system by simulating a physical effect or property of a physical matter according to at least one of a density value, a velocity value, or a temperature value within the simulation flow field. By generating updated pixel color values in this way, in one or more embodiments, the dynamic image-filter system renders a digital image that changes at each time step to depict a live, moving scene of the digital image changing over time.

As further mentioned above, in certain implementations, the dynamic image-filter system further modifies a digital image based on additional user inputs after selection of a dynamic image filter. For example, in some embodiments, the dynamic image-filter system alters, pauses, rewinds to, or selects one or more image frames of a digital image in response to a user input (e.g., a swipe gesture, tap, long-press, click, or voice-command). As an additional example, the dynamic image-filter system captures the one or more image frames for saving or sharing, such as for saving in memory devices, transmitting to client devices via an electronic communication, or uploading to a social network.

With or without additional user inputs to alter a simulation, as indicated above, the dynamic image-filter system modifies a digital image over time to simulate a variety of dynamical systems for natural or artificial phenomenon. For example, in some cases, the dynamic image-filter system applies a dynamic-simulation function simulating a reaction diffusion to depict bacteria-like growth and proliferation at a border region of a digital image. By contrast, in certain implementations, the dynamic image-filter system applies a dynamic-simulation function simulating image blooms to depict certain image colors/tones "bleeding" or spreading across the digital image (e.g., as if the lighter colors are blooming and/or being windswept across the digital image). As an additional example, in certain instances, the dynamic image-filter system applies a dynamic-simulation function simulating image refraction to modify (e.g., distort) a digital image as if viewed through a perturbed watery surface that settles or otherwise changes with time.

As mentioned above, conventional image editing systems demonstrate a number of technical problems and shortcomings, particularly with regard to computer imagery and efficiency of implementing devices. For example, some conventional image editing systems use static filters or looping filters to generate artistic effects or canned animation for a digital image. To give an example, conventional editing systems can apply a looping filter that integrates moving clouds on a loop in the background of a digital image—as if the same cloud formation repeatedly swept across the sky. In performing such artistic effects, conventional image editing systems operate in a constrained fashion to execute predictable operations on an input image. For instance, two different client devices (associated with different users) executing the same filter on the same image would generate a same or very similar filtered output image utilizing a conventional image editing system. Accordingly, implementing computing devices of a conventional image editing system have limited capabilities to generate creative, original digital imagery.

To supplement the technical limits of static filters or looping filters, conventional image editing systems sometimes provide a variety of tools that in a graphical user interface that can be cumbersome to use to produce more dynamic or original imagery. For example, some conventional image editing systems require complex combinations of user interface tools and tedious applications of multiple adjustment layers, multiple static filters, multiple blending masks, etc. In addition, these conventional image editing systems can require deep technical know-how for creating more dynamic or original imagery. To illustrate, users need to understand and leverage various digital editing tools and navigate among the myriad buttons and drop-down menus for such digital editing tools, etc., to create original images with unique edits mimicking a physical effect or physical property of physical matter one image frame at a time. Even with such expertise, conventional image editing systems can involve hundreds and sometimes thousands of digital brush strokes and navigational inputs to switch between digital tools to generate an original, aesthetically appealing digital image with multiple (but different) image frames. Accordingly, graphical user interfaces for conventional image editing systems require an excessive amount of user interactions with complex editing tools to execute navigational steps and manipulation of filtered output imagery.

In contrast, the dynamic image-filter system provides several improvements over conventional image editing systems. For example, the dynamic image-filter system introduces a new type of computer imagery and dynamic image editing that conventional image editing systems cannot generate. That is, in some case, the dynamic image-filter system generates modified digital images that incorporate lifelike (e.g., natural) or fantasy-like (e.g., artificial or unnatural) simulation of dynamical systems as if the digital image exhibited or possessed the same attributes of the dynamical system (e.g., effects or properties of physical matter). Unlike conventional image editing systems, the dynamic image-filter system applies dynamic image filters that use particular dynamic-simulation functions and/or values in a simulation flow field to modify a digital image over time to simulate the progression of a dynamical system.

To generate this new type of computer imagery and dynamic image editing, in some embodiments, the dynamic image-filter system implements an unconventional ordered combination of steps. For example, the dynamic image-filter system can identify one or more specific dynamic-simulation functions and generate a simulation flow field comprising simulation values. Then, at each time step of a simulation, the dynamic image-filter system can use a dynamic-simulation function to modify pixel color values for one or more pixels of the digital image by updating simulation values across the simulation flow field associated with the digital image. By implementing such an unconventional ordered combination of steps, the dynamic image-filter system can generate beautiful, complex digital imagery in such a way that no two results are ever alike—because of the ability to capture one or more image frames as continuously changing according to a dynamic-simulation function.

In addition to generating new and improved computer imagery, the dynamic image-filter system can also provide increased efficiency for implementing computing devices. For example, the dynamic image-filter system provides, for display within an improved user interface, one or more dynamic image filters for user selection. Without additional user input or with additional but simple user inputs, the dynamic image-filter system can generate rich, complex digital imagery by modifying a digital image at each time step in accordance with a dynamic-simulation function. Rather than the complex user interactions and tedious edits of conventional image editing systems, the dynamic image-filter system provides a way to automatically generate rich, complex digital imagery by a user capturing the organic progression of a simulated phenomenon at a desired time step. If additional personalization is desired, the dynamic image-filter system can dynamically alter the simulation as it occurs within the digital image in response to intuitive user inputs (e.g., by further updating simulation values according to an additionally detected user gesture). In contrast to the disclosed system, conventional image editing systems would require the burdensome task of directly changing pixel color values (e.g., pixel-by-pixel or pixel region-by-pixel region) using a complex library of digital tools to simulate a dynamical system across multiple image frames. In this manner, the dynamic image-filter system can significantly reduce user interactions within a graphical user interface to more efficiently generate creative, original digital imagery.

As illustrated by the foregoing discussion, the present disclosure utilizes a variety of terms to describe features and benefits of the dynamic image-filter system. Additional detail is now provided regarding the meaning of these terms. For example, as used herein, the term "dynamic image filter" refers to a software routine or algorithm that (upon application) dynamically alters a digital image or an appearance of a digital image over time. In particular, a dynamic image filter can include a modification of a digital image over time to simulate a dynamical system. For example, a dynamic image filter may include an expression or visual representation that, when applied to a digital image, shows the digital image transforming according to a smoke simulation, a fluid simulation, a reaction diffusion simulation, etc.

As used herein, the term "dynamical system" refers to a system that models an energy, force, motion, visualization, physical matter, or other thing changing over time. In some cases, a dynamical system is a system in which a dynamic-simulation function describes time-dependence of a point in a space (e.g., a geometric space) to simulate a behavior of a thing (e.g., energy, physical matter) changing over time. In particular, a dynamical system sometimes includes a system that models time-varying behavior of a thing using a simulation flow field. Such time-varying behavior may include natural or physical behavior, on the one hand, or artificial or synthetic behavior, on the other hand. For example, a dynamical system may include a particular dynamical system corresponding to (i) a physical effect or a property of a physical matter, where the physical effect or property can be either follow a natural behavior or an artificially controlled behavior, or (ii) an effect or a property of an iterated function system.

Additionally, as used herein, the term "dynamic-simulation function" refers to one or more computational models or computational algorithms that describe the behavior of a dynamical system. Such a dynamic-simulation function can include a model or algorithm that uses variables to represent physical effects or properties, such as motion dynamics, growth, progression, diffusion, or iteration parameters, of physical matter or an iterated fractal. In certain implementations, the variables represent particular simulation values, such as density values, velocity values, or temperature values corresponding to the physical effect or property of the physical matter.

As used herein, the term "simulation value" refers to a numerical representation of for part of a dynamic simulation of a dynamical system. Such simulation values may represent a part of various physical effects or properties, such as motion dynamics, growth, progression, diffusion, or iteration parameters of physical matter, or an iterated fractal. In particular, simulation values can include density values, velocity values, temperature values, viscosity values, vorticity values, intensity values, concentration values, rate-of-diffusion values, mass values, opacity values, or gravitational force values. Simulation values can also be scalar values. In other cases, a simulation value can represent multiple components or higher order dimensionality (such as a higher order tensor) in vector form. Further, a simulation value may represent part of a simulation following a natural or physical pattern or part of a simulation following an artificial or unnatural pattern (e.g., as set by a user).

Further, the term "simulation flow field" refers to a virtual grid or arrangement of spatial locations (e.g., sectional areas, grids, or pin-locations) associated with one or more simulation values. For example, a simulation flow field can include a density flow field in which each respective spatial location of the density flow field comprises a density value. Similarly, a simulation flow field can include a temperature flow field in which each respective spatial location of the temperature flow field comprises a temperature value. In some cases, the simulation flow field comprises a combined flow field (e.g., a combined density flow field and velocity flow field) in which each respective portion of the combined flow field comprises both density and velocity values.

Additionally, as used herein, the term "physical matter" refers to a solid, liquid, gas, or plasma, such as any chemical or chemical compound in various states of matter. Specific examples of physical matter include air, water, water vapor, clouds, smoke, periodic table elements (e.g., oxygen, mercury, gold), compounds, mixtures, solutions, or other substances having mass. The physical matter may likewise be (i) generic in terms of a solid object or liquid matter, (ii) specific in terms of a specific chemical, chemical compound, such as water, steel, dirt, or (iii) a specific biological organism, such as a cell or a flower.

Further, as used herein, the term "physical effect" refers to a naturally occurring or artificially simulated energy, force, motion, visualization, or product of a real-world or synthetically created phenomenon or physical matter. For example, a physical effect may include an energy, force, a motion, visualization, or physical consequence of physical matter, such as a chemical, fluid, atmospheric clouds, fire, rain, smoke, etc. Such a physical effect can likewise include an energy in the form of light or a force in the form of gravity (e.g., natural gravity or artificially shifted gravity).

Similarly, the term "property of a physical matter" refers to characteristics or qualities of one or more elements in a solid, liquid, gaseous, plasma, or other state. In particular, example properties of a physical matter may include reactivity, flammability, acidity, heat of combustion, electrical conductivity, hydrophobicity, elasticity, melting point, color, hardness, permeability, boiling point, saturation point, state of matter, volume, mass, viscosity, surface tension, vapor pressure, heat of vaporization, temperature, velocity, or density.

As used herein, the term "iterated function system" refers to a computational system that uses contraction mappings to iterate the actions of a function. In particular embodiments, an iterated function system includes a computational system that generates fractals—that is, a curve or geometric figure, each part of which has the same or similar statistical character as the whole to appear self-similar at different levels of successive magnification. In the alternative to iterated function systems, the dynamic image-filter system can use other dynamical systems for non-physical or artificial phenomena, such as strange attractors, L-systems, escape-time fractal systems, random fractal systems, or finite subdivision rules.

Similarly, the term "property of an iterated function system" refers to characteristics or qualities of one or more computational systems that produce fractals. Examples of properties of an iterated function system may include affinity, linearity, non-linearity (e.g., for Fractal flame), a unique nonempty compact fixed set, contractiveness, non-contractiveness, etc.

As used herein, the term "digital image" refers to a collection of digital information that represents an image. More specifically, a digital image can include a digital file comprising pixels that each include a numeric representation of a color and/or gray-level or other characteristics (e.g., brightness). For example, digital image file can include the following file extensions: JPG, TIFF, BMP, PNG, RAW, or PDF. Relatedly the term "image frame" refers to a discrete version or snapshot of a digital image at a given time step of a simulation. Additionally, in some embodiments, the dynamic image-filter system generates a "composite image," which refers to a combination of two or more different digital images.

In addition, the term "characteristics of a digital image" refer to one or more settings, attributes, or parameters of a digital image. For example, a characteristic of a digital image may include hue, saturation, tone, color, size, pixel count, etc. Additionally, a characteristic of a digital image may define regions (e.g., portions or subsets of pixels) within the digital image. For instance, an "image tonal region" refers to an area of pixels within a digital image having a same or similar pixel level of tinting and shading or pixel level of gray-color mixture (e.g., a same or similar saturation level). Similarly, an "image color region" refers to an area of pixels within a digital image having a same or similar hue (e.g., relative mixture of red, green, and blue values). Further, an "image edge region" refers to an area of pixels along an outer portion (e.g., a border portion) of a digital image. Relatedly, the term "pixel color values" refers to the individual color channel values for a given pixel (e.g., a red pixel color value, a green pixel color value, a blue pixel color value). In some cases, pixel color values also include an opacity value that indicates a degree of transparency or opaqueness of the color.

Additionally used herein, the term "absolute image pixel coordinates" refers to a set of coordinates corresponding to a global coordinate system that defines a pixel location among rows and columns of pixels of a digital image. In particular embodiments, absolute image pixel coordinates are formatted as follows: (column number, row number). The global coordinate system may identify columns and rows from left-to-right and top-to-bottom starting with zero. However, the dynamic image-filter system can utilize a variety of different global coordinate systems (e.g., where the columns and/or rows start from bottom-to-top).

Further, as used herein, the term "texel coordinates" refers to a location of a texel or texture pixel within a texture map. In particular, a texel coordinate can include a two-element vector with values ranging from zero to one. In some embodiments, the dynamic image-filter system multiplies these values in the texel coordinates by the resolution of a texture to obtain the location of a texel.

As used herein, the term "mask" refers to a layer or overlay that covers a portion of a digital image. In particular, a mask can include a that selectively reveals or hides portions of the underlying digital image. In some cases, the mask can include a digital image portraying digital objects and/or some depiction of digital content (e.g., a color or pattern). In other cases, the mask can include a blank image with no digital content (e.g., only whitespace). Further, in some cases, the mask can include a transparent copy or image adjustment layer of the digital image so as to preserve original content in the underlying digital image while allowing edits in the transparent copy. Still further, in particular embodiments, a mask can refer to an image adjustment or image adjustment layer, such as Adobe Photoshop's brightness/contrast, levels, curves, exposure, vibrance, hue/saturation, color balance, black and white, photo filter, channel mixer, color lookup, posterize, threshold, gradient map, selective color, shadows/highlights, HDR toning, match color, replace color, etc.

In addition, as used herein, the term "parameterized-static filter" refers to a software routine or algorithm that (upon application) alters a digital image or an appearance of a digital image in a static image frame. In particular embodiments, a parameterized-static filter alters a digital image in a singular (one-time) instance upon application. Examples of a parameterized-static-filter include Photoshop's Gaussian blur, blur gallery, liquify, pixelate, distort, noise, render, stylized filters, neural filters, neural style filters, lens correction, oil paint, high pass, find edges, sharpen, vanishing point, motion blur, exposure, shadows, highlights, curves, levels, saturation, vibrance, dodging, burning, camera raw filters, etc. In one or more embodiments, the dynamic image-filter system uses a dynamic-simulation function to locally drive various parameters of a parameterized-static-filter to create a dynamic version (e.g., a live and interactive version) of the parameterized-static-filter.

Additional detail will now be provided in relation to illustrative figures portraying example embodiments and implementations of the dynamic image-filter system. For example, FIG. 1 illustrates a computing system environment (or "environment") 100 for implementing a dynamic image-filter system 110 in accordance with one or more embodiments. As shown in FIG. 1, the environment 100 includes server(s) 102, a client device 106, and a network 112. In one or more embodiments, each of the components of the environment 100 communicate (or are at least configured to communicate) via the network 112. Example networks are discussed in more detail below in relation to FIG. 20.

As shown in FIG. 1, the environment 100 includes the client device 106. The client device 106 includes one of a variety of computing devices, including a smartphone, tablet, smart television, desktop computer, laptop computer, virtual reality device, augmented reality device, or other computing device as described in relation to FIG. 20. Although FIG. 1 illustrates a single client device 106, in some embodiments, the environment 100 includes multiple client devices. In these or other embodiments, the client device 106 communicates with the server(s) 102 via the network 112. For example, the client device 106 receives user input and provides to the server(s) 102 information pertaining to the user input (e.g., image filters or image modifications that relate to interactively altering a dynamic simulation of a dynamical system).

As shown, the client device 106 includes a corresponding client application 108. In particular embodiments, the client application 108 comprises a web application, a native application installed on the client device 106 (e.g., a mobile application, a desktop application, etc.), or a cloud-based application where part of the functionality is performed by the server(s) 102. In some embodiments, the client application 108 presents or displays information to a user associated with the client device 106, including modified versions of a digital image over time. For example, the client application 108 identifies a user input via a user interface of the client device 106 to select a dynamic image filter. Subsequently, in some embodiments, the client application 108 causes the client device 106 to generate, store, receive, transmit, and/or execute electronic data using a graphical processing unit ("GPU"), such as executable instructions for identifying a dynamic-simulation function and modifying a digital image according to the dynamic-simulation function.

For example, the client application 108 can include the dynamic image-filter system 110 as instructions executable on a GPU. By executing the dynamic image-filter system 110 as instructions on a GPU, for instance, the client device 106 identifies a dynamic-simulation function corresponding to the dynamical system. As a further example, by executing the dynamic image-filter system 110 as instructions on a GPU, the client device 106 can dynamically modify, within a graphical user interface, at least a portion of the digital image over time to simulate the dynamical system within the digital image according to the dynamic-simulation function. These and other aspects of the client application 108 implementing the dynamic image-filter system 110 are described in more detail below in relation to the subsequent figures.

As further illustrated in FIG. 1, the environment 100 includes the server(s) 102. In some embodiments, the server(s) 102 comprises a content server and/or a data collection server. Additionally or alternatively, the server(s) 102 comprise an application server, a communication server, a web-hosting server, a social networking server, or a digital content management server.

Moreover, as shown in FIG. 1, the server(s) 102 implement a digital content management system 104 that manages digital files (e.g., digital images for object segmentation). For example, in one or more embodiments, the digital content management system 104 receives, transmits, organizes, stores, updates, and/or recommends digital images to/from the client device 106. For instance, in certain implementations, the digital content management system 104 comprises a data store of digital images from which the client device 106 selects a digital image to apply one or more dynamic image filters via the client application 108.

Although FIG. 1 depicts the dynamic image-filter system 110 located on the client device 106, in some embodiments, the dynamic image-filter system 110 is implemented by one or more other components of the environment 100 (e.g., by being located entirely or in part at one or more of the other components). For example, in one or more embodiments, the server(s) 102 and/or a third-party device implement the dynamic image-filter system 110.

In some embodiments, though not illustrated in FIG. 1, the environment 100 has a different arrangement of components and/or has a different number or set of components altogether. For example, in certain embodiments, the environment 100 includes a third-party server (e.g., for storing digital images or other data). As another example, the client device 106 communicates directly with the server(s) 102, bypassing the network 112.

Figure 2:
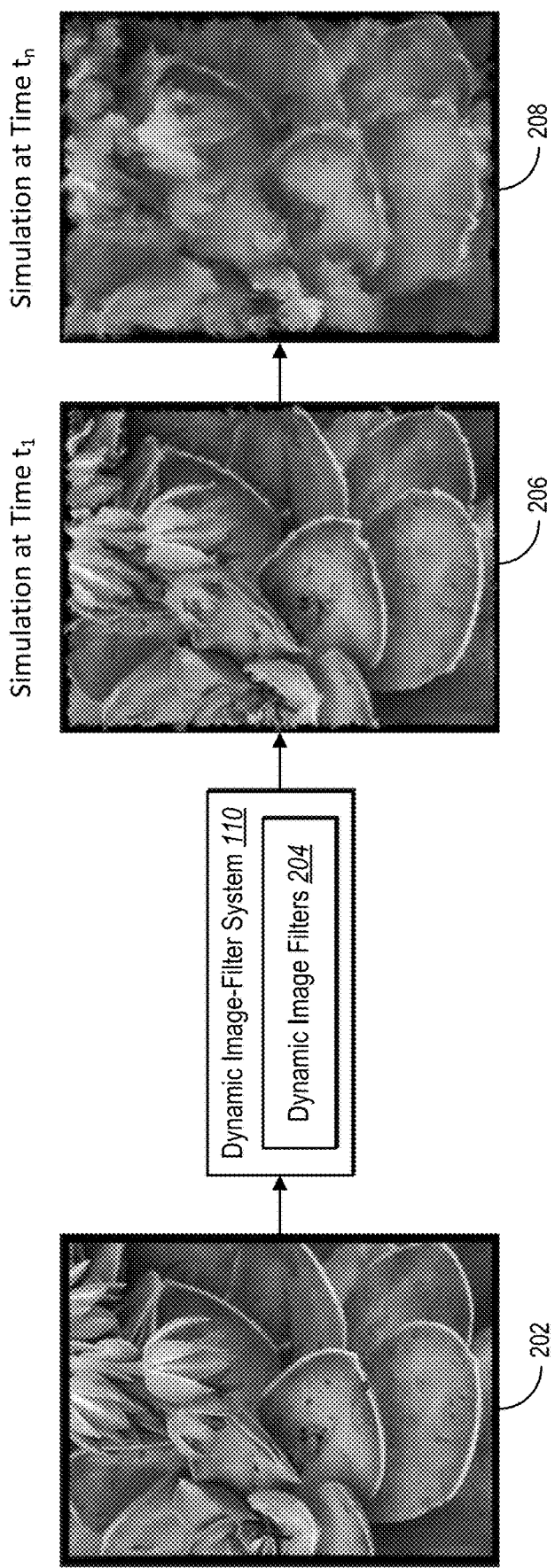
FIG. 2 illustrates a dynamic image-filter system utilizing dynamic image filters to generate an initial modified image and a subsequent modified image in accordance with one or more embodiments.

As mentioned above, the dynamic image-filter system 110 can utilize dynamic image filters to modify a digital image over time. For example, the dynamic image-filter system 110 generates a discrete version of a digital image at each time step during a simulation. FIG. 2 illustrates the dynamic image-filter system 110 utilizing dynamic image filters 204 to generate an initial modified image 206 and a subsequent modified image 208 in accordance with one or more embodiments.

As shown in FIG. 2, the dynamic image-filter system 110 uses the dynamic image filters 204 to modify a digital image 202 (e.g., an input image accessed from a memory device or data store). In particular, FIG. 2 depicts the dynamic image-filter system 110 utilizing a single dynamic image filter from the dynamic image filters 204 to modify the digital image 202. Although not shown, in certain embodiments, the dynamic image-filter system 110 utilizes a combination of dynamic image filters from the dynamic image filters 204 to modify the digital image 202.

As described in more detail below, in certain implementations, the dynamic image filters 204 appear as selectable options that comprise software routines or algorithms for modifying the digital image 202 by simulating, within the digital image 202, a dynamical system. For example, in response to detecting a user selection of a specific dynamic image filter (e.g., a "track streams filter" or "fluid mixture filter"), the dynamic image-filter system 110 begins to modify the digital image 202 accordingly. As depicted in FIG. 2, for instance, the dynamic image-filter system 110 modifies the digital image 202 in a progressive fashion so as to imitate the properties of a fluid that exhibits stream-like or fluid-mixing behavior.

To illustrate, at an initial time step (time $t_1$), FIG. 2 shows the dynamic image-filter system 110 modifying the digital image 202 along an image border (or image-edge regions) to generate the initial modified image 206. Then, by continually modifying the digital image 202 through a subsequent time step (time $t_n$), the dynamic image-filter system 110 generates the subsequent modified image 208. Because of the progression of the simulation, the dynamic image-filter system 110 renders the subsequent modified image 208 with a more advanced stage of fluid mixture within the digital image 202 as compared to the initial modified image 206. Thus, depending on the desired effect, the subsequent modified image 208 may comprise additional artistic blurring and abstraction of the digital image 202 compared to the initial modified image 206. In this manner, the dynamic image-filter system 110 can dynamically generate rich, diverse computer imagery using the dynamic image filters 204 as explained further below.

As just discussed, the dynamic image-filter system 110 can use dynamic image filters to generate modified versions of an input image over time. In these or other embodiments, the dynamic image filters correspond to specific dynamic-simulation functions that uniquely model a dynamical system. Thus, in selecting a dynamic image filter, in one or more embodiments, the dynamic image-filter system 110 identifies a corresponding dynamic-simulation function to simulate a dynamical system within a digital image. Additionally, in some cases, the dynamic image-filter system 110 detects one or more additional user inputs (e.g., for applying image filters or image modifications that alter the simulation or for capturing a particular image frame of a modified digital image during the simulation).

Figure 3:
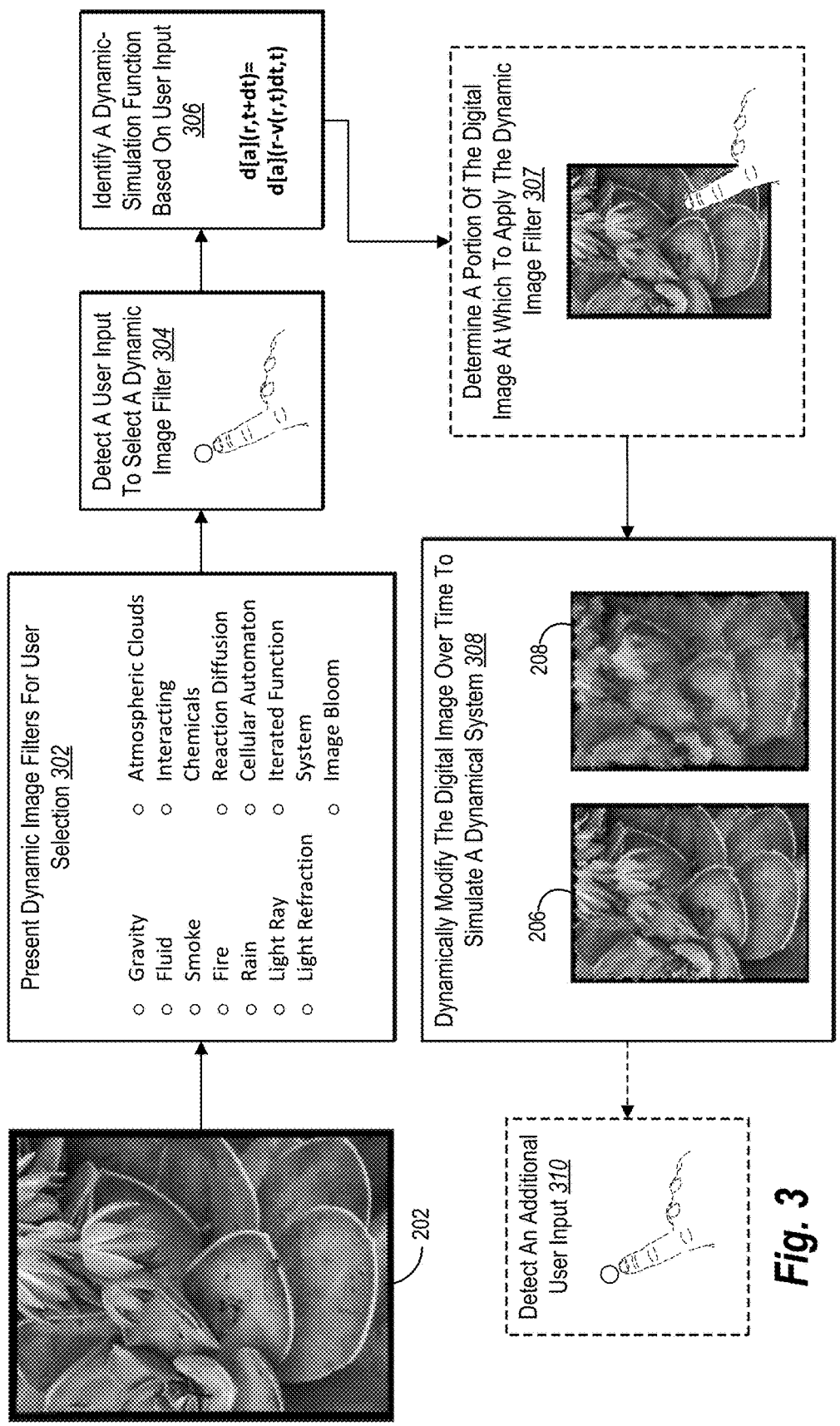
FIG. 3 illustrates a dynamic image-filter system modifying a digital image based on detecting a selection of a dynamic image filter in accordance with one or more embodiments.

FIG. 3 illustrates the dynamic image-filter system 110 modifying the digital image 202 to simulate a dynamical system in accordance with one or more embodiments. As shown in act 302 of FIG. 3, the dynamic image-filter system 110 presents dynamic image filters for user selection (e.g., within a user interface of a client device). In one or more embodiments, the dynamic image filters appear as selectable options that comprise software routines or algorithms for modifying the digital image 202 by simulating, within the digital image 202, a particular dynamical system corresponding to a physical effect or property of a physical matter or iterated function system. As shown in FIG. 3, examples of such physical matter include fluid, smoke, fire, rain, atmospheric clouds, and interacting chemicals. As further shown in FIG. 3, examples of a physical effect or property include gravity, light ray, light refraction, image bloom, reaction diffusion, and cellular automata. Myriad other particular dynamical systems, such as iterated function systems, are within the scope of the present disclosure.

At act 304, the dynamic image-filter system 110 detects a user input to select one of the dynamic image filters presented for display. For example, the dynamic image-filter system 110 identifies, via a user interface, one or more clicks, haptic inputs, voice commands, touch gestures, etc. that indicate a user selection of a dynamic image filter.

At act 306, the dynamic image-filter system 110 identifies a dynamic-simulation function based on the user input. In particular embodiments, the dynamic image-filter system 110 identifies a dynamic-simulation function that corresponds to the selected dynamic image filter. For example, in response to detecting the user input at act 304, the dynamic image-filter system 110 retrieves computer-executable instructions (e.g., from one or more memory devices accessible via the client device) comprising the algorithms or computational models that form the dynamic-simulation function for simulating a dynamical system. The various dynamic-simulation functions are described in greater detail below in relation to FIGS. 5A-17B.

At act 307, the dynamic image-filter system 110 optionally identifies a portion of the digital image 202 at which to apply a selected dynamic image filter. For example, as shown in FIG. 3, the dynamic image-filter system 110 identifies edges of graphical objects (e.g., edges of the leaves and flower petals in the digital image 202) to initially simulate a smoke-like effect within the digital image 202. Alternatively, in some embodiments, the dynamic image-filter system 110 identifies a border, coordinate, or region of the digital image 202 at which to apply the dynamic image filter.

In some cases, the dynamic image-filter system 110 automatically identifies a portion of the digital image 202 at which to apply the dynamic image filter based on the selected dynamic image filter and/or selected image layer. For example, the dynamic image-filter system 110 performs object selection within the digital image 202, boundary detection, etc. As shown in FIG. 3, the dynamic image-filter system 110 automatically identifies the edges of the leaves and flower petals as the particular sources for emitting smoke according to a selected smoke filter. In other examples, the dynamic image-filter system 110 automatically identifies a border region at which to apply the dynamic image filter in response to a user selection of a border layer or a specific filter option to implement a dynamic image filter only at a border region.

The act 307 can also comprise the dynamic image-filter system 110 utilizing a different approach to identifying a portion of the digital image 202 at which to apply the selected dynamic image filter. For example, in some embodiments, the dynamic image-filter system 110 identifies a portion of the digital image 202 that corresponds to a location of a user input within the digital image 202 (e.g., a specific flower tapped or brush-stroked by a user). By contrast, in other embodiments, the dynamic image-filter system 110 identifies an entirety of the digital image 202 (or an entire image layer) at which to apply the dynamic image filter. For example, in some embodiments, the dynamic image-filter system 110 identifies a foreground or background layer to apply the dynamic image filter in response to detecting a user selection of the foreground or background layer prior to or during activation of a dynamic image filter.

At act 308, the dynamic image-filter system 110 dynamically modifies the digital image 202 over time to simulate a dynamical system. For example, as shown in the initial modified image 206 and the subsequent modified image 208, the dynamic image-filter system 110 continuously modifies the digital image 202 such that each successive image frame is different from the previous image frame according to the selected dynamic-simulation function. In some cases, the dynamic image-filter system 110 modifies a determined or selected portion of the digital image 202 according to the selected dynamic image filter and/or according to user input identifying specific location(s) at which to apply the selected dynamic image filter.

To illustrate, the dynamic image-filter system 110 determines simulation values corresponding to the dynamical system utilizing the dynamic-simulation function. For instance, the simulation values include at least one of density values, velocity values, temperature values, viscosity values, vorticity values, intensity values, concentration values, or rate-of-diffusion values according to the dynamic-simulation function.

In these or other embodiments, the dynamic image-filter system 110 changes the simulation values with each time step according to the dynamic-simulation function. Moreover, at a given time step, the dynamic image-filter system 110 modifies the digital image 202 by rendering updated pixel color values for the digital image 202 to simulate the dynamical system according to updated simulation values. Additional details regarding how the dynamic image-filter system 110 modifies the digital image 202 using the dynamic-simulation function are described more below in relation to FIGS. 4A-4B.

As further shown in FIG. 3, at an optional act 310, the dynamic image-filter system 110 detects additional user input. In some embodiments, the additional user input represents one or more user interactions for applying an image filter or an image modification that alters a digital image during the simulation of a dynamical system. Such additional user input can include intuitive user gestures and a variety of types of haptic inputs, such as swipes, taps, or long-presses. In other cases, the additional user input comprises one or more user interactions that move or change an orientation of a computing device (e.g., tilting, shaking, pointing, or orienting of a client device). Regardless of the type of additional user input, in certain implementations, the dynamic image-filter system 110 initial renders, for an initial time step, pixel color values for the digital image 202 to simulate a dynamical system within the digital image 202 according to simulation values within a simulation flow field—based on an identified dynamic-simulation function. Based on detecting an additional user input to apply an image filter or an image modification to the digital image 202, the dynamic image-filter system 110 renders, for a subsequent time step, adjusted pixel color values for the digital image 202 to depict the digital image with the image filter or the image modification while simulating the dynamical system within the digital image 202.

As further suggested above, in some cases, the additional user input includes one or more user interactions that influence simulation values (e.g., increase wind speed, decrease a chemical concentration, change fluid flow direction). By changing one or more parameters of the simulation, in one or more embodiments, the dynamic image-filter system 110 alter pixel color values to provide a corresponding visual effect within the digital image 202 (e.g., stirring up a fluid, increasing cloud generation, refracting more light).

Additionally or alternatively, in some embodiments, the additional user input corresponds to other interactive options available to a user. For example, based on detecting the additional user input, the dynamic image-filter system 110 may pause or freeze the simulation (e.g., by tapping or holding a pause button). In some cases, pausing the simulation includes stopping execution of a dynamic-simulation function. Additionally or alternatively, pausing the simulation includes setting one or more simulation values to zero (e.g., setting velocity to zero such that movement stops). In these or other embodiments, the dynamic image-filter system 110 resumes the simulation (e.g., in response detecting a release or an additional tap of the pause button or a play button). For instance, the dynamic image-filter system 110 resumes execution of the dynamic-simulation function and/or or resets one or more simulation values.

Similarly, in some embodiments, the dynamic image-filter system 110 speeds up or slows down the simulation in response to detecting additional user input. For example, the dynamic image-filter system 110 expedites or slows down the simulation within the digital image 202 based on detecting adjustment of a simulation-speed slider via a user interface. In these or other embodiments, the dynamic image-filter system 110 varies one or more of the simulation values in response to detecting the additional user input (e.g., to view a more rapid progression of the simulation or to view a slower progression of the simulation).

In another example, the dynamic image-filter system 110 rewinds the simulation in response to detecting the additional user input. For example, the dynamic image-filter system 110 reverses the simulation within the digital image 202 based on detecting user interaction with a rewind button or a slider element in a user interface. In these or other embodiments, the dynamic image-filter system 110 rewinds the simulation by visually displaying playback (e.g., a recorded version) of the simulation depicted within the digital image 202 in reverse. In other embodiments, the dynamic image-filter system 110 rewinds the simulation by accessing from memory the previous simulation values for one or more previous time steps (or intervals of time steps). Subsequently, in certain implementations, the dynamic image-filter system 110 renders pixel color values based on the previous simulation values in a backwards, sequential progression of time steps. Still, in other embodiments, the dynamic image-filter system 110 rewinds the simulation by adjusting the dynamic-simulation function (e.g., adjusting a positive acceleration to a negative acceleration).

In yet another example, the dynamic image-filter system 110 bookmarks or selects one or more image frames of the digital image 202 (e.g., the initial modified image 206 and/or the subsequent modified image 208) in response to detecting the additional user input. For example, a user may select one or more image frames of potential interest by interacting with a highlight user interface element. After selecting the one or more image frames, in one or more embodiments, the dynamic image-filter system 110 continues with the simulation.

Additionally or alternatively, in some cases, the dynamic image-filter system 110 returns to the selected portion based on a user interaction via a return user interface element. After returning to the one or more selected image frames, the dynamic image-filter system 110 optionally presents selectable options to save at least one of the one or more selected image frames and/or begin a new simulation. In response to a user selection to save an image frame, the dynamic image-filter system 110 optionally stores the image frame in one or more memory devices for access by the client device. In response to a user selection to begin a new simulation, in certain implementations, the dynamic image-filter system 110 presents selectable options to select one or more additional or alternative dynamic image filters to apply starting with the selected image frame. In certain embodiments, the dynamic image-filter system 110 presents an option to leave or cancel the selected image frame and return to the original version of the digital image 202 to apply additional or alternative dynamic image filters.

Similar to selecting an image frame, in one or more embodiments, the dynamic image-filter system 110 captures (e.g., save) one or more image frames based on detecting the additional user input. For example, as the digital image 202 changes with time according to the simulation, the dynamic image-filter system 110 stores a particular image frame in response to detecting a user interaction with a screenshot or "save image frame" user interface element. In particular embodiments, the dynamic image-filter system 110 stores the captured image frame in one or more memory devices on the client device 106 and/or at the digital content management system 104. In additional or alternative embodiments, the dynamic image-filter system 110 transmits the captured image frame to one or more other client devices or uploads the captured image frame to a social network.

Figure 4A:
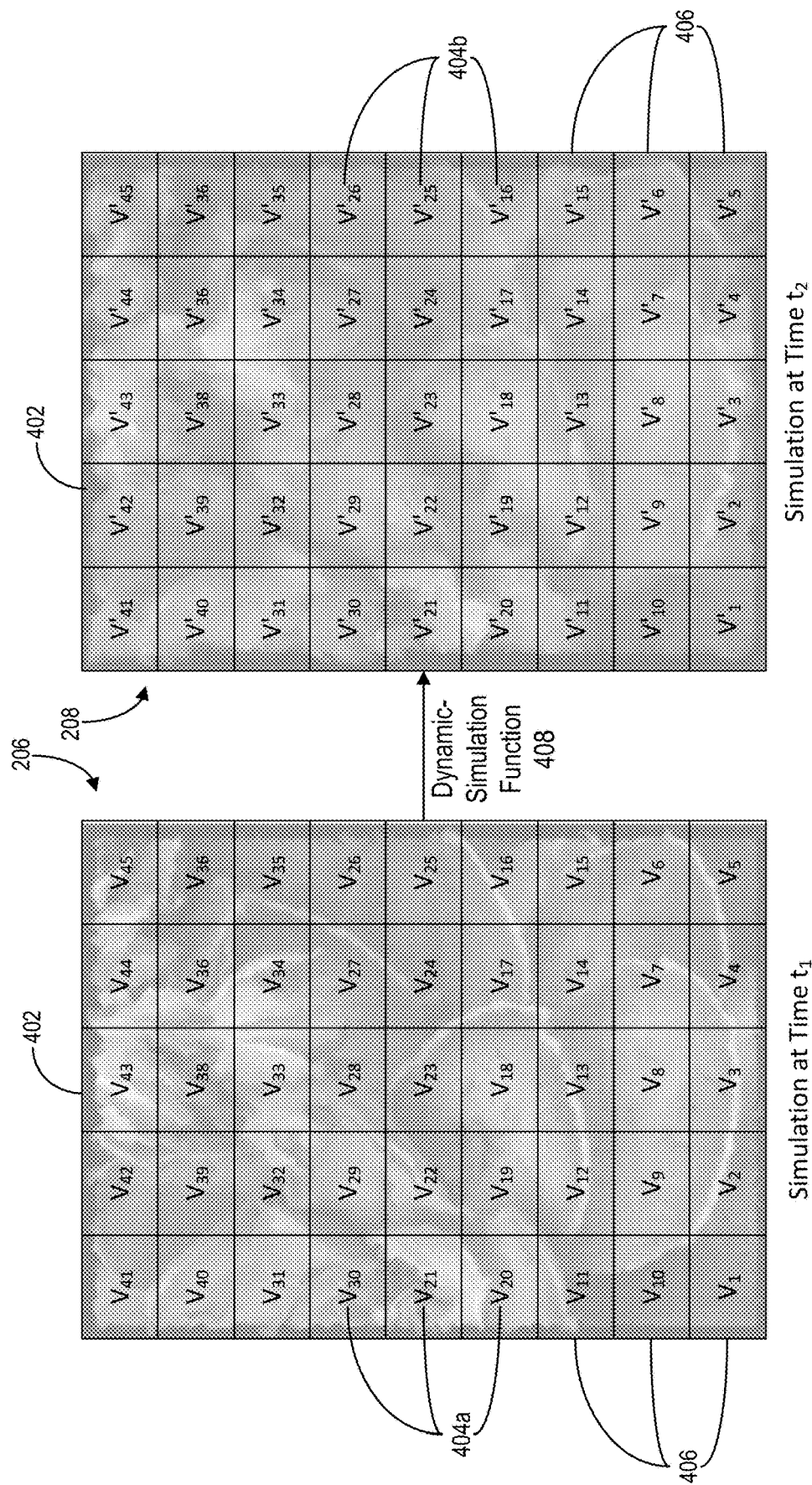
FIGS. 4A-4B illustrate a dynamic image-filter system utilizing a dynamic-simulation function to update simulation values in a simulation flow field and pixel color values in accordance with one or more embodiments.
Figure 4B:
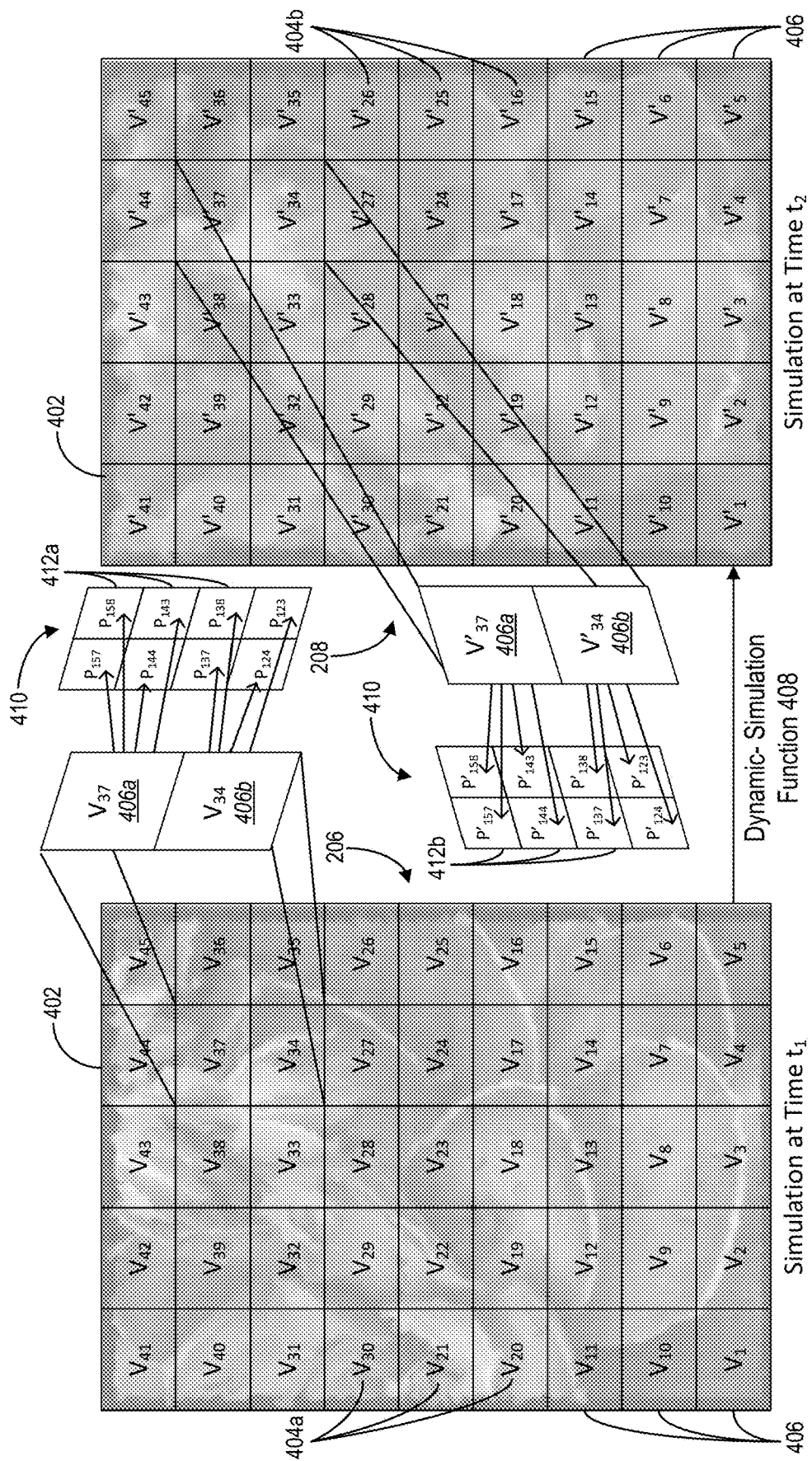

As briefly mentioned above, the dynamic image-filter system 110 can utilize a dynamic-simulation function to update simulation values across time to simulate a dynamical system. FIGS. 4A-4B illustrate the dynamic image-filter system 110 utilizing a dynamic-simulation function 408 corresponding to a selected dynamic image filter to update simulation values and corresponding pixel color values in accordance with one or more embodiments. As shown in FIG. 4A, the dynamic image-filter system 110 generates or populates a simulation flow field 402 comprising simulation values 404a at spatial locations 406 associated with the initial modified image 206. In particular, FIG. 4A shows the dynamic image-filter system 110 generating the simulation values 404a as comprising $V_1$-$V_{45}$ for the spatial locations 406 for time $t_1$ of the simulation.

For example, for time $t_1$ of the simulation, the dynamic image-filter system 110 determines the simulation values 404a comprises at least one of density values, velocity values, temperature values, viscosity values, vorticity values, intensity values, concentration values, or rate-of-diffusion values corresponding to the dynamical system. That is, in some embodiments, the dynamic image-filter system 110 generates the simulation values 404a based on the dynamic-simulation function corresponding to the selected dynamic image filter. For instance, the dynamic-simulation function may include a density component for which the dynamic image-filter system 110 determines a density value. Additionally or alternatively, the dynamic image-filter system 110 determines other simulation values (e.g., velocity values) depending on the component(s) of the dynamic-simulation function.

In certain embodiments, the dynamic image-filter system 110 generates the simulation values 404a based on predetermined values. For example, in some cases, each dynamic-simulation function corresponding to a dynamic image filter includes one or more simulation values comprising default values or preset-optimized (or learned) values for beginning a simulation. As another example, the dynamic image-filter system 110 generates the simulation values 404a based on user preferences and/or user settings (e.g., custom settings for one or more dynamic image filters). In yet another example, the dynamic image-filter system 110 generates the simulation values 404a (and/or simulation values at subsequent time steps) utilizing a random number generator (e.g., to add randomness at a variety of spatial locations).

Additionally or alternatively, in some embodiments, the dynamic image-filter system 110 generates the simulation values 404a based on image characteristics. For example, in certain embodiments, the dynamic image-filter system 110 generates particular velocity values for regions (e.g., image color regions) of the initial modified image 206 corresponding to certain pixel color values. As another example, the dynamic image-filter system 110 generates particular temperature values for regions (e.g., image tonal regions) of the initial modified image 206 that fall within a threshold tonal level. In yet another example, the dynamic image-filter system 110 generates particular density values for regions (e.g., image edge regions) of the initial modified image 206 to prominently depict a simulated effect occurring at image edges.

Subsequently, for time $t_2$, FIG. 4A shows the dynamic image-filter system 110 generates updated simulation values 404b as comprising $V'_1$-$V'_{45}$ according to the dynamic-simulation function 408. That is, at each of the spatial locations 406, the dynamic image-filter system 110 applies the dynamic-simulation function 408 to determine the updated simulation values 404b. In some embodiments, the dynamic image-filter system 110 generates a different simulation value at each of the spatial locations 406 by applying the dynamic-simulation function 408. By contrast, in some embodiments, the dynamic image-filter system 110 generates a different simulation value at selected spatial locations of the spatial locations 406 when applying the dynamic-simulation function 408 to target a determined or selected portion of a digital image.

As an illustration of the latter situation, in some cases, the dynamic image-filter system 110 generates a same simulation value for at least one of the spatial locations 406 by applying the dynamic-simulation function 408. For example, the dynamic image-filter system 110 determines the updated simulation value for a spatial location remains unchanged from time $t_1$ to time $t_2$ by applying the dynamic-simulation function 408 to update a simulation value of zero (or other value). As another example (described more below in relation to FIG. 4B), the dynamic image-filter system 110 advects or transfers (at time $t_2$) a simulation value from a spatial location to a neighboring spatial location that was previously associated (at time $t_1$) with a same initial simulation value. Thus, in some embodiments, one or more of the spatial locations 406 may correspond to a same simulation value for one or more time steps.

Moreover, at time $t_2$, the dynamic image-filter system 110 simulates the dynamical system by modifying the initial modified image 206 to generate the subsequent modified image 208. To generate the subsequent modified image 208, the dynamic image-filter system 110 updates and renders pixel color values based on the updated simulation values 404b (e.g., as described below in relation to FIG. 4B).

Indeed, as shown in FIG. 4B, the spatial locations 406 correspond or map to one or more pixels 410. In some embodiments, the mapping is not a direct correspondence of spatial location to pixel, but rather a rough or approximate correspondence between a spatial location and one or more pixels. For example, as shown in FIG. 4B, each of the spatial locations 406 corresponds to four pixels of the pixels 410. In additional embodiments, however, the spatial locations correspond to a different number of pixels. By contrast, in certain implementations, the mapping between spatial location and pixel is 1:1 such that each of the spatial locations corresponds to an individual pixel of the pixels. In certain embodiments, the dynamic image-filter system 110 improves a simulation runtime or rendering speed of the implementing computing device by utilizing the simulation flow field 402 with a lower resolution compared to the digital image 202. For instance, a lower resolution simulation flow field may include far fewer spatial locations than pixels of the digital image.

As additionally shown in FIG. 4B, each of the pixels 410 comprise pixel color values (e.g., red, green, and blue color values). In particular embodiments, the dynamic image-filter system 110 renders pixel color values for the pixels 410 at each time step based on the corresponding simulation values within the simulation flow field 402. For example, at time $t_1$, the dynamic image-filter system 110 renders pixel color values 412a to visually display the initial modified image 206 within a graphical user interface based on the simulation values at spatial locations 406a and 406b. Similarly, at time $t_2$, the dynamic image-filter system 110 renders pixel color values 412b to visually display the subsequent modified image 208 within the graphical user interface based on updated simulation values at spatial locations 406a and 406b.

As just suggested, to determine the pixel color values of the pixels 410 at each subsequent image frame during the simulation, in some embodiments, the dynamic image-filter system 110 uses simulation values according to the dynamic-simulation function 408. For example, as shown in FIG. 4B, the dynamic image-filter system 110 uses a simulation value $V_{37}$ as a basis to generate the pixel color values $P_{157}$, $P_{158}$, $P_{144}$ and $P_{143}$. Additionally, the dynamic image-filter system 110 uses a simulation value $V_{34}$ as a basis to generate the pixel color values $P_{137}$, $P_{138}$, $P_{124}$ and $P_{123}$. Subsequently, at time $t_2$, the dynamic image-filter system 110 uses an updated simulation value $V'_{37}$ as a basis to update the pixel color values $P_{157}$, $P_{158}$, $P_{144}$ and $P_{143}$ to be $P'_{157}$, $P'_{158}$, $P'_{144}$, and $P'_{143}$. Similarly, the dynamic image-filter system 110 uses an updated simulation value $V'_{34}$ as a basis to update the pixel color values $P_{137}$, $P_{138}$, $P_{124}$ and $P_{123}$ to be $P'_{137}$, $P'_{138}$, $P'_{124}$, and $P'_{123}$.

To further illustrate, take for example a case where the dynamic-simulation function 408 effectively advects or translates the simulation value $V_{37}$ from a spatial location 406a to a neighboring spatial location 406b over the following time step: time $t_1$-time $t_2$. In this example, the spatial location 406a at time $t_1$ comprises a simulation value $V_{37}$ and corresponds to pixels with pixel color values 412a of $P_{157}$, $P_{158}$, $P_{144}$, and $P_{143}$. In particular embodiments, the dynamic image-filter system 110 associates the simulation value $V_{37}$ with the arrangement of pixel color values $P_{157}$, $P_{158}$, $P_{144}$, and $P_{143}$.

Subsequently, by applying the dynamic-simulation function 408 to generate simulation values for the spatial locations 406, the dynamic image-filter system 110 translates the simulation value $V_{37}$ from the spatial location 406a to the neighboring spatial location 406b at time $t_2$. Accordingly, the dynamic image-filter system 110 also translates the pixel color values 412a that are associated with the simulation value $V_{37}$ (in this case, $P_{157}$, $P_{158}$, $P_{144}$, and $P_{143}$) from pixels that correspond to the spatial location 406a to the pixels that correspond to the neighboring spatial location 406b. In other words, the pixel color values $P_{157}$, $P_{158}$, $P_{144}$, and $P_{143}$ shift down 2 pixels over the time step: time $t_1$-time $t_2$. Thus, the updated pixel color values 412b of $P'_{137}$, $P'_{138}$, $P'_{124}$, and $P'_{123}$ equal the pixel color values $P_{157}$, $P_{158}$, $P_{144}$, and $P_{143}$ from the pixel color values 412a.

Although the foregoing example illustrates one instance of advection according to the dynamic-simulation function 408, the present disclosure covers other embodiments in which the dynamic image-filter system 110 implements other methods of advection. Indeed, in some embodiments, the dynamic image-filter system 110 executes the dynamic-simulation function 408 to advect simulation values (and therefore pixel color values) in various directions, distances, and/or amounts. For example, in certain embodiments, the dynamic image-filter system 110 weights the relationship between simulation values and pixel color values. For instance, upon advecting a given simulation value, the dynamic image-filter system 110 correspondingly advects pixel color values in a weighted fashion (e.g., dissipating fashion). In this example, the dynamic image-filter system 110 advects pixel color values such that pixel color values change or transition when advected (e.g., to fade, change hue, decrease saturation). As another example, the dynamic image-filter system 110 executes the dynamic-simulation function 408 to advect simulation values in a variety of ways (e.g., linearly, non-linearly, or randomly).

As noted above, in some embodiments, the dynamic image-filter system 110 utilizes additional or alternative methods to dynamically modify at least a portion of the digital image 202 over time. In particular embodiments, the dynamic image-filter system 110 modifies some portions of the digital image 202 but not other portions of the digital image 202 at any given time step. In some cases, these modifications are in accordance with the dynamic-simulation function 408 for particular spatial locations corresponding to determined or selected portions of a digital image. In other cases, these modifications override the dynamic-simulation function 408 (e.g., by preventing execution of the dynamic-simulation function 408 at certain spatial locations and/or by performing subsequent updates to simulation values).

To illustrate, in some embodiments, the dynamic image-filter system 110 modifies the digital image 202 based on image characteristics at certain regions of the digital image 202 (e.g., an image tonal region, an image color region, or an image edge region). For instance, in certain implementations, the dynamic image-filter system 110 modifies only portions of the digital image 202 corresponding to a border portion around the digital image 202 by locking simulation values at spatial locations inside the border portion. As another example (and as shown in FIG. 2 for instance), the dynamic image-filter system 110 begins modification at certain portions (e.g., at edges of graphical objects depicted within the digital image) and proceeds outwardly. Similarly, in some embodiments, the dynamic image-filter system 110 emphasizes or weights advection of brighter colors over darker colors (or vice-versa).

As further noted above, in some embodiments, the dynamic image-filter system 110 modifies portions of the digital image 202 based on location data. Such location data may include initially determined or initially selected portions of a digital image and correspond to particular spatial locations within the simulation flow field 402. For example, in certain implementations, the dynamic image-filter system 110 modifies portions of the digital image 202 based on absolute image pixel coordinates corresponding to initially selected and neighboring regions of the digital image 202. To illustrate, the dynamic image-filter system 110 modifies portions of the digital image 202 corresponding to a range or set of absolute image pixel coordinates (e.g., that identify an image quadrant, form a shape within the digital image 202, or comprise a digital object portrayed within the digital image 202). In another example, the dynamic image-filter system 110 modifies portions of the digital image 202 corresponding to a range or set of texel coordinates (e.g., to map one or more texels in a texture map to a three-dimensional digital object portrayed in the digital image 202).

Further, in some embodiments, the dynamic image-filter system 110 modifies portions of the digital image 202 based on additional user input. To illustrate, the dynamic image-filter system 110 additionally modifies a local region within the digital image 202 in response to an additional user input (e.g., a haptic swipe interaction) to apply an image filter or an image modification that alters the local simulation values of spatial locations corresponding to the user input. For instance, in certain implementations, the dynamic image-filter system 110 increases a local temperature to increase local cloud generation in response to an additional user input. Similarly, in certain embodiments, the dynamic image-filter system 110 limits modifications to user-designated portions of the digital image 202 based on additional user input. To illustrate, the dynamic image-filter system 110 freezes or locks simulation values at spatial locations outside or inside of a user-designated area (e.g., a resist-area over a human face to prevent modification of facial features portrayed in the digital image 202).

In some embodiments, the spatial locations 406 are arranged in different configurations than the arrangement illustrated in FIGS. 4A-4B. For example, the spatial locations 406 may not be arranged in a grid-like fashion. Rather, the spatial locations 406 may be arranged in a circular pattern, a random pattern, or a staggered block configuration. Additionally or alternatively, the spatial locations 406 may include more or fewer spatial locations, other sizes, shapes, etc. Similarly, in other embodiments, the spatial locations 406 map to more or fewer pixels than illustrated in FIG. 4B.

Although the above provides one example of advection of simulation values, other embodiments of the dynamic image-filter system 110 include advection of simulation values between differently positioned neighboring spatial locations. For example, neighboring spatial locations may include adjacent neighboring spatial locations and non-adjacent spatial locations. Accordingly, in certain embodiments, one or more spatial locations are positioned between a spatial location and a non-adjacent neighboring spatial location (e.g., that is positioned up two spatial locations and over three spatial locations). When advecting between non-adjacent neighboring spatial locations, the dynamic image-filter system 110 may translate simulation values in a same or similar manner as described above. However, in certain cases, the dynamic-simulation function includes a greater magnitude of advection to "jump" to a non-adjacent neighboring spatial location. Additionally or alternatively, the dynamic-simulation function dictates more complex (e.g., non-linear, erratic) translation of simulation values because the dynamic-simulation function itself is, for instance, non-linear.

In addition (or in the alternative to) embodiments involving a single digital image modified by the dynamic image-filter system 110, in some embodiments, the digital image 202 comprises a series of digital images (e.g., a video file). In a video file for instance, pixel color values change from image frame to image frame. Accordingly, in some embodiments, the dynamic image-filter system 110 updates simulation values and correspondingly updates pixel color values of an instant image frame in a manner that accounts for the pixel color values of a next image frame. In this manner, the dynamic image-filter system 110 can blend simulated effects between image frames in a video.

Although not shown in FIGS. 4A-4B, in some embodiments, the dynamic image-filter system 110 performs similar acts as described above at time to prior to modifying the digital image 202. For example, in certain implementations, the dynamic image-filter system 110 generates initial simulation values at time to based on the dynamic-simulation function as described above. Additionally or alternatively, in some embodiments, the dynamic image-filter system 110 generates the initial simulation values at time to based on image characteristics (e.g., the pixel color values of the digital image 202). Then, at time $t_1$, the dynamic image-filter system 110 generates the initial modified image 206 based on the translation (or delta) of simulation values by updating the initial simulation values at time to $t_0$ be the simulation values 404a at time $t_1$. In other embodiments, the dynamic image-filter system 110 generates initial simulation values at time to as placeholders, at least some of which the dynamic image-filter system 110 may not use to generate the initial modified image 206 at time $t_1$.

As mentioned above, the dynamic image-filter system 110 can present, for display within a graphical user interface, a digital image and a set of dynamic image filters for user selection. Based on detecting a user input to select a dynamic image filter, the dynamic image-filter system 110 dynamically modify the digital image within the graphical user interface over time to simulate a dynamical system. FIGS. 5A-5C, FIGS. 6A-6C, FIGS. 7A-7B, FIG. 8, FIGS. 9A-9C, FIGS. 10A-10C, FIGS. 11A-11B, FIGS. 12A-12C, FIGS. 13A-13B, FIGS. 14A-14B, FIGS. 15A-15B, FIGS. 16A-16B, and FIGS. 17A-17B illustrate computing devices 500-1700 presenting graphical user interfaces relating to a dynamic simulation to modify a digital image in accordance with one or more embodiments.

In these or other embodiments, the computing devices 500-1700 comprise a client application 108. In some embodiments, the client application comprises computer-executable instructions that (upon execution) cause the computing devices 500-1700 to perform certain actions depicted in the corresponding figures, such as presenting a graphical user interface of the client application. In particular embodiments, the client application causes GPUs of the computing devices 500-1700 to perform specific acts (including those discussed above in relation to FIGS. 4A-4B) for modifying pixel color values at each time step in the simulation and rendering a corresponding image. Rather than refer to the client application or the dynamic image-filter system 110 as performing the actions depicted in the figures below, this disclosure will generally refer to the computing devices 500-1700 performing such actions for simplicity.

Figure 5A:
Figure 5B:
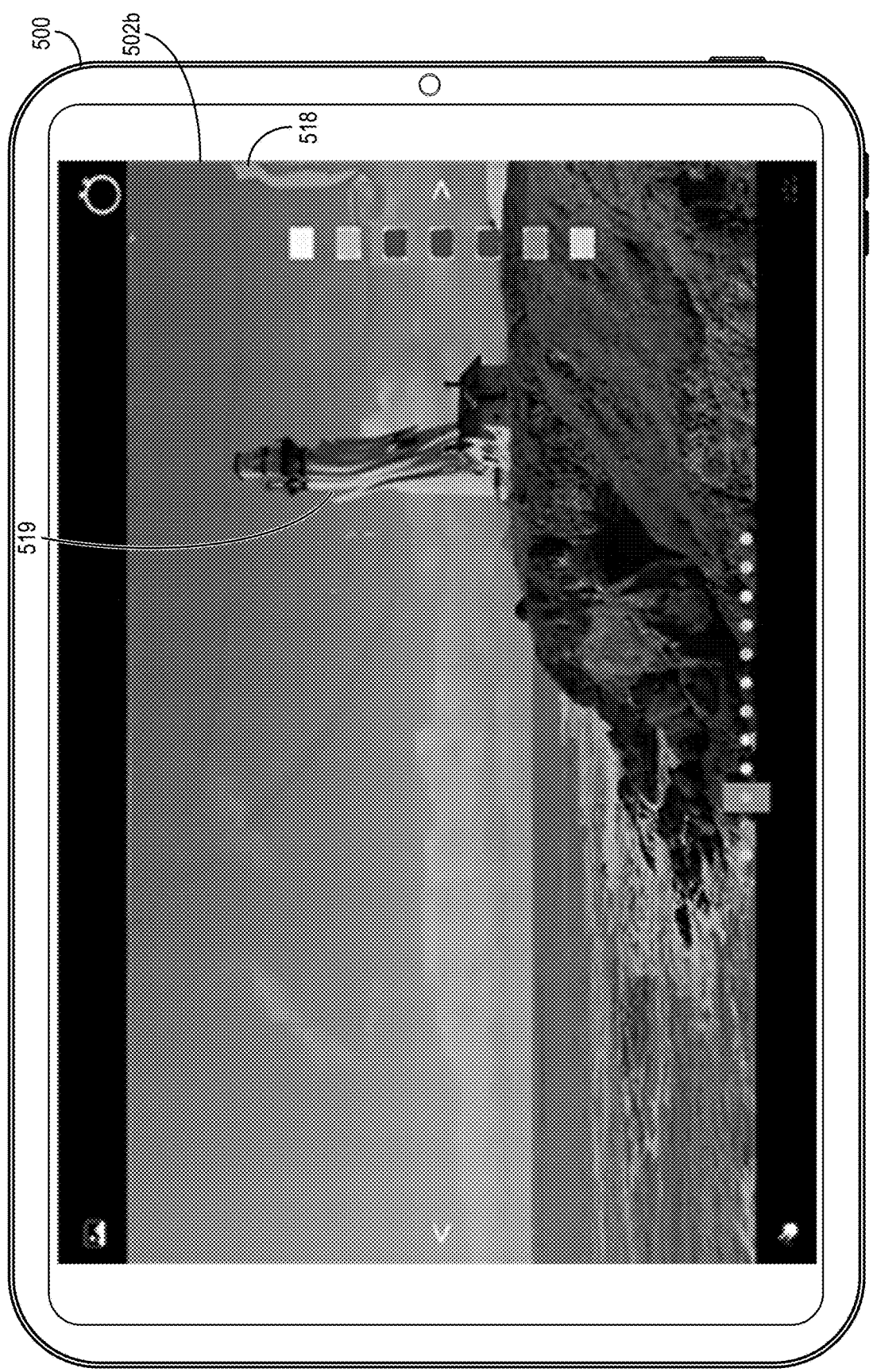

As indicated above, in one or more embodiments, the dynamic image-filter system 110 modifies a digital image over time according to a dynamic image filter by simulating a fluid and/or a chemical. FIGS. 5A-5C illustrate a particular example of simulating a gel-like fluid by depicting a viscous, liquid nature of the gel-like fluid via changing ripples and swirls as the simulation progresses. In FIG. 5A, the computing device 500 displays a graphical user interface 502a comprising a digital image 504, dynamic image filters 506, and dynamic filter variations 507. As described in relation to the foregoing figures, some of the dynamic image filters 506 appear as selectable options that trigger software routines or algorithms for modifying the digital image 202 by simulating, within the digital image 202, a dynamical system.

Examples of some particular dynamical systems correspond to physical matter, such as fluid, smoke, fire, rain, atmospheric clouds, and interacting chemicals. Additionally, other examples of particular dynamical systems correspond to a physical effect or property, such as gravity, light ray, light refraction, reaction diffusion, and cellular automata. Further, some other examples of particular dynamical systems include iterated function systems or fractal generating systems.

Additionally or alternatively, some dynamical systems correspond to artificially controlled effects or properties of physical matter or of non-physical things. For example, a dynamical system may model a fluid with accelerating properties in contrast to normally dissipative or decelerating properties of normal fluids. As another example, a dynamical system may model a modified direction of gravitational force, modified or random forces of attraction or repulsion among smoke or cloud water vapor, etc. In yet another example, a dynamical system may model formation of chemical nuclei that disappear and/or appear out of nowhere (against conservation of nuclei).

In addition, some of the dynamic filter variations 507 comprise a selection of adaptations specific to a selected dynamic image filter. In particular embodiments, the dynamic filter variations 507 include variations to the simulation values. For example, variations to simulation values include different parameters or different initial conditions. Further, in some embodiments, the dynamic filter variations 507 include different types of display views. Further, in certain implementations, the dynamic filter variations 507 correspond to particular render mappings that adjust how the dynamic-simulation function executes to induce specific creative effects. Examples of such creative effects include selecting light versus dark colors to be advected, determining advection amounts/direction based on saturation, or determining the rate of refresh to balance or transition between multiple images that form a composite image.

As further shown in FIG. 5A, the graphical user interface 502a comprises various icons to interact with the client application. In particular, the various icons include an image icon 508 to retrieve a digital image. For example, when the image icon 508 is activated, the computing device 500 accesses a photo application or opens a camera viewfinder to capture and utilize a new digital image. Further, the graphical user interface 502a comprises left/right navigation elements 510 to navigate to a previous or next image in a collection of digital images. Additionally, the graphical user interface 502a comprises an interactive toggle 512 to start, stop, reset, bookmark, or rewind the simulation. In addition, the graphical user interface 502a comprises a gesture toggle 514 to switch between enabling gestures to modify the simulation or alternatively change zoom and pan amounts. Further, the graphical user interface 502a comprises a dimmer control 516 to interactively adjust brightness levels.

Based on detecting a user input selecting a dynamic image filter for simulating fluid (and a gel-like fluid variation of the dynamic filter variations 507), the computing device 500 identifies a corresponding dynamic-simulation function. For example, the computing device 500 identifies a dynamic-simulation function as comprising a fluid velocity component and/or a chemical density component.

To illustrate, in certain implementations, the computing device 500 identifies the dynamic-simulation function for simulating a fluid to carry or advect chemical density components as comprising the following equation $d[a](r, t+dt) = d[a](r-v(r,t)dt, t)$. This example equation represents the chemical density $d[a]$ at location r at the new incremented time step (t+dt). In particular, the chemical density $d[a]$ at location r at the new incremented time step (t+dt) is the same as a chemical density value translated, from a neighboring spatial location, by the amount and direction of the fluid velocity v(r,t) over the time step dt (e.g., seconds). In particular, the term d[a] represents a chemical density for a chemical of index a (e.g., an integer which ranges in value from 0 to N−1 for denoting one of N possible chemical components or elements), the term r represents a spatial location (e.g., associated with coordinate positions, such as (x,y)), and the term t represents a time value.

In these or other embodiments, the computing device 500 determines an updated velocity value at each new time step of the dynamic simulation according to the following function: v'(r,t) or v(r, t+dt). Although represented as a two-dimensional vector, other embodiments include higher dimensionality for simulations of a two-dimensional fluid (e.g., to introduce disappearance and reappearance effects in the simulation). Additionally, in some embodiments, the computing device 500 determines an updated chemical density value at each new time step of the dynamic simulation according to the following function: d'[a] (r,t) or d'[a] (r,t+dt). Additionally or alternatively, in some embodiments, the computing device 500 identifies a dynamic-simulation function according to other fluid dynamic equations as described by Mark J. Harris in Fast Fluid Dynamics Simulation on the GPU, GPU Gems, Ch. 38, Published September 2007, archived at developer. download.nvidia.com/books/HTML/gpugems/gpugemsch38.html, the contents of which are expressly incorporated herein by reference.

As suggested in FIG. 5B, in certain implementations, the computing device 500 generates a simulation flow field comprising simulation values at spatial locations. For example, the computing device 500 populates initial chemical density values and initial fluid velocity values for each spatial location in the simulation flow field.

Based on the simulation values, FIG. 5B shows the computing device 500 generating a first modified digital image 518 for display in a graphical user interface 502b. In particular, FIG. 5B shows the computing device 500 modifying pixel color values to render changes at an image portion 519 depicting an initial set of ripples distorting the lighthouse to simulate the gel-like fluid according to the dynamic-simulation function. For instance, as described above in relation to FIG. 4B, the computing device 500 modifies the image portion 519 by generating updated pixel color values based on simulation values at spatial locations that map to corresponding pixels.

Alternatively, as described above, the computing device 500 can generate initial simulation values corresponding to the digital image 504 illustrated in FIG. 5A. In this example, the computing device 500 executes the dynamic-simulation function for each spatial location in the simulation flow field to generate the first modified digital image 518. Specifically, in this case, the computing device 500 at time t+dt generates updated simulation values by executing the dynamic-simulation function to update the initial simulation values. Using the updated simulation values, the computing device correspondingly modifies the pixel color values at the image portion 519 for generating and rendering the first modified digital image 518.

As indicated by FIG. 5C, the computing device 500 again executes the dynamic-simulation function for each spatial location in the simulation flow field to generate a second modified digital image 520 for display in a graphical user interface 502c. In particular, FIG. 5C shows the computing device 500 having modified pixel color values in the first modified digital image 518 to further simulate the gel-like fluid according to the dynamic-simulation function at a subsequent time step (e.g., t+2dt). Indeed, as depicted in the second modified digital image 520, the computing device 500 has further progressed the simulation of the gel-like fluid compared to the first modified digital image 518 by further modifying pixel color values at an image portion 521 to depict additional ripples and swirls based on updated simulation values.

Although not shown, in certain embodiments, the computing device 500 comprises a user interface with subsequent image frames of the digital image 504 at later time steps in the simulation. In these or other embodiments, each subsequent image frame comprises additional or alternative modifications according to the dynamic-simulation function. Moreover, in some embodiments, the computing device 500 detects additional user input to apply image filters or image modifications that alter the fluid simulation and/or pause, bookmark, or capture an image frame (e.g., as described above in relation to the foregoing figures).

Figure 6A:
FIGS. 6A-6C illustrate a dynamic image-filter system providing user interfaces on a computing device depicting a dynamic simulation of reaction diffusion in accordance with one or more embodiments.
Figure 6B:
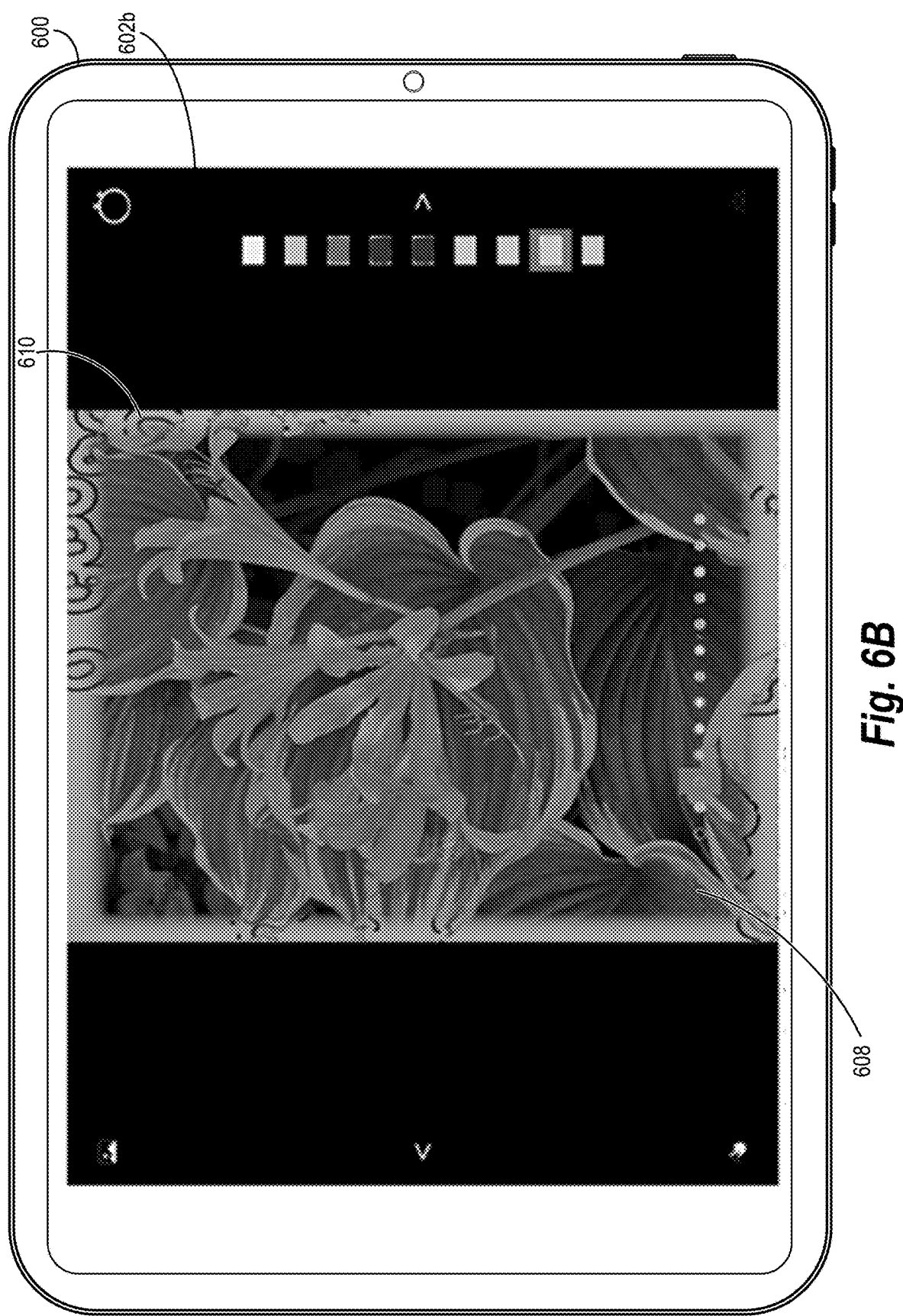
Figure 6C:

As discussed previously, in certain embodiments, the dynamic image-filter system 110 simulates reaction diffusion to modify a digital image over time. FIGS. 6A-6C illustrate a particular example of reaction diffusion by simulating bacteria-like growth and proliferation at a border portion of a digital image. In particular, FIG. 6A illustrates the computing device 600 displaying a graphical user interface 602a that includes a digital image 604 with a border portion 606, dynamic image filters 506, and dynamic filter variations 607. As shown in FIG. 6A, the computing device 600 displays the digital image 604 with the border portion 606 comprising initial conditions for a reaction diffusion simulation. In these or other embodiments, a reaction diffusion simulation depicts interactions of chemicals with each other and/or a fluid (e.g., as dispersed or diffused into the fluid).

Based on detecting a user input to select a reaction-diffusion dynamic image filter (and a bacteria-border variation of the dynamic filter variations 607), the computing device 600 modifies the border portion 606 to include initial bacteria conditions as shown in FIG. 6A. In one or more embodiments, detecting such user input causes the computing device 600 to identify a dynamic-simulation function for reaction diffusion corresponding to the selected dynamic image filter and border variation. In certain implementations, the dynamic-simulation function comprises the Gray Scott model of reaction diffusion as described by Abelson, Adams, Coore, Hanson, Nagpal, and Sussman in *Gray Scott Model of Reaction Diffusion* archived at groups.csail.mit-.edu/mac/projects/amorphous/GrayScott/, the contents of which are expressly incorporated herein by reference.

Additionally or alternatively, the dynamic-simulation function for implementing the reaction-diffusion dynamic image filter shown in FIG. 6A comprises one or more algorithms that represent Belousov-Zhabotinsky reactions and/or combinations of various other models as described by Anatol M. Zhabotinsky in Belousov-Zhabotinsky *Reaction*, (2007), Scholarpedia, 2(9):1435, archived at scholarpedia.org/article/Belousov-Zhabotinsky_reaction (hereafter Zhabotinsky); and by Christina Kuttler in *Reaction-Diffusion Equations With Applications*, (2011) archived at www-m6.ma.turn.de/[kuttler/script_reaktdiff.pdf, (hereafter Kuttler). The contents of Kuttler and Zhabotinsky are expressly incorporated herein by reference.

As shown in FIG. 6B, the computing device 600 generates a graphical user interface 602b comprising a first modified digital image 608. As shown, the first modified digital image 608 comprises a first modified border portion 610. Compared to the border portion 606 in FIG. 6A, the first modified border portion 610 comprises additional bacteria-like growth and interactions depicted at a next time step. For example, by updating the simulation values and changing corresponding pixel color values for pixels at the first modified border portion 610, the computing device 600 depicts bacteria growth/mutation to an enlarged size.

Inside the first modified border portion 610, the first modified digital image 608 remains largely the same as the digital image 604. To keep an interior portion of the first modified digital image 608 the same, in certain implementations, the computing device 600 locks the simulation values or prevent execution of the dynamic-simulation function at an interior portion of the digital image 604 inside the border portion 606. Alternatively, the computing device 600 keeps the interior portion of the digital image 604 the same over time by utilizing a mask layer for the border portion 606 and updating simulation values only for the mask layer.

Likewise, in FIG. 6C, the computing device 600 generates a graphical user interface 602*c* comprising a second modified digital image 612. As shown, the second modified digital image 612 comprises a second modified border portion 614. Compared to the border portion 606 and the first modified border portion 610 in FIGS. 6A-6B, the second modified border portion 614 comprises further spreading of the bacteria-like substance depicted at a subsequent time step. For example, by again updating the simulation values and changing corresponding pixel color values for pixels at the second modified border portion 614, the computing device 600 shows the increased proliferation of bacteria-like organisms across an entirety of the border portion.

Figure 7A:
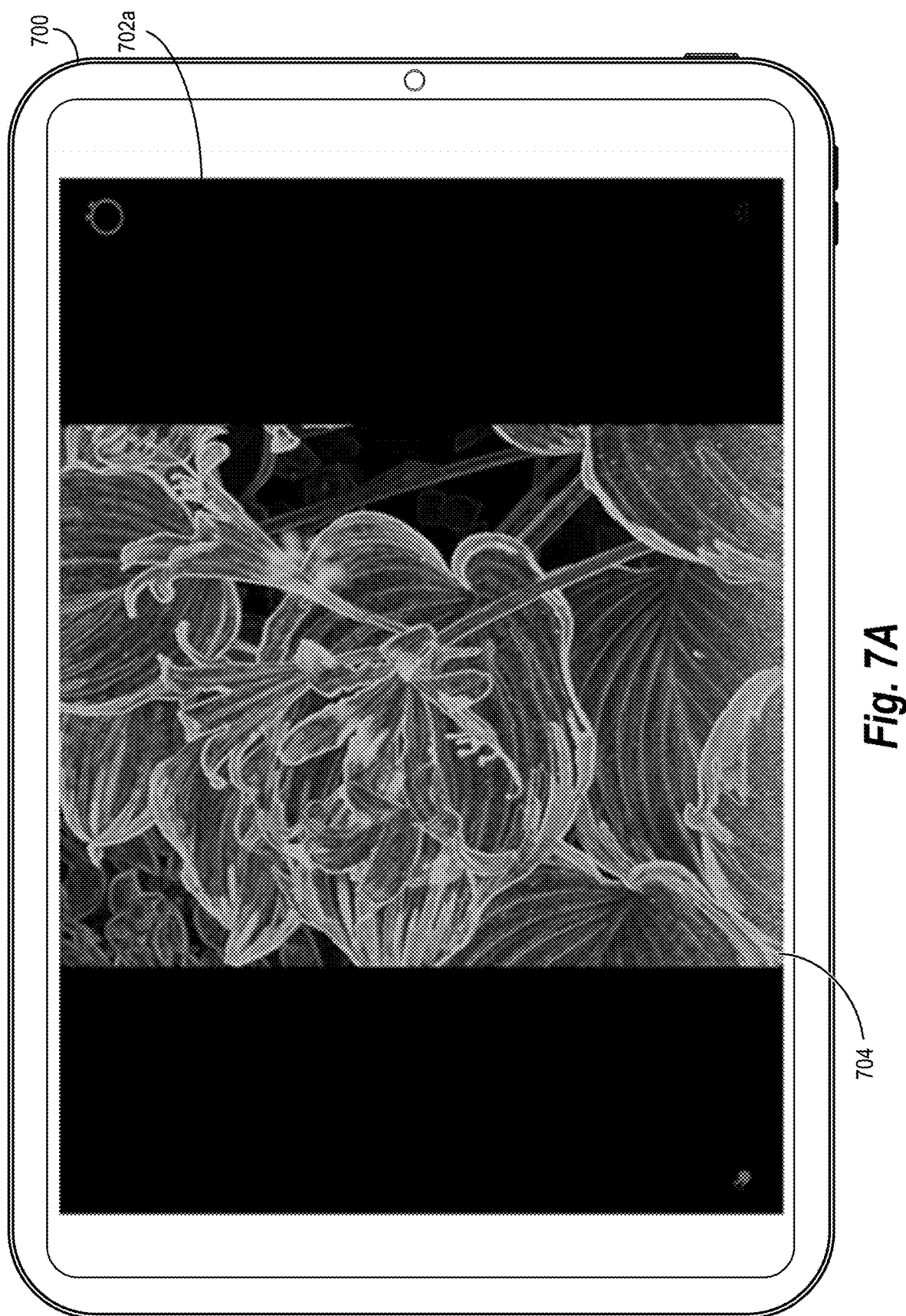
FIGS. 7A-7B illustrate a dynamic image-filter system providing user interfaces on a computing device depicting a dynamic simulation of a smoke effect in accordance with one or more embodiments.
Figure 7B:

As previously mentioned, in certain implementations, the dynamic image-filter system 110 simulates a smoke effect to modify a digital image over time. FIGS. 7A-7B illustrate a particular example of a smoke effect in which the source of the simulated smoke initially corresponds to edges of graphical objects in a mask image. In particular, FIG. 7A illustrates the computing device 700 comprising a graphical user interface 702*a* that includes a mask image 704. For clarity of illustration and discussion, FIGS. 7A-7B do not show a digital image underlying the mask image 704.

Based on detecting a user input to select a smoke effect dynamic image filter (and a dynamic filter variation for smoking object edges), in some embodiments, the computing device 700 identifies a corresponding dynamic-simulation function for simulating smoke. For example, the computing device 700 identifies a dynamic-simulation function as comprising a temperature component according to the function $T(r,t)$ and a chemical density component of smoke according to the function $d[smoke](r,t)$. Each spatial location r in a simulation flow field corresponding to the mask image 704 is associated with a respective smoke density value $d[smoke]$ and a respective temperature value T at time t.

To illustrate, in certain implementations, the computing device 700 identifies the dynamic-simulation function for simulating smoke that models the behavior of hotter air being more buoyant than cooler air in addition to a gravitational force acting on larger smoke particles. For example, in certain implementations, the dynamic-simulation function comprises semi-Lagrangian computational models and/or computational fluid dynamic algorithms for implementing vorticity confinement as described by Ronald Fedkiw, Jos Stam, and Henrik W. Jensen, Visual Simulation of Smoke, In Proceedings of SIGGRAPH 2001, archived at graphics.ucsd.edu/~henrik/papers/smoke/smoke.pdf, the contents of which are expressly incorporated herein by reference.

As suggested in FIG. 7A, the computing device 700 simulates a smoke effect by transforming smoke density values, temperature values, and/or other simulation values within a simulation flow field over time. In this particular example of the mask image 704, the computing device 700 transforms the smoke density over time within the mask image 704 according to the following expression: image color$(r,t)=d[smoke](r,t)/(1+d[smoke](r,t))$, where image color$(r,t)$ corresponds to pixel color values for pixels of the mask image 704 corresponding to spatial locations r at time t. In this example expression, the smoke density values corresponding to spatial locations r at time t are divided by the sum of a scalar value of one ("1") and the smoke density values at time corresponding to spatial locations r at time t.

In other embodiments (not shown in FIGS. 7A-7B), the computing device 700 simulates a smoke effect by directly modifying a digital image as opposed to the mask image 704 overlaying the digital image. In this example, the computing device 700 similarly transforms smoke density values, temperature values, and/or other simulation values within a simulation flow field over time. However, in one or more implementations, the computing device 700 transforms smoke density values directly within the digital image utilizing a different dynamic-simulation function than provided above, For instance, the computing device may execute the following expression for directly modifying a digital image instead of the mask image 704: image color$(r,t)=$digital image$(r)+f*d[smoke](r,t)$, where image color$(r,t)$ corresponds to updated pixel color values for pixels of the mask image (i.e., the digital image) at locations r corresponding to spatial locations at time t. The factor f (e.g., a value of 1) controls the strength of the smoke. In this example expression, the original pixel color values for pixels of the digital image (represented by digital image$(r)$) are added to the product of the factor f and the smoke density values corresponding to spatial locations r at time t.

Utilizing a dynamic-simulation function for simulating smoke, FIG. 7B shows the computing device 700 generating a graphical user interface 702*b* comprising a modified digital image 706. In particular embodiments, the computing device 700 generates updated simulation values in a simulation flow field. Based on the updated simulation values, in certain implementations, the computing device 700 updates pixel color values to generate and render the modified digital image 706 depicting wisps of smoke emitting from edges of graphical objects within the modified digital image 706 (e.g., according to the magnitude of a spatial gradient of image colors). Moreover, although not shown, the computing device 700 can iteratively update simulation values in subsequent time steps to depict motion of smoke (e.g., rising or falling) and/or interactions with other elements, such as a user-generated addition of a wind element or light ray.

In these or other embodiments, one or more source fields determine where the simulation emanates from (whether across a digital image or only at specific locations). For example, although the smoke generation begins at edges of the leaves/petals in FIG. 7A, in certain embodiments, the computing device 700 utilizes a dynamic-simulation function and/or a dynamic filter variation that models a different source field. To illustrate, in some embodiments, the computing device 700 renders the smoke as originating from a bottom portion of the modified digital image 706 and rising upwards with an exponential vertical falloff and with random variation.

Additionally or alternatively to the embodiments discussed above in relation to FIGS. 7A-7B, in some cases, the computing device 700 renders the smoke according to image color regions (e.g., based on a range of image color values). In this example, the computing device 700 renders the smoke according to an exponential function of the color distance between each pixel color value and a specified sample image color. Still, in other embodiments, the computing device 700 renders the smoke according to an exponential function based on image luminance difference, image tonal regions (e.g., shadows, mid-tones, or highlights), etc.

Figure 8:
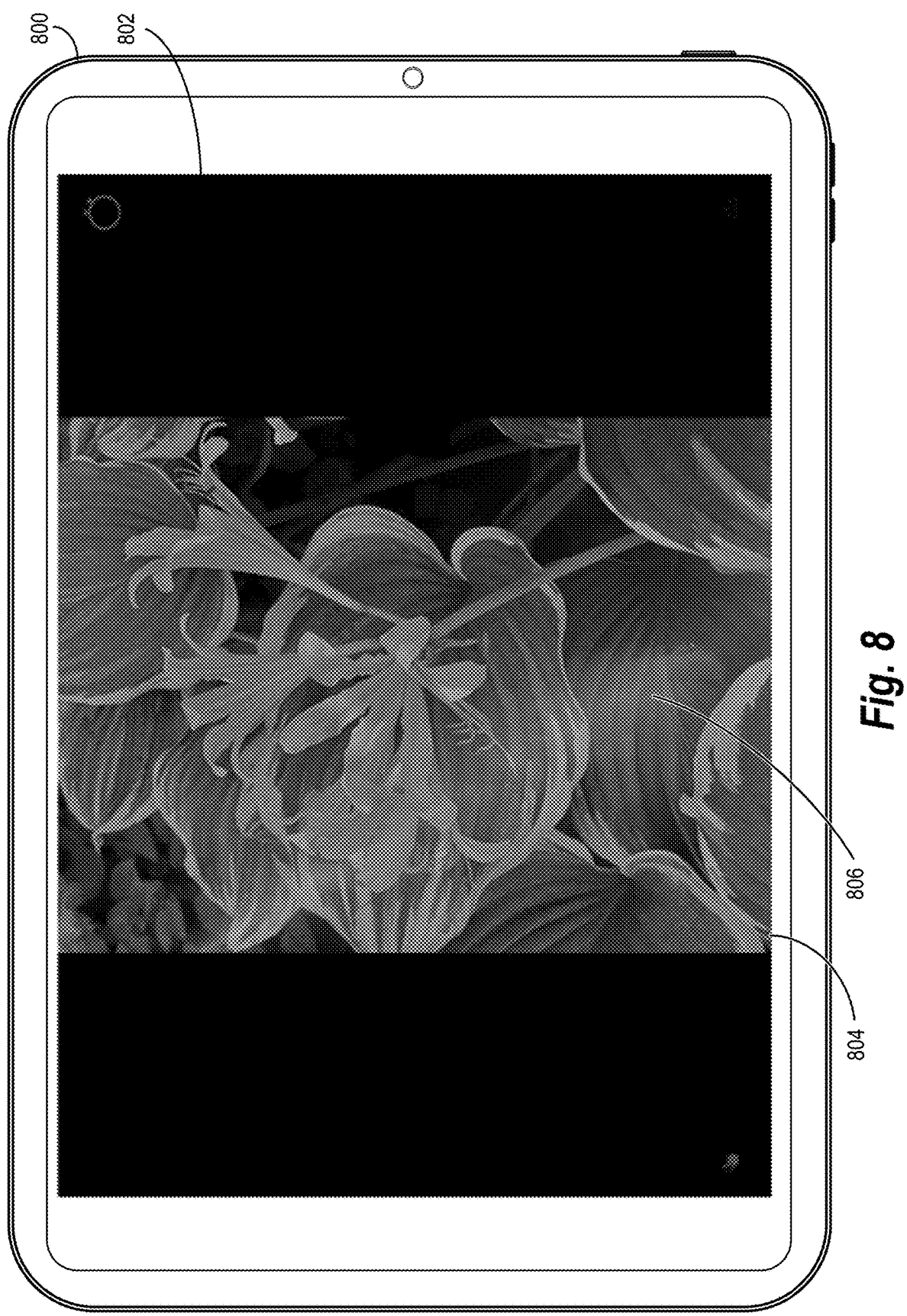
FIG. 8 illustrates a dynamic image-filter system providing a user interface on a computing device depicting a dynamic simulation of light interaction with smoke in accordance with one or more embodiments.

As described in the preceding portions of this disclosure, in certain embodiments, the dynamic image-filter system 110 simulates light interacting with various elements, such as smoke, fluids, chemicals, etc. FIG. 8 illustrates a specific example of modifying colors of a digital image to simulate light interacting with smoke. In particular, FIG. 8 illustrates the computing device 800 displaying a graphical user interface 802 that includes a digital image 804 with a light ray 806 depicted across a portion of the digital image 804.

In some embodiments, the computing device 800 generates a light intensity field $L(r,t)$ as part of (or separate from) a simulation flow field comprising chemical/smoke density values, temperature values, and/or fluid velocity values. In these or other embodiments, the light intensity field interacts with the simulation values (e.g., to increase or decrease a fluid temperature).

For example, one such interaction between a light intensity field and simulation values involves a simulation flow field for temperature $T(r,t)$ that changes over time according to the following dynamic-simulation function: $T(r, t+dt) = T(r,t) + dt * kL * L(r,t)$, where $kL$ is a constant that controls the strength of the light interaction (e.g., one degree Celsius per second for light values ranging from zero to one). In this example expression, temperature values $T(r,t)$ are added to the product of a time step $dt$, the constant $kL$, and the light intensity field $L(r,t)$. In a similar fashion, additional or alternative embodiments of the computing device 800 include modifying simulation values such as chemical densities or fluid velocity based on the light intensity field.

After executing a dynamic-simulation function (e.g., for temperature and smoke density), in certain implementations, the computing device 800 generates a preliminary image result. Based on the introduction of one or more light rays, light likes, light beams, etc., the computing device 800 generates a final image result for display (e.g., the digital image 804 by modifying the preliminary image result and/or rendering).

In certain implementations, the computing device 800 determines and renders updated pixel color values for the digital image 804 as the final image result according to the following example expression: image $color(r,t) = $ digital image$(r) + $ light color$*(c_0 + d[a](r,t))$, where image $color(r,t)$ corresponds to updated pixel color values for pixels of the preliminary image result (i.e., the digital image) at locations r corresponding to spatial locations at time t. The term light color represents the color of the light ray(s) (e.g., between 0 and 1 such as respective RGB values of 0.7, 0.45, and 0.3). In addition, the terms $c_0$ and $c_1$ represent strength constants (e.g., about 0.1 and 0.3, respectively). Further the index a represents one of the density components, such as smoke, water vapor, chemical elements, or temperature depending on the type of simulation. In this example expression, pixel color values for the preliminary image (represented by digital image$(r)$) are added to the product of light color and a summed value, where the summed value is equivalent to the summation of the strength constant $c_0$ and the product of the strength constant $c_1$ and chemical density values $d[a](r,t)$.

Figure 9A:
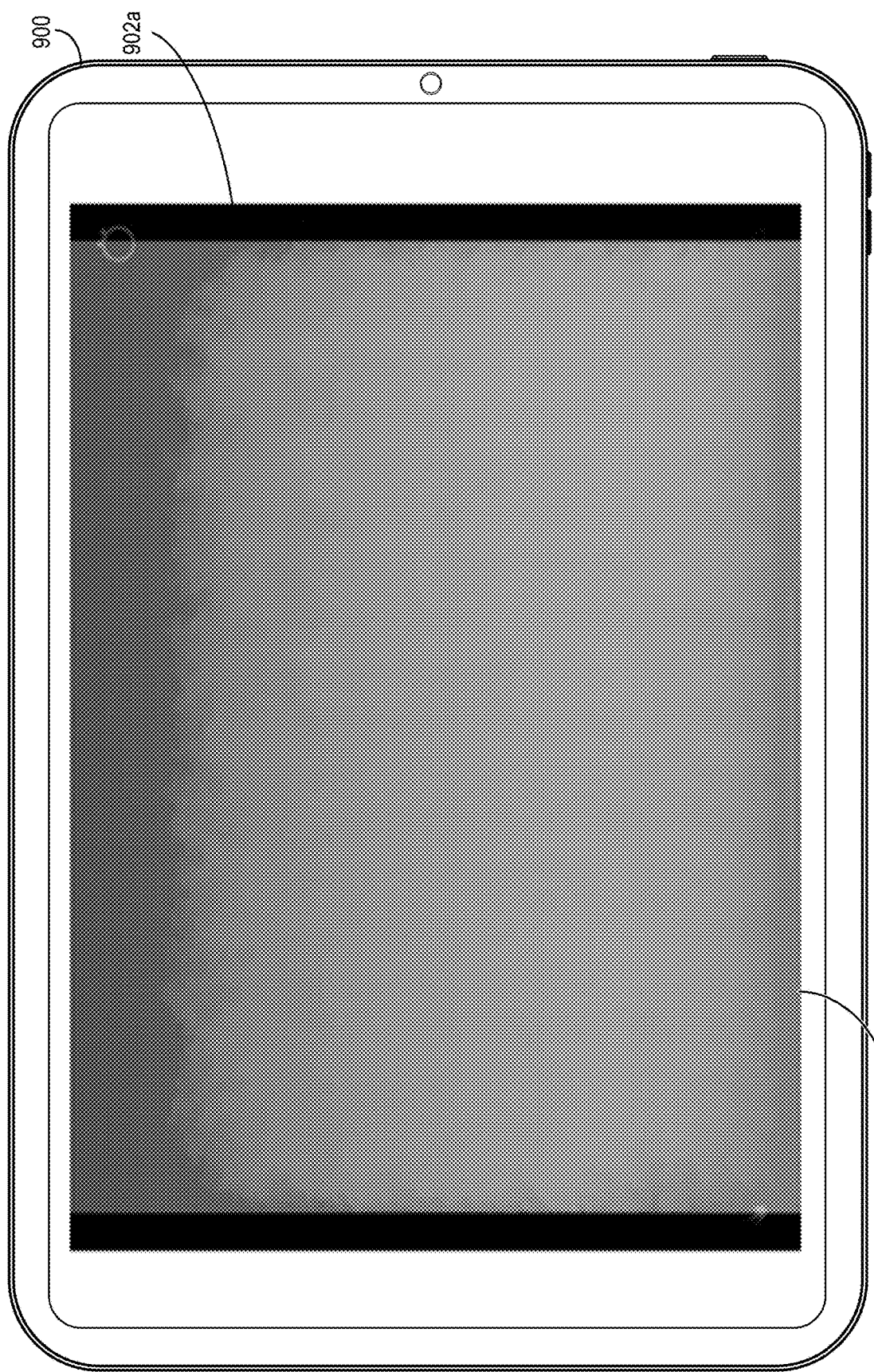
Figure 9C:
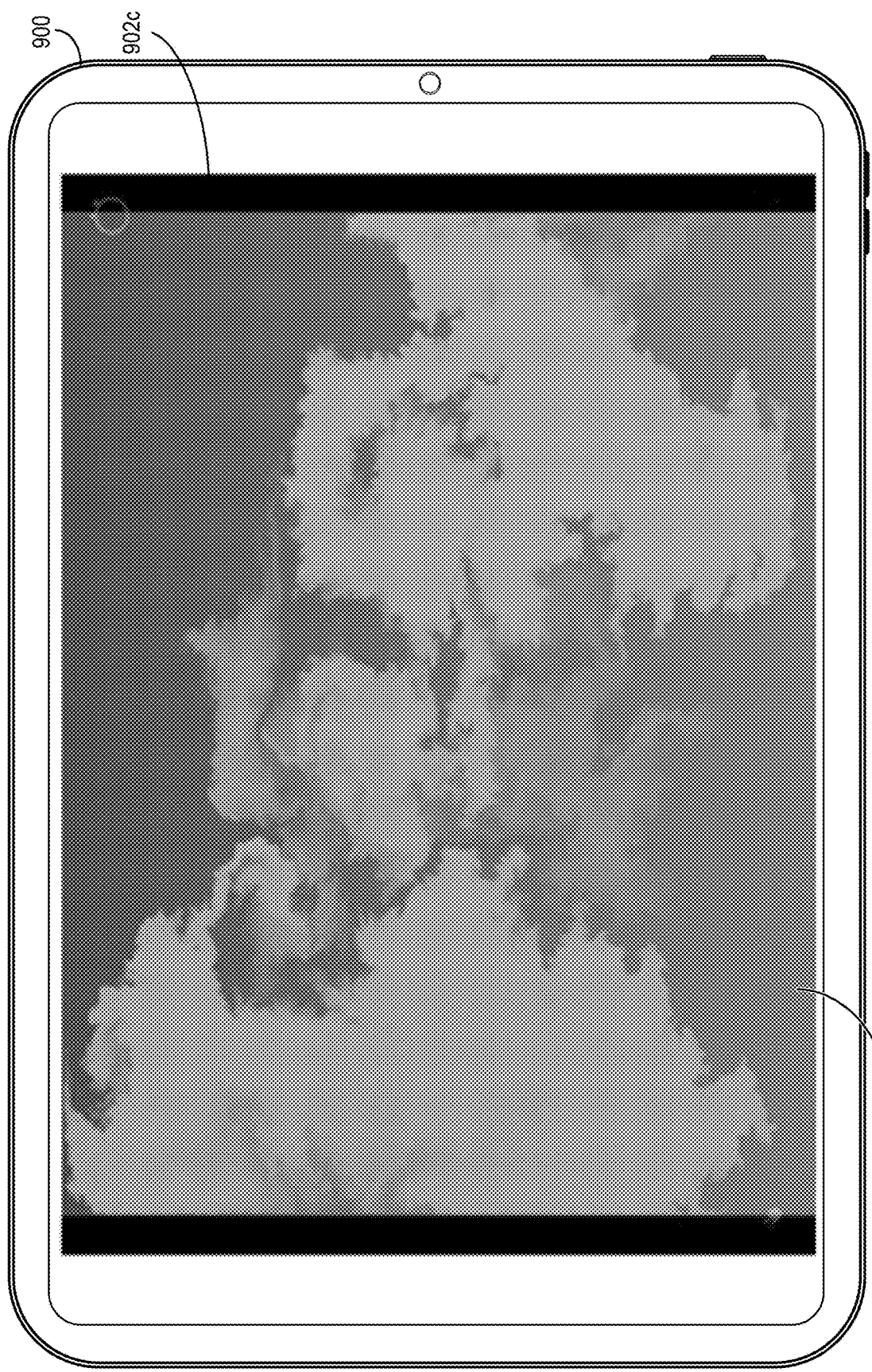

As mentioned above, in certain cases, the dynamic image-filter system 110 simulates cloud generation to modify a digital image over time. FIGS. 9A-9C illustrate a specific example of modifying a digital image to simulate evolving atmospheric cloud generation to create particular cloud formations. In particular, FIG. 9A illustrates the computing device 900 displaying a graphical user interface 902a that includes a digital image 904. As shown, the digital image 904 depicts clouds in accordance with initial conditions of a cloud simulation (although in other embodiments, a mask image of clouds may be used).

For example, based on detecting a user selection of a dynamic cloud generation image filter, the computing device 900 identifies a dynamic-simulation function to form the atmospheric clouds shown in FIG. 9A depicted with uniform distribution of moisture droplets visible as white clouds. In particular embodiments, the dynamic-simulation function for cloud generation models the relationship between the rising of hot air, the falling of heavy cloud droplets, and the localized heating of air when vaporous water condenses to cloud droplets.

To illustrate, the dynamic-simulation function for simulating atmospheric cloud generation includes a representation of various components for simulating a low viscosity fluid (e.g., air) with velocity and chemical mass densities of evaporated water vapor, condensed cloud water droplets, and rain. Thus, in some embodiments, the simulation flow field comprises simulation values at each spatial location in a simulation flow field comprising a velocity field $v(r,t)$ and density fields $d[vapor](r,t)$, $d[cloud](r,t)$, and $d[rain](r,t)$ for vapor, cloud, and rain, respectively. In at least one implementation, the computing device 900 simulates cloud formation based on the simulation values for the cloud density field $d[cloud](r,t)$, and optionally based on simulation values for the vapor density field $d[vapor](r,t)$ and/or rain density field $d[rain](r,t)$. The different density values at each spatial location r represent the ratio of associated mass of each component to the mass of the air in a small volume element at time t.

In some embodiments, the dynamic-simulation function for cloud simulation comprises various cloud dynamics equations as described by Mark J. Harris. William V. Baxter III, Thorsten Scheuermann, and Anselmo Lastra in *Simulation of Cloud Dynamics on Graphics Hardware*, in Proceedings of Graphics Hardware (2003), Eurographics Association, pp. 92-101, archived at users.cg.tuwien.ac.at/bruckner/ss2004/seminar/A3b/Harris2003%20-%20Simulation%20oP/0 20Cloud %20Dynamics %20on %20Graphics %20Hardware.pdf, the contents of which are expressly incorporated herein by reference.

FIG. 9B illustrates the computing device 900 generating a graphical user interface 902b comprising a first modified digital image 906 for a next time step (e.g., t+dt) in the cloud simulation. As suggested in FIG. 9B, the computing device 900 executes the dynamic-simulation function for cloud generation to update simulation values and correspondingly update pixel color values (e.g., as described above). Indeed, as shown in FIG. 9B, tendril-like portions of clouds are depicted as rising up and expanding from the initial uniform cloud formation in FIG. 9A.

Similarly, FIG. 9C illustrates the computing device 900 generating a graphical user interface 902c comprising a second modified digital image 908 for a subsequent time step (e.g., t+2dt). As suggested in FIG. 9C, the computing device 900 detected a gesture stroke to cool down the air temperature, which causes more cloud droplet formation, and hence more visible clouds. Indeed, as shown in FIG. 9C, the computing device 900 generates the cloud formation in the second modified digital image 908 with brightened, broken up, and gesture-stirred cloud portions.

In other embodiments, other types of additional user input cause different alterations of the cloud simulation. For example, in response to detecting user interaction with a user interface element, such as an editing tool simulating an accelerator pedal, the computing device 900 can update simulation values and pixel color values to show clouds flowing from left to right instead of right to left (and vice-versa). Different types of gesture strokes can add more water vapor, reduce flow speed (e.g., change advection rate), etc. to provide the desired image modification.

Similarly, in some embodiments, the computing device 900 changes simulation values and/or the direction of advection for a variety of simulations in response to detecting tilting, shaking, particular orientations, or other movement of the computing device 900. In these or other embodiments, the computing device 900 comprises an accelerometer, gyroscope, or other suitable sensor device to detect such user inputs. Further, in certain implementations, the computing device 900 alters a simulation, bookmarks an image frame, or saves an image frame, in response to detecting interaction with hot keys, sliders, arrows, indicators, input fields, etc. (e.g., an "R" button to reset the simulation, a slider to adjust strength of gravity).

As just described in relation to FIGS. 9A-9C, the computing device 900 dynamically simulates clouds. In these or other embodiments, the computing device 900 utilizes one or more cloud generation options to specify what type of image creation or modification to make. For instance, the computing device 900 generates clouds on a blue-sky gradient background utilizing the following expressions: cloud_on_sky_color(r,t)=cloud_color(r,t)+sky_blue_color(r), where the term cloud_color(r,t)=d[cloud](r,t)/(d[cloud](r,t)+d0). In the first example expression, the pixel color values corresponding to cloud_color(r,t) are added to the pixel color values corresponding to sky_blue_color(r). In the second example expression, the cloud density values d[cloud] (r,t) are divided by the summation of the cloud density values d[cloud](r,t) and the term d0.

In some embodiments, the term d0 represents a controlling constant set according to vapor saturation density at low elevations, which translates to lower portions of a digital image. In particular embodiments, the term d0=(380.16/p0)*exp(17.67*T0_celsius/(T0_celsius+243.5)), where the term T0_celsius=27 degrees Centigrade, and the term p0=10,000 Pascals (e.g., to represent typical air temperature and pressure values at the Earth's surface). In this example expression, the various terms are related by operators such as an asterisk "*" to represent multiplication, a slash "/" to represent division, a plus "+" to represent addition, and "exp" to represent an exponential function.

As another example option for simulating the clouds shown in FIGS. 9A-9C, in some embodiments, the computing device 900 generates a blue-sky gradient background utilizing the following expressions: sky_blue_color(r)= (1−y)*bottom_blue+y*top_blue, where the term bottom_blue represents RGB color values of (67, 176, 246)/255, and the term top_blue represents RGB color values of (34, 69, 134)/255. The term y represents a spatial vertical coordinate that ranges from a value of zero at the bottom of the digital image 904 to a value of one at the top of the digital image 904. Operators defined above likewise relate variables in the expressions laid out in this paragraph. In addition, the minus operator ("−") indicates subtraction of terms.

In other embodiments, the computing device 900 utilizes additional or alternative approaches of rendering the clouds shown in FIGS. 9A-9C. For example, in some embodiments, the computing device 900 overlays clouds onto an original source image $I_0(r)$. In these embodiments, the computing device 900 generates pixel color values for clouds utilizing the following expression: cloud_on_sky_color(r,t)=cloud_color(r,t)+$I_0(r)$. In this example expression, pixel color values for clouds cloud_color (r,t) are added to the pixel color values of the original source image $I_0(r)$. As another example, other embodiments include the computing device 900 utilizing various alternate blend modes and/or depicting clouds on a black background (or mask image) instead of a blue gradient background.

Figure 10A:
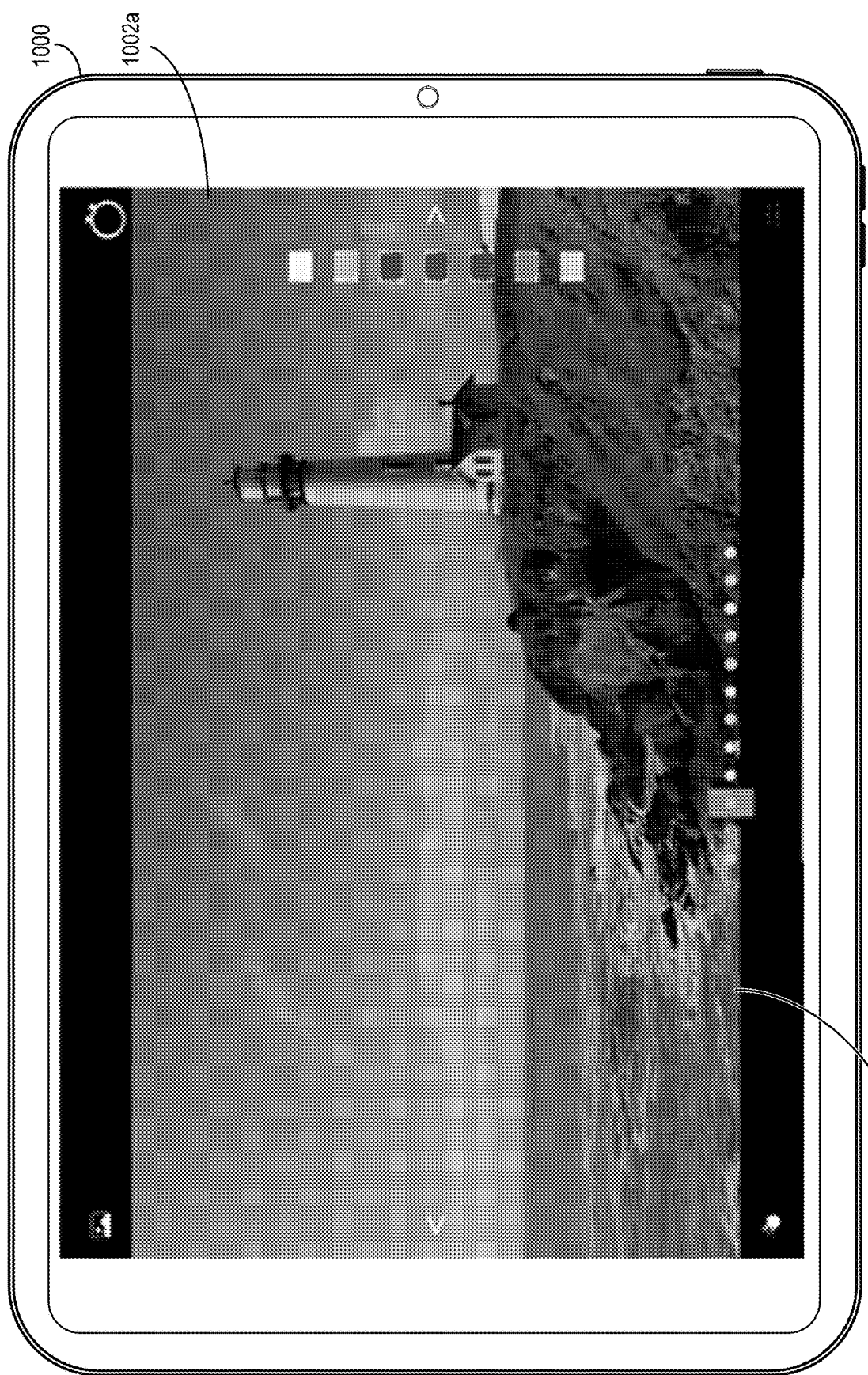
FIGS. 10A-10C illustrate a dynamic image-filter system providing user interfaces on a computing device depicting a dynamic simulation of image blooming in accordance with one or more embodiments.
Figure 10B:
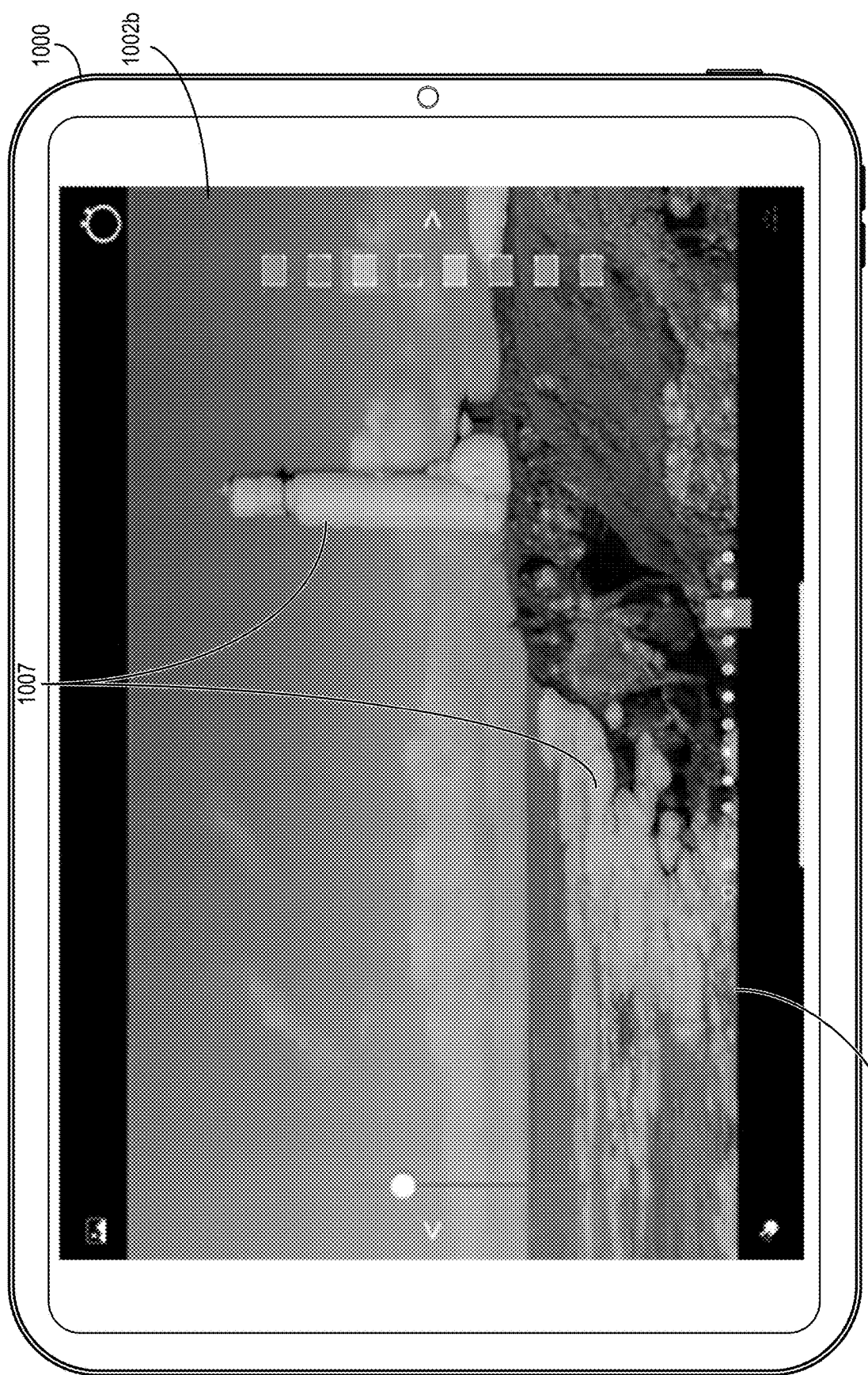
Figure 10C:
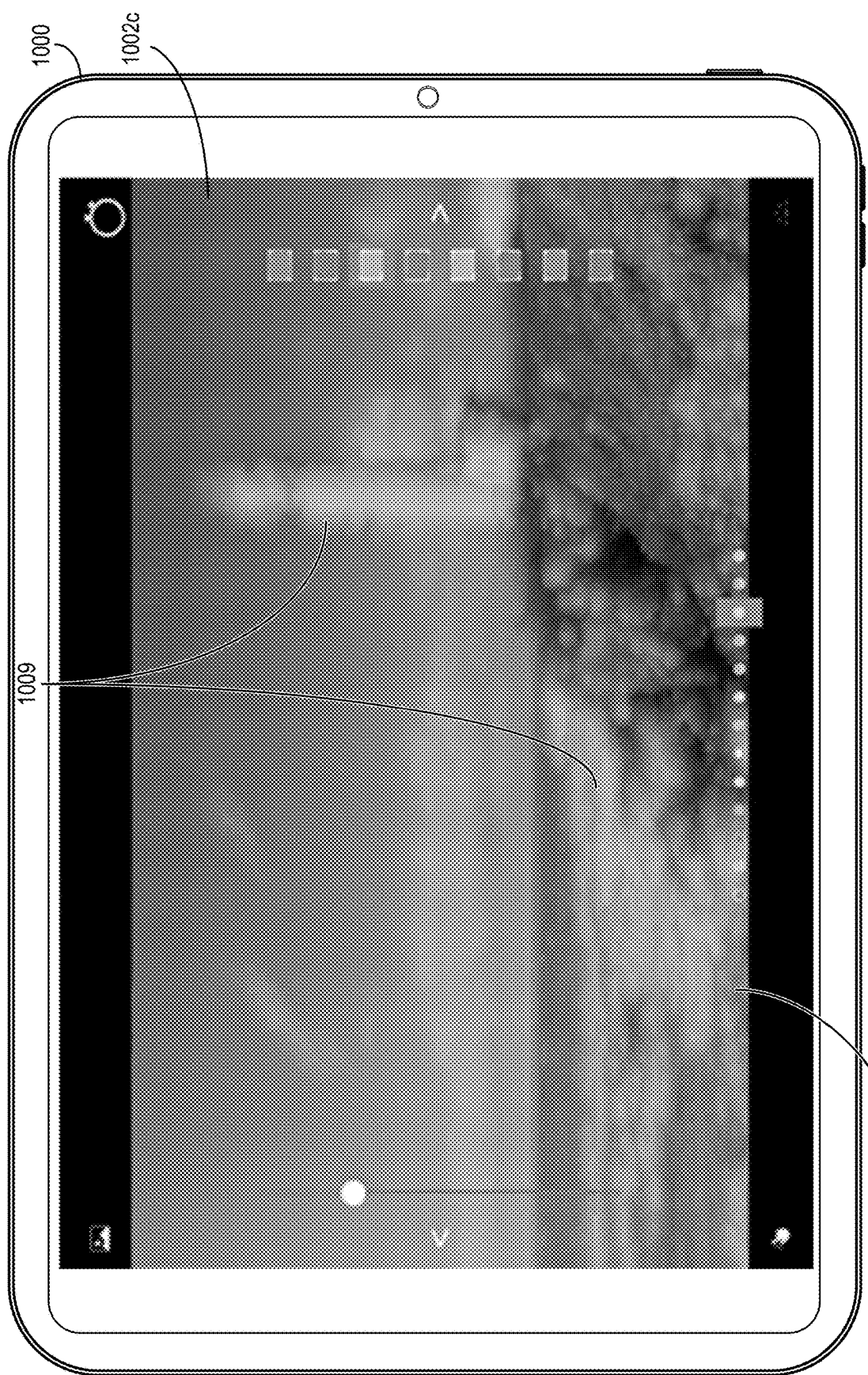

As mentioned previously, in one or more embodiments, the dynamic image-filter system 110 modifies an image over time to simulate image blooming. In these or other embodiments, a blooming image depicts various portions of a digital image bleeding into surrounding portions. FIGS. 10A-10C illustrate a specific example of lighter colors blooming or expanding over adjacent image regions and over darker colors. In particular, FIG. 10A illustrates the computing device 1000 comprising a graphical user interface 1002*a* that includes a digital image 1004 (e.g., an input image that is unmodified).

Based on detecting a user selection of a blooming dynamic image filter (and a dynamic variation for blooming only light colors), the computing device 1000 identifies a corresponding dynamic-simulation function. For example, the dynamic-simulation function for blooming images comprises a chemical density component as described above.

Utilizing the identified dynamic-simulation function, as illustrated in FIG. 10B, the computing device 1000 generates a graphical user interface 1002*b* comprising a first modified digital image 1006 in the image bloom simulation. For instance, FIG. 10B shows the computing device 1000 updating pixel color values according to a particular dynamic-simulation function to emphasize the advection of lighter colors over darker colors. Indeed, image portions 1007 depict an initial halation of lighter colors forming a bright fog comprising the lighter colors.

To generate the first modified digital image 1006 as just described, the computing device 1000 executes the dynamic-simulation function in manner that accounts for image characteristics. For example, the computing device 1000 utilizes a dynamic-simulation function in which the simulation values (e.g., a strength and/or direction of advection or diffusion) correspond to image tone (e.g., shadows, mid-tones, highlights) or image colors. Further, in some embodiments, the computing device 1000 utilizes a dynamic-simulation function that comprises non-linear components (e.g., blend modes, such as minimum and maximum functions for implementing blend modes to darken or lighten a digital image).

Continuing with the image bloom simulation, FIG. 10C illustrates the computing device 1000 generating a graphical user interface 1002*c* comprising a second modified digital image 1008 for a subsequent time step. As shown in FIG. 10C, the computing device 1000 progressively advects the brighter image colors according to the dynamic-simulation function. Indeed, image portions 1009 depict a further halation of lighter colors forming a brighter, more expansive fog compared to the image portions 1007 in FIG. 10B.

Although FIGS. 10B-10C illustrate advection of lighter colors, in other embodiments, the dynamic-simulation function emphasizes advection of darker colors (or certain image tones) instead of brighter colors. Further, in certain implementations, the computing device 1000 combines dynamic image filters (e.g., for simulating an image bloom and gravity) for increased artistic effects, such as an appearance of windswept halation. Although not shown, as described above, in one or more embodiments, the computing device 1000 detects additional user input to shift the direction of the image bloom or to bring back in one or more of the original pixels at a particular portion to generate a composite image of abstract and clear images. Composite images are described in further detail below in relation to FIGS. 15A-15B and 16A-16B.

Figure 11A:
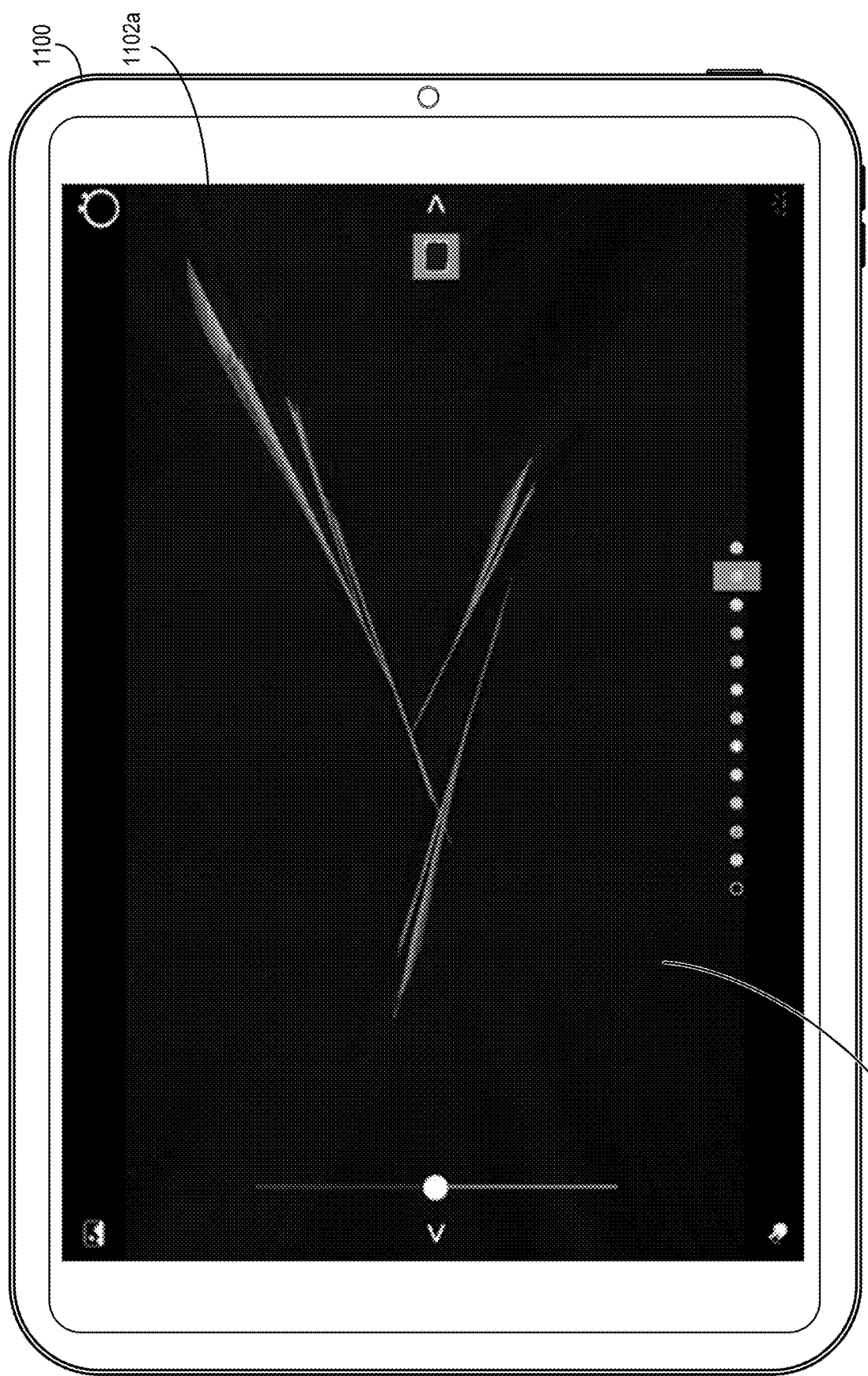

As mentioned above, in some embodiments, the dynamic image-filter system 110 modifies a digital image over time to simulate an iterated function system. In at least some embodiments, an iterated function system generates a curve or geometric figure such that each part of the curve/figure has the same or similar statistical character as a whole. Like a snowflake, the curve or figure generated by an iterated function system appears self-similar at different levels of successive magnification. FIGS. 11A-11B illustrate a particular example of an iterated function system that comprises a fractal flame. By simulating a fractal flame, the computing device 1100 can provide image feedback, such as fractal noise to mimic natural textures of marble, fire, fog, clouds, or water. In particular, FIG. 11A illustrates the computing device 1100 comprising a graphical user interface 1102a that includes a digital image 1104 depicting initial conditions according to a dynamic-simulation function for simulating a fractal flame.

Based on detecting a fractal flame dynamic image filter, the computing device 1100 identifies a corresponding dynamic-simulation function for generating the fractals in FIG. 11A via a fractal flame. For example, the computing device 1100 identifies a dynamic-simulation function as comprising a fractal flame algorithm as described by Scott Draves and Erik Reckase in *The Fractal Flame Algorithm*, September 2003, archived at flam3.com/flame_draves.pdf, the contents of which are expressly incorporated herein by reference. In other embodiments, the computing device 1100 utilizes another dynamic-simulation function to generate myriad other types of fractals having a variety of different curvature, line segments, etc. For instance, in other embodiments not shown, the computing device 1100 generates fractals corresponding to one or more classes of iterated function systems, strange attractors, L-systems, escape-time fractal systems, random fractal systems, finite subdivision rules, etc.

Subsequently, as suggested in FIG. 11B, the computing device 1100 again executes the dynamic-simulation function for simulating the fractal flame to update simulation values and corresponding pixel color values. Specifically, as indicated by FIG. 11B, the computing device 1100 generates a graphical user interface 1102b comprising a modified digital image 1106 for a subsequent time step. Indeed, as shown in FIG. 11B, the computing device 1100 progressively generates more and more fractals according to the fractal flame dynamic-simulation function.

Figure 12A:
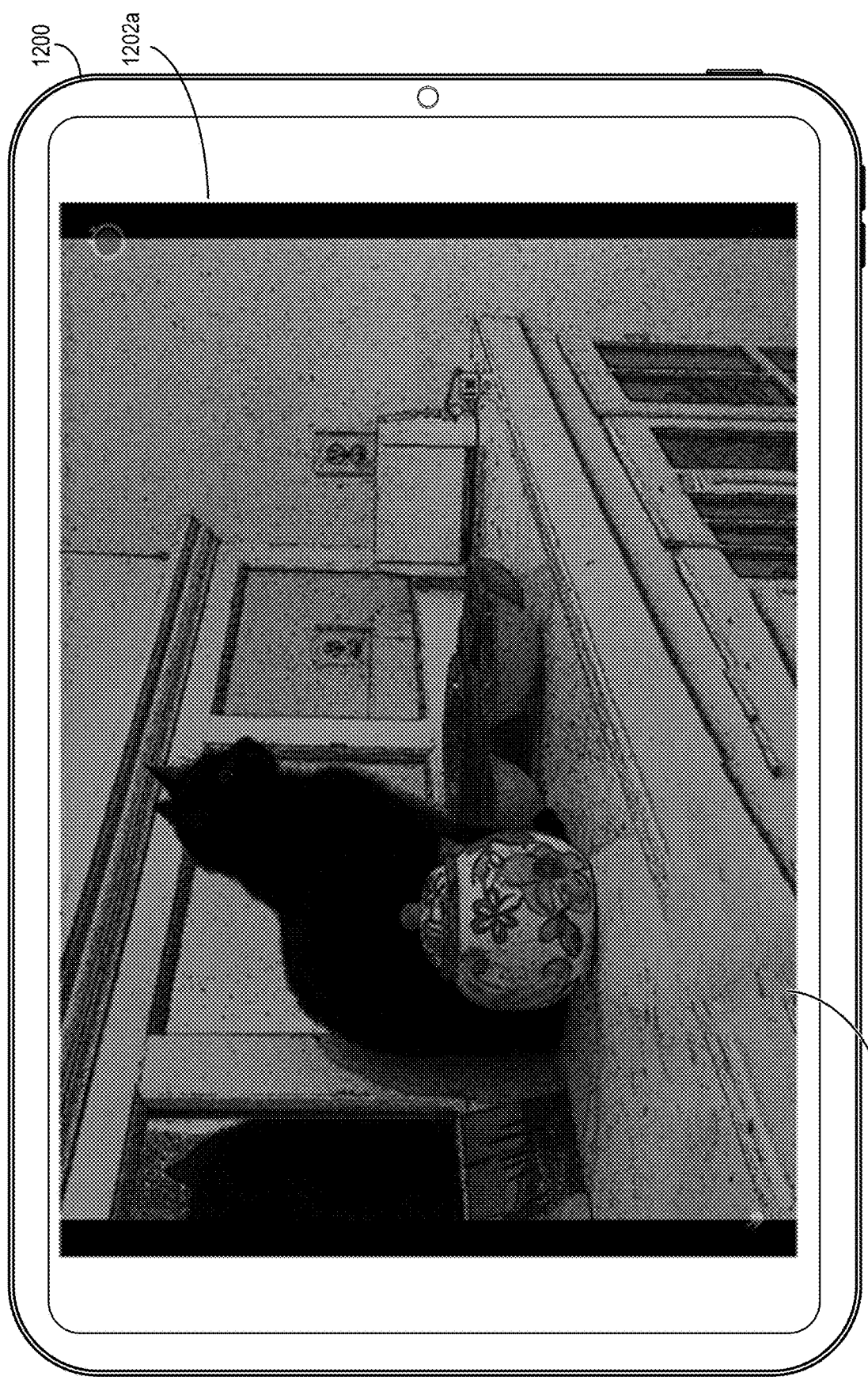
FIGS. 12A-12B illustrate a dynamic image-filter system providing user interfaces on a computing device depicting a dynamic simulation of cellular automata in accordance with one or more embodiments.
Figure 12B:
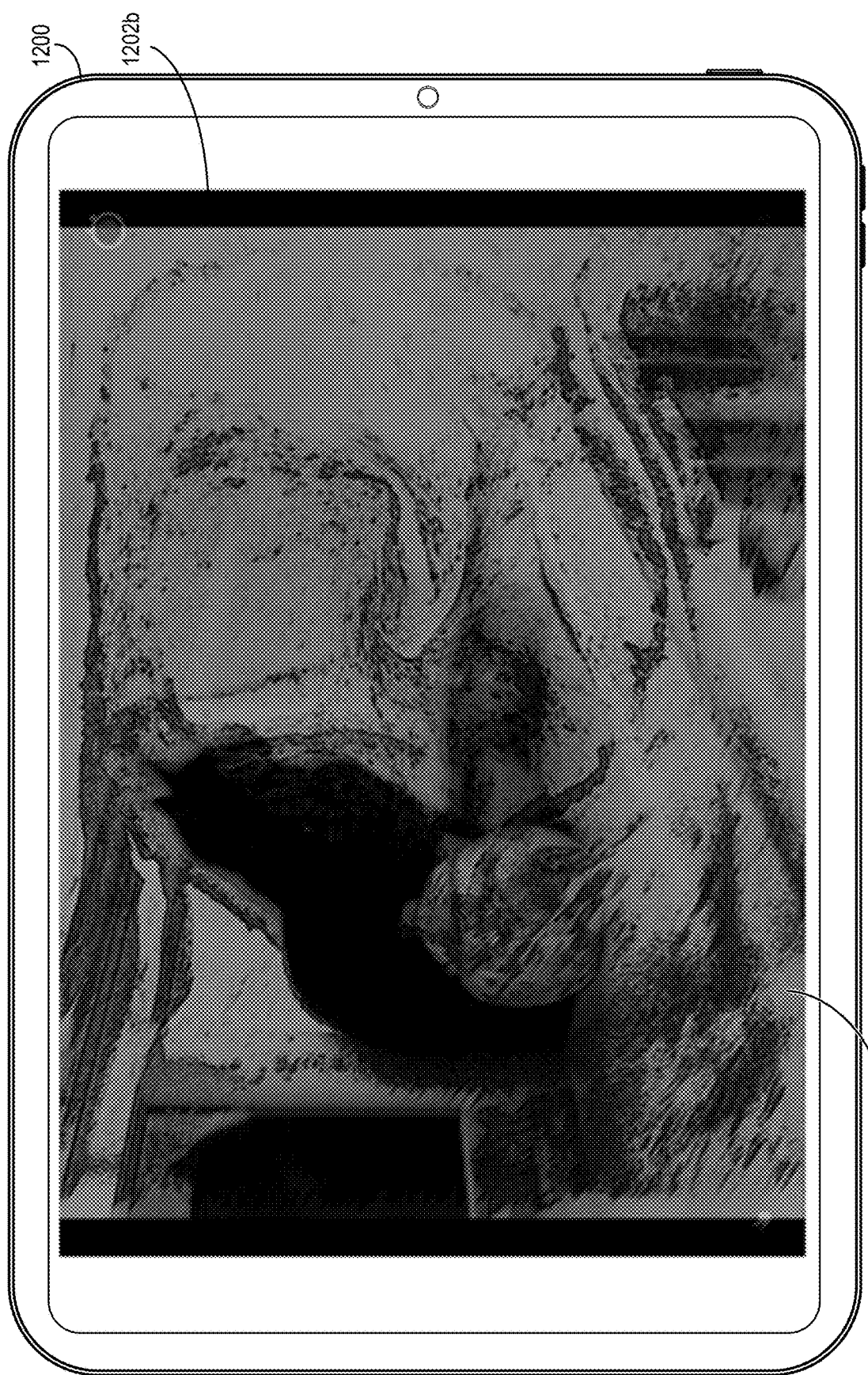

As discussed previously, in certain implementations, the dynamic image-filter system 110 modifies a digital image over time to simulate cellular automata. By simulating cellular automata, the dynamic image-filter system 110 can creatively add noise to a digital image (e.g., to give the appearance of being mosaic-like, rustic, distorted, hand drawn, or animated). FIGS. 12A-12B illustrate a particular example of simulating cellular automata to generate noise on a per-pixel basis. In particular, FIG. 12A illustrates the computing device 1200 comprising a graphical user interface 1202a that includes a digital image 1204 depicting initial conditions for cellular automata according to a dynamic-simulation function for cellular automaton simulations.

To illustrate, based on detecting a user selection of a cellular automata dynamic image filter, the computing device 1200 identifies a corresponding dynamic-simulation function for simulating cellular automata in FIG. 12A. Indeed, as shown in FIG. 12A, the digital image 1204 appears to include canvas-like striations in addition to grainy flecks or pixelated portions as if viewed through a cathode-ray-tube television. To generate these effects (or other automaton effects) in the digital image 1204, the computing device 1200 uses a dynamic-simulation function comprising one or more cellular automaton algorithms described or hyperlinked in Cellular Automata Laboratory, archived at fourmilab.ch/cellab/manual/rules.html, the contents of which are expressly incorporated herein by reference.

At a subsequent time step in FIG. 12B, the computing device 1200 iterates execution of the dynamic-simulation function for cellular automata to generate a graphical user interface 1202b comprising a modified digital image 1206. Moreover, as shown in FIG. 12B, the computing device 1200 updates one or more simulation values based on a user selection of one or more additional dynamic-simulation functions for simulating a fluid and/or based on a user input to swirl or stir a fluid (e.g., as described above). Based on the updated simulation values reflecting both simulated automata and a simulated fluid, the computing device 1200 correspondingly updates the pixel color values to render the modified digital image 1206. Specifically, the computing device 1200 updates the pixel color values in the modified digital image 1206 to depict the stirred fluid as having darker pixel colors to impart distortion against lighter pixel colors.

Figure 13A:
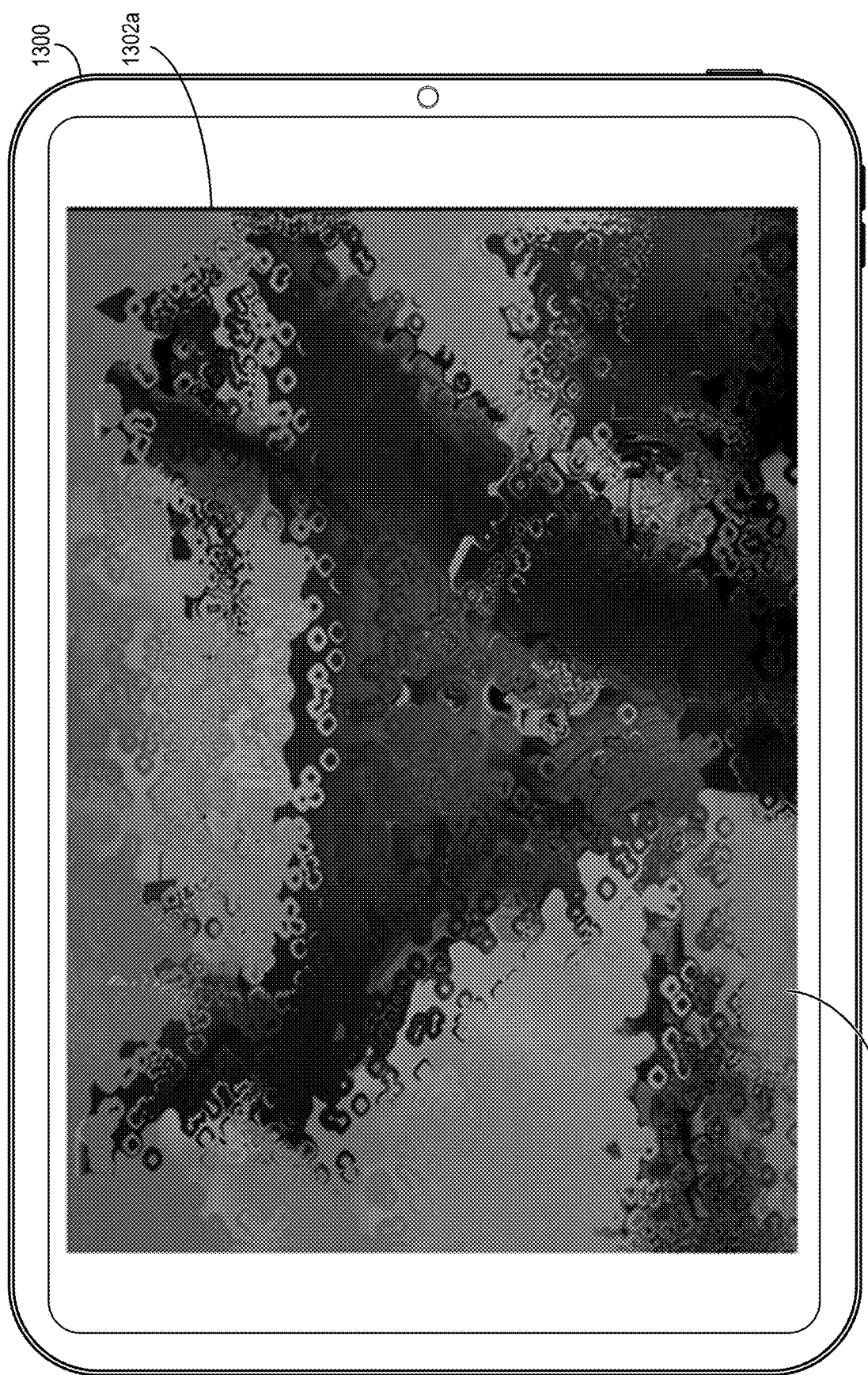

As provided in the foregoing description, in certain instances, the dynamic image-filter system 110 modifies a digital image over time to simulate image refraction. In some implementations, the dynamic image-filter system 110 incorporates the simulation of image refraction in combination with one or more other simulated effects. In these or other embodiments, the dynamic image-filter system 110 updates simulation values to modulate a digital image so as to produce the appearance of the refraction of light. FIGS. 13A-13B illustrate a specific example of image refraction where the digital images appears as if viewed through a watery surface. In particular, FIG. 13A illustrates the computing device 1300 comprising a graphical user interface 1302a that includes a digital image 1304 depicting initial conditions according to a dynamic-simulation function for reaction diffusion with refractive effects.

For instance, to generate the digital image 1304 comprising a perturbed watery surface with heavy rippling, the computing device 1300 uses one or more corresponding dynamic-simulation functions identified for image refraction in water applications. For example, in response to the computing device 1300 detecting a user input to select an image refraction dynamic image filter (and a water-based filter variation), the computing device 1300 identifies an image refraction function that includes part of the reaction diffusion function discussed above in relation to FIGS. 6A-6C.

Additionally or alternatively, in certain implementations, the computing device 1300 generates the digital image 1304 by using an image refraction function that dynamically represents a coordinate displacement field $dr(r,t)$ as part of or separate from a simulation flow field. For instance, to generate one or both of the coordinate displacement field or the simulation flow field, the computing device 1300 generates or determines chemical density values, temperature values, temperature gradient values, and/or fluid velocity values. In certain implementations, the computing device 1300 utilizes the following expression to represent the coordinate displacement field: dr(r,t)=heat_ refraction_ strength*Gradient T(r,t), where T represents the fluid temperature at location r and time t, and Gradient represents a two-dimensional derivative comprising two spatial components. For example, Gradient T(r,t)=(d/x T(r,t), d/dy T(r,t)). Additionally, the term heat_refraction_strength is a constant (e.g., 8 per degree Celsius for texel coordinates). In this example expression, the constant heat_refraction_strength is multiplied by the temperature gradient Gradient T(r,t).

In certain embodiments, the computing device 1300 generates the digital image 1304 by first executing an initial portion of the image refraction dynamic-simulation function (e.g., that models aspects of reaction diffusion) to generate a preliminary image result. Subsequently, in one or more embodiments, the computing device 1300 adds specific image refraction effects when generating a final image result for display. That is, in some circumstances, the computing device generates the digital image 1304 by modifying the preliminary image result and/or rendering.

To illustrate, in certain implementations, the computing device 1300 determines and renders updated pixel color values for the digital image 1304 as the final image result by sampling pixels of the preliminary image result at locations offset by the coordinate displacement field. In these or other embodiments, the computing device 1300 uses the following example expression: Refracted image color(r,t)=digital image(r+dr(r,t), t), where Refracted image color(r,t) corresponds to updated pixel color values for pixels of the preliminary image result (i.e., the digital image) at offset locations r+dr(r,t) at time t.

As suggested in FIG. 13B, the computing device 1300 again (e.g., iteratively) executes the dynamic-simulation function and image refraction algorithms for simulating reaction diffusion with image refraction. Indeed, FIG. 13B illustrates the computing device 1300 generating a graphical user interface 1302b comprising a modified digital image 1306 for a subsequent time step. As shown in FIG. 13B, the watery appearance in the modified digital image 1306 appears to have dissipated over time according to the dynamic-simulation function (e.g., by updating simulation values and pixel color values as described above).

In other embodiments (not shown), the computing device 1300 implements refractive effects without other simulations. In these or other embodiments, the computing device 1300 uses an input image (e.g., the source image) instead of a preliminary image result that incorporates other simulated effects.

As mentioned above, in one or more embodiments, the dynamic image-filter system 110 enlivens parameterized-static filters to modify a digital image over time. By using dynamic versions of parameterized-static-filters, the dynamic image-filter system 110 effectively combines a dynamic image filter and a parameterized-static-filter. In this manner, users can transform filters from conventional systems into dynamic image filters that change with time.

Figure 14B:
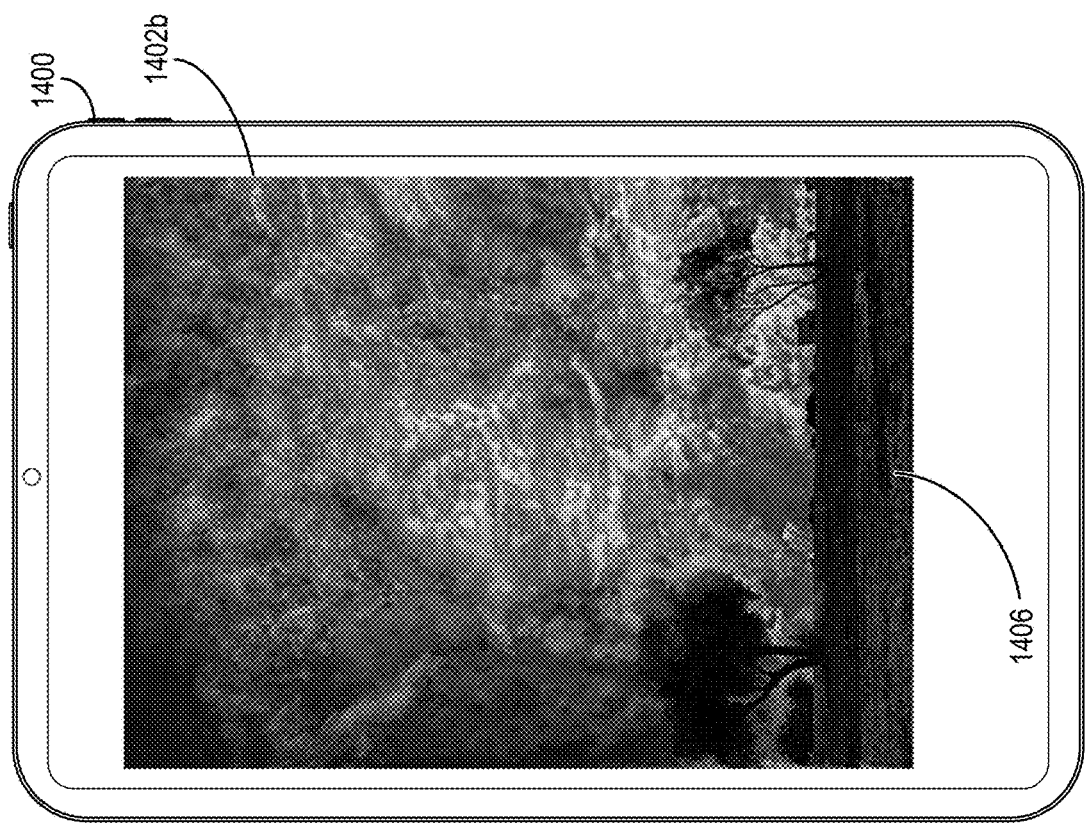
FIGS. 14A-14B illustrate a dynamic image-filter system providing user interfaces on a computing device depicting a dynamic simulation using a parameterized-static-filter in accordance with one or more embodiments.
Figure 14A:
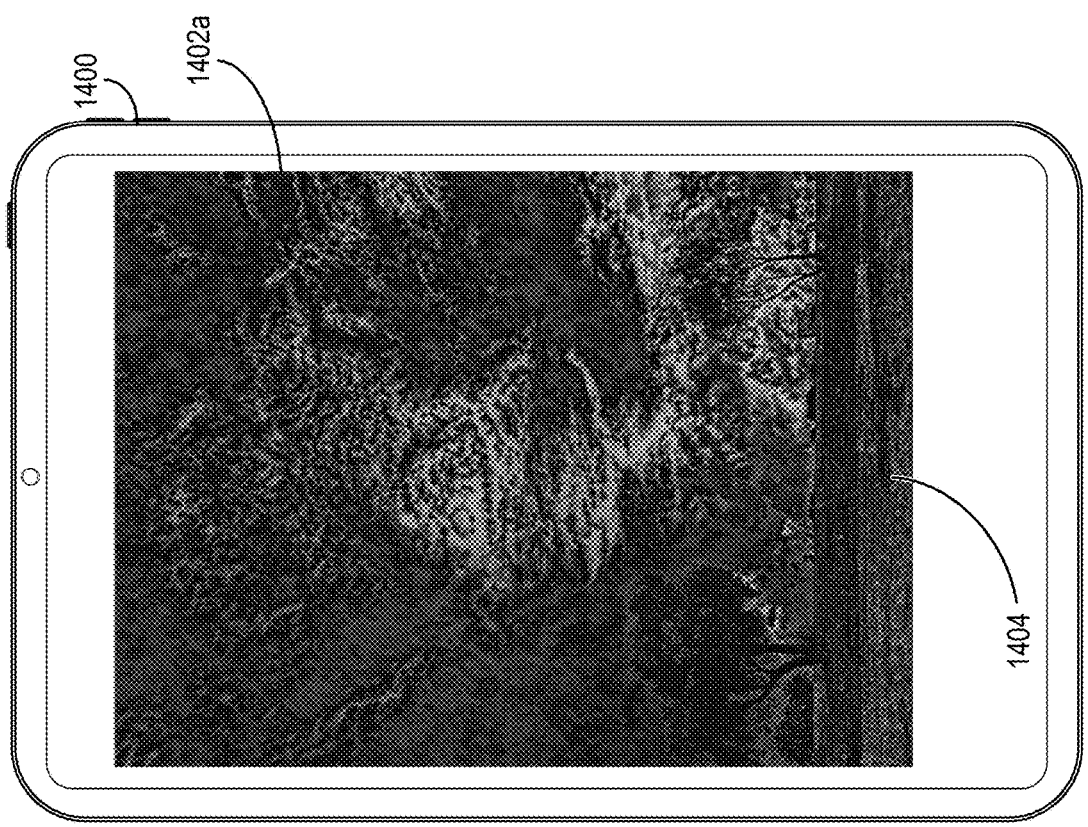

FIGS. 14A-14B illustrate an example of dynamically transforming a neural style transfer filter to simulate atmospheric cloud generation. In particular, FIG. 14A illustrates the computing device 1400 comprising a graphical user interface 1402a that includes a digital image 1404 comprising application of the neural style transfer filter. For example, based on detecting a selection of a parameterized-static filter (e.g., the neural style transfer filter), the computing device 1400 applies the parameterized-static-filter to uniformly apply a styling across the digital image 1404. The digital image 1404 is therefore a static image result (e.g., a static version of the original input image) that does not change with time.

Subsequently, based on detecting a user selection of a dynamic image filter, in certain implementations, the computing device 1400 identifies one or more dynamic-simulation functions (e.g., as described above). The dynamic image filter corresponds to simulating a dynamical system. As suggested in FIG. 14B, the selected dynamic image filter corresponds to particular dynamical system for simulating atmospheric clouds.

Indeed, as shown in FIG. 14B, the computing device 1400 renders a modified digital image 1406 in a graphical user interface 1402b. As depicted, the modified digital image 1406 comprises a combination of a neural style transfer filter and dynamically simulated clouds. In particular, the modified digital image 1406 comprises increased cloud generation and non-uniform styling compared to the uniform styling in the digital image 1404 (which results in poor image quality). For example, the modified digital image 1406 largely excludes the neural style transfer filter application on the trees and ground portion. Thus, by enabling local modulations of the neural style transfer filter (e.g., a vintage style, an abstract style, an oil painting style), the computing device 1400 can produce a more visually pleasing (and artistically original) result in the modified digital image 1406.

Although the computing device 1400 generates the modified digital image 1406 by transforming a particular application of a parameterized-static-filter, the computing device 1400 can likewise transform any number of parameterized-static-filters including Photoshop's Gaussian blur, blur gallery, liquify, pixelate, distort, noise, render, stylized filters, neural filters (e.g., neural filter galleries or neural style filters), lens correction, oil paint, high pass, find edges, sharpen, vanishing point, motion blur, etc.

To render the modified digital image 1406, in some instances, the computing device 1400 processes the digital image 1404. For example, the computing device 1400 generates simulation values based on the dynamic-simulation function for cloud generation in addition to the parameters of the parameterized-static-filter. Additionally, as described above, the computing device 1400 uses the simulation values to update the pixel color values of the digital image 1404 in FIG. 14A. Based on the updated pixel color values, the computing device 1400 renders the modified digital image 1406.

In these or other embodiments, the computing device 1400 weights values for the dynamic-simulation function and/or the parameterized-static-filter. To illustrate, the computing device 1400 adjusts the weights in a style transfer neural network (directly or indirectly) by changing the blending fraction between inputs into the style transfer neural network. In certain implementations, the computing device 1400 directly sets the value of a blending fraction for blending inputs (e.g., style vectors for digital images) into the style transfer neural network.

Moreover, in one or more embodiments, the computing device 1400 iterates the foregoing approach to further modulate the digital image 1404 in subsequent time steps. In this manner, the computing device 1400 can enliven parameterized-static-filters by employing the dynamics of simulation flow fields for dynamic image filters.

In alternative embodiments, one or more of the dynamic image filters comprise a dynamic version of a parameterized-static-filter (e.g., a parameterized-static-filter that the computing device 1400 previously transformed into a dynamic image filter). For example, rather than separately executing a parametrized-static-filter and then a dynamic image filter, a user may make a single selection of a dynamic image filter that is based on a combination of a parameterized-static-filter and one or more dynamic simulations.

As discussed previously, in certain implementations, the dynamic image-filter system 110 performs dynamic simulations to modify a mask image (or mask) over time. By modifying a mask that overlays a digital image, the dynamic image-filter system 110 can perform one or more of the dynamic simulations discussed above while leaving the underlying digital image unedited in its original form.

Figure 15A:
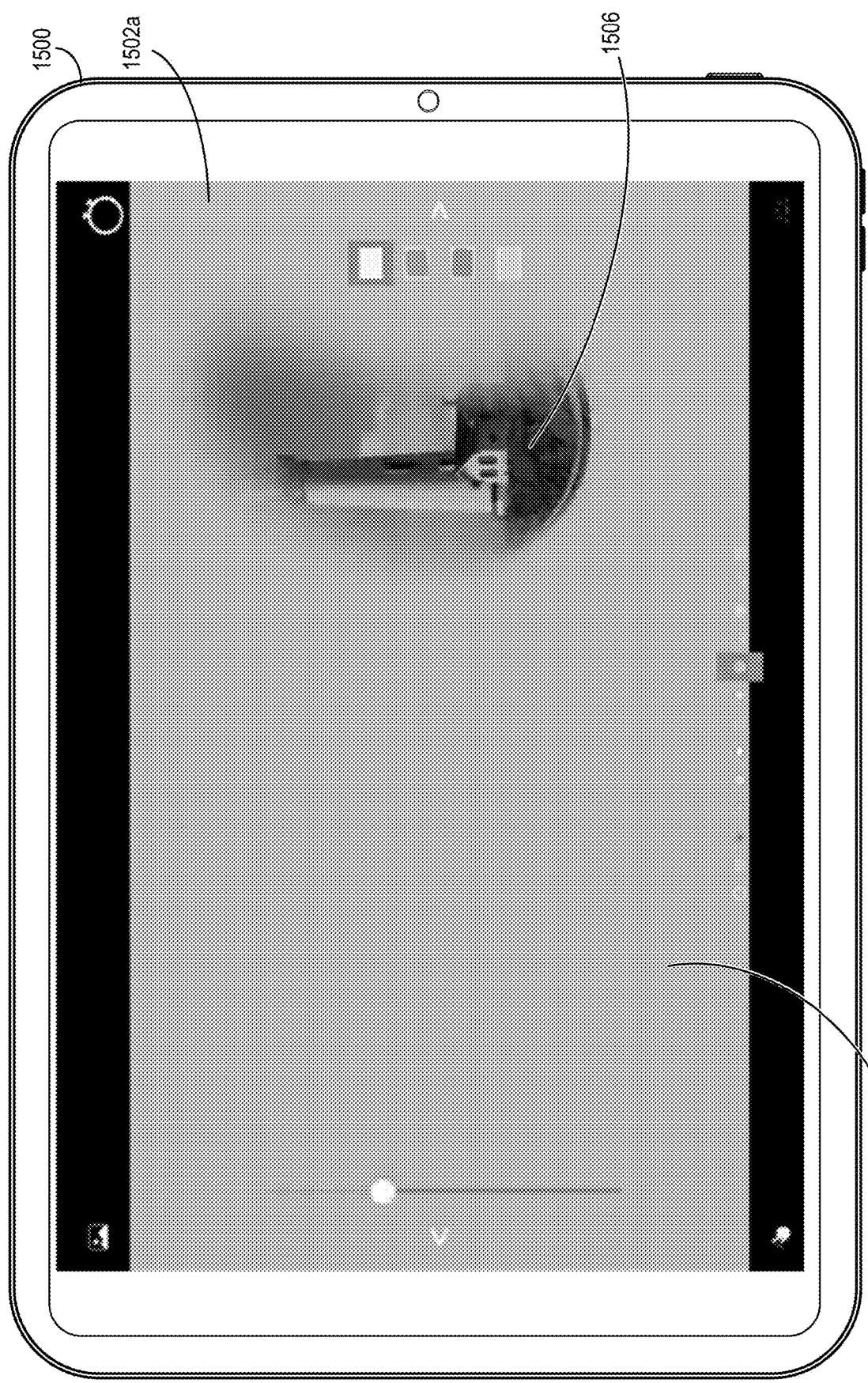
FIGS. 15A-15B illustrate a dynamic image-filter system providing user interfaces on a computing device depicting a dynamic simulation to modify a mask in accordance with one or more embodiments.
Figure 15B:
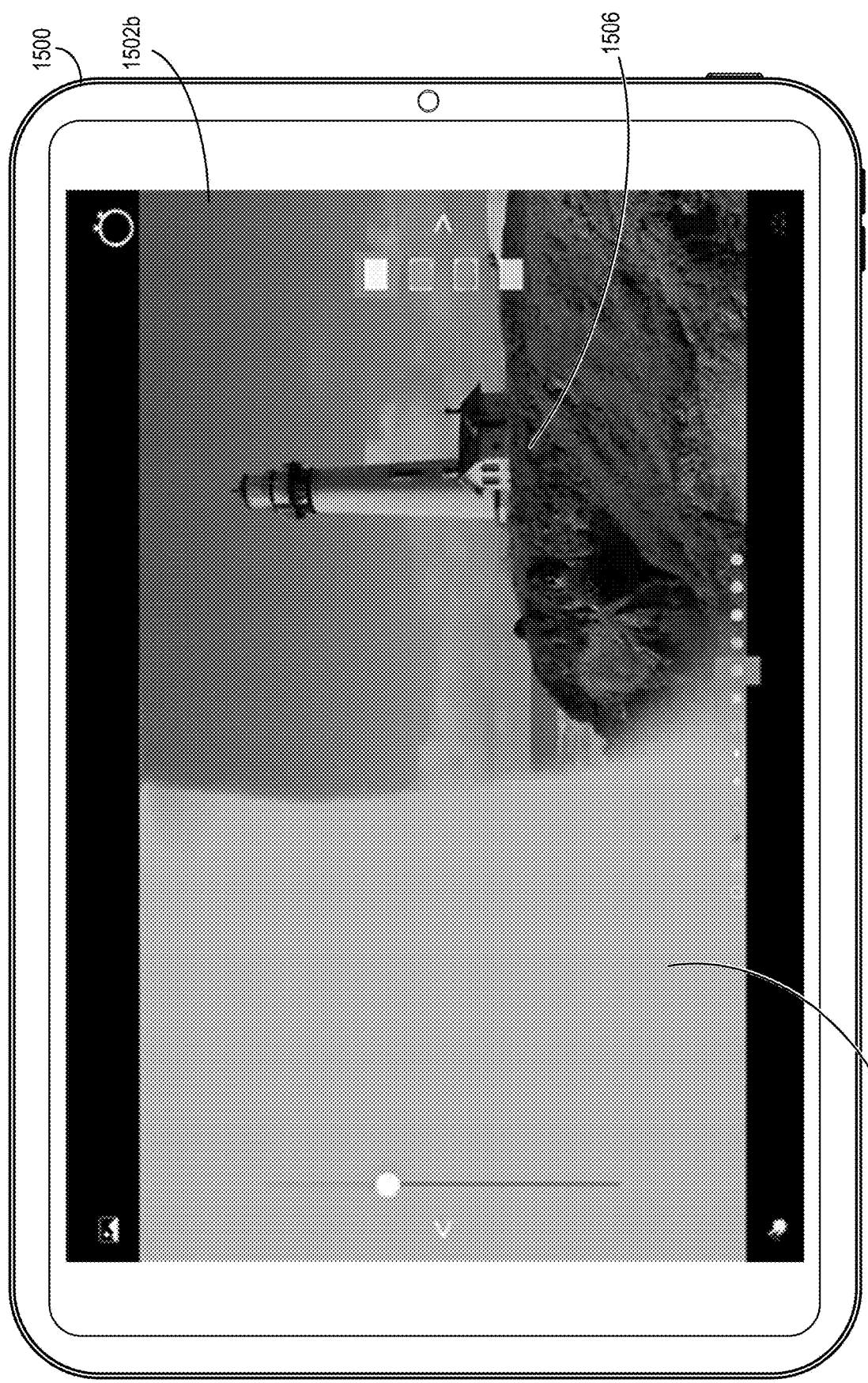

FIGS. 15A-15B illustrate such an example by simulating an opaque (grey) fluid or chemical. In particular, FIG. 15A illustrates the computing device 1500 comprising a graphical user interface 1502a that includes a mask 1504 overlaying a digital image 1506. In addition, FIG. 15A illustrates the computing device 1500 having activated a dynamic image filter for simulating the opaque (grey) fluid or chemical within the mask 1504. Thus, in response to detecting a user input to erase or remove portions of the mask 1504, FIG. 15A shows the computing device 1500 removing a first portion of the mask 1504 to reveal a portion of the digital image 1506 under the mask 1504.

In a graphical user interface 1502b of FIG. 15B, the computing device 1500 generates a modified mask 1508 for display in response to detecting additional user input to selectively reveal additional portions of the digital image 1506. In these or other embodiments, as the computing device 1500 selectively reveals portions of the digital image 1506, the computing device 1500 simultaneously hides one or more corresponding portions of the mask 1504.

As an example of selectively revealing portions of the digital image 1506, the computing device 1500 selectively hides portions of the mask 1504 by removing or deleting portions of the mask 1504 to generate the modified mask 1508. In other embodiments, the computing device 1500 selectively hides portions of the mask 1504 by obfuscating portions of the mask 1504 to generate the modified mask 1508. For instance, the computing device 1500 updates simulation values and correspondingly updates a transparency/opacity of pixel color values for the modified mask 1508.

Similar to FIGS. 15A-15B, FIGS. 16A-16B illustrate an example of the dynamic image-filter system 110 performing a dynamic simulation within a mask image over time to generate a composite image. In a composite image, two or more digital images are combined in some manner (e.g., two adjacent images that transition into each other).

Figure 16A:
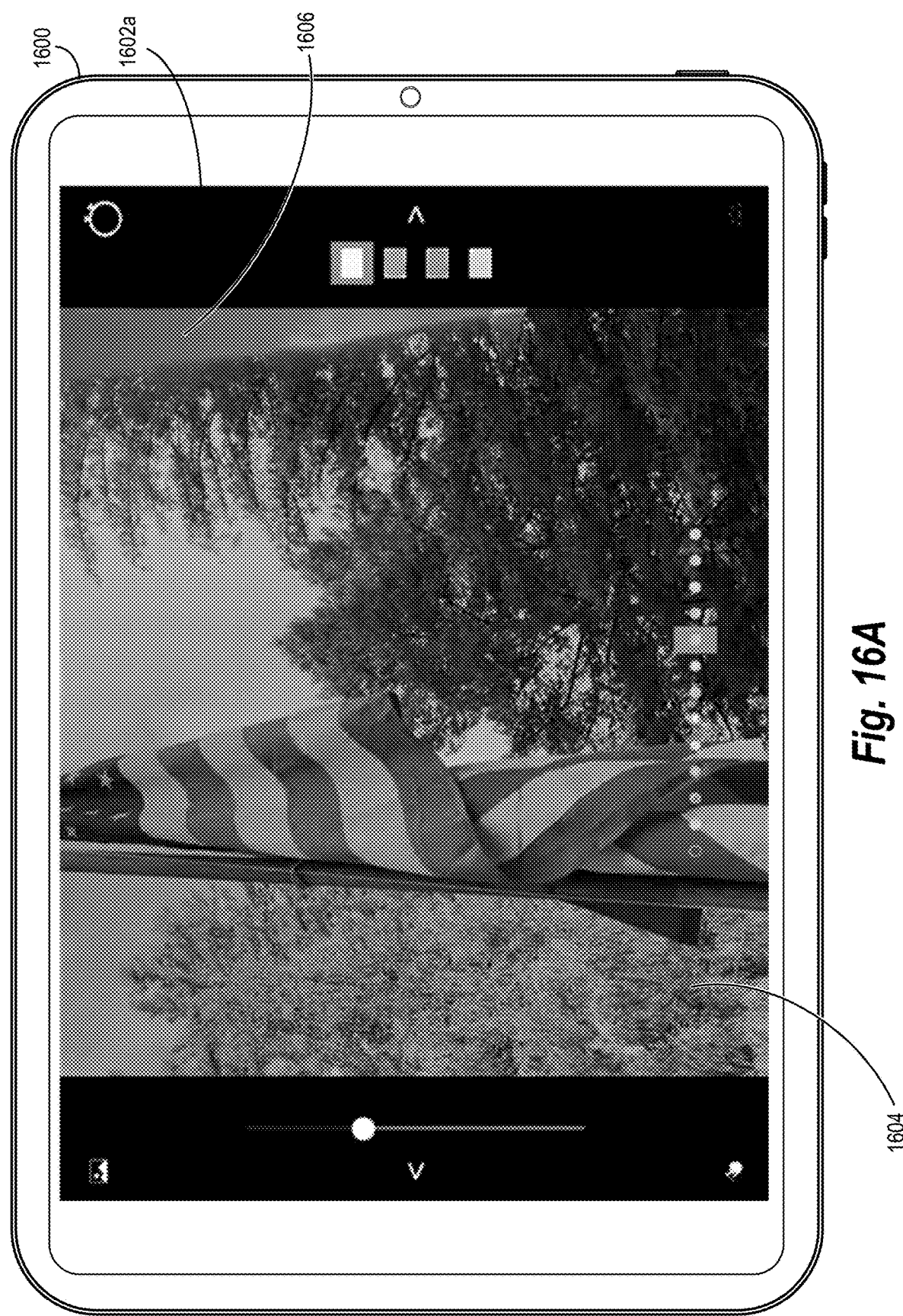
FIGS. 16A-16B illustrate a dynamic image-filter system providing user interfaces on a computing device depicting a dynamic simulation to generate a composite image in accordance with one or more embodiments.

In particular, FIG. 16A illustrates the computing device 1600 comprising a graphical user interface 1602a that includes a mask image 1604 overlaying a digital image 1606. In addition, FIG. 16A illustrates the computing device 1600 having activated a dynamic image filter for simulating a fluid or chemical within the mask image 1604. Thus, in response to detecting a user input to erase or hide portions of the mask image 1604, FIG. 16A shows the computing device 1600 hiding a first portion of the mask image 1604 to reveal a portion of the digital image 1606 under the mask image 1604.

Figure 16B:

In a graphical user interface 1602b of FIG. 16B, the computing device 1600 generates a modified mask image 1608 for display in response to detecting additional user input to selectively reveal additional portions of the digital image 1606. In these or other embodiments, as the computing device 1600 selectively reveals portions of the digital image 1606, the computing device 1600 simultaneously hides one or more corresponding portions of the mask image 1604.

For example, as described above, the computing device 1600 optionally removes or deletes portions of the mask image 1604 to generate the modified mask image 1608. In other implementations, the computing device 1600 obfuscates portions of the mask image 1604 to generate the modified mask image 1608 (e.g., by updating simulation values and correspondingly updating a transparency/opacity of pixel color values for the modified mask image 1608).

Figure 17B:
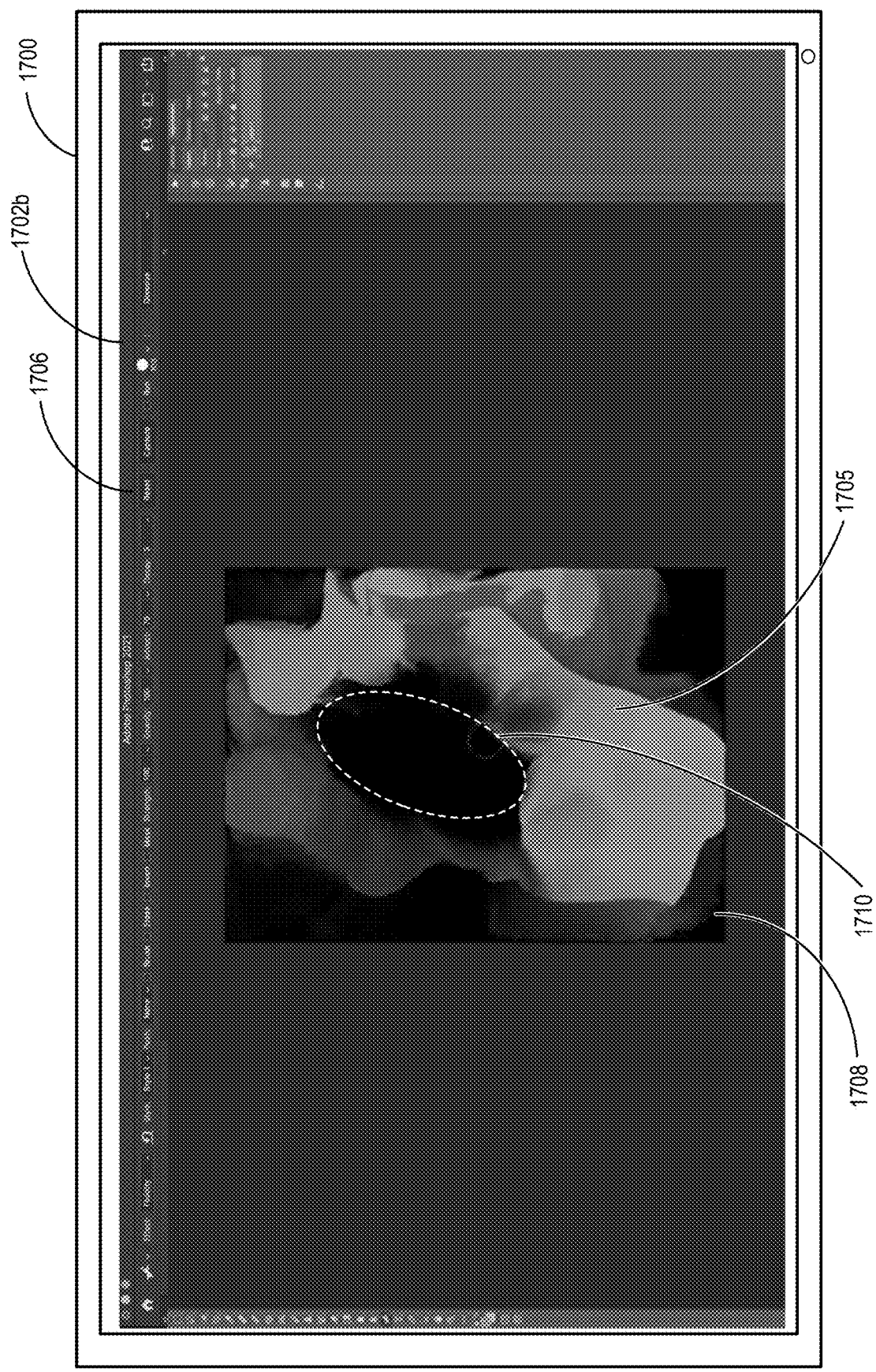

As mentioned above, in certain instances, the dynamic image-filter system 110 limits dynamic stimulations to user-designated portions of a digital image based on additional user input. To illustrate, the dynamic image-filter system 110 freezes or locks simulation values at spatial locations outside or inside of a user-designated area (e.g., a resist-area over a human face to prevent modification of facial features portrayed in the digital image). FIGS. 17A-17B illustrate an example of generating a resist area that appears to rebuff encroachment of a simulated fluid or chemical in a circular region.

In particular, FIG. 17A illustrates the computing device 1700 generating a graphical user interface 1702a comprising a digital image 1704 and a toolbar 1706 (described further below). In addition, FIG. 17A illustrates the computing device 1700 having activated a dynamic image filter for simulating a grey fluid or chemical 1705 over a black background.

As further illustrated in FIG. 17A, the toolbar 1706 provides various user interface elements or tools to perform various operations described in the present disclosure. In certain implementations, the toolbar 1706 comprises the same or similar features (albeit in different format) as shown and described in relation to FIG. 5A. To illustrate, in some embodiments, the computing device 1700 generates the resist area 1710 by selecting a certain "style" in the toolbar 1706 and applying user inputs with the selected style activated. Similarly, in some embodiments, the computing device 1700 can draw around an image region and adjust various parameters such as "advection" (e.g., to slow down the movement) or "decay" (e.g., to dampen the simulated affect).

In FIG. 17B, the computing device 1700 generates a graphical user interface 1702b comprising a modified digital image 1708 with a resist area 1710. For example, in response to detecting additional user input (e.g., finger swipe via a brush tool) to apply the resist area 1710, FIG. 17B shows the computing device 1700 resisting the grey fluid/chemical 1705 in a corresponding circular area.

To generate the resist area 1710, in some embodiments, the computing device 1700 modifies simulation values at spatial locations in and/or around the resist area 1710. To illustrate, the computing device 1700 reduces velocity values and/or chemical density values at spatial locations corresponding to the resist area 1710. In so doing, the computing device 1700 reduces (and in some portions, zeros out) the simulated effects of the grey fluid/chemical 1705. Alternatively, in some embodiments, the computing device 1700 stops executing the dynamic-simulation function inside the resist area 1710.

In other embodiments, the computing device 1700 inverts the resist area 1710 such that only portions within the resist area 1710 undergo the simulated effect. In this example, portions corresponding to the additional user input (e.g., brush strokes) are activated, but not other image regions.

In the alternative to the embodiments just described for FIGS. 17A and 17B, in some embodiments, the computing device 1700 does not generate the resist area 1710. Instead, the computing device 1700 utilizes various tools from the toolbar 1706 in conjunction with simulated affects to visually show where a user makes local corrections. For instance, the computing device 1700 generates a visual aid of a decaying/disappearing path of green dye (a simulated fluid/chemical) that trails cursor interactions or gesture swipes within the graphical user interface 1702*b*. In these or other embodiments, such a visual aid is a dynamic graphical user interface component that is not used to modify a digital image, but rather as a way to visually track how a user is interacting with the digital image.

Figure 18:
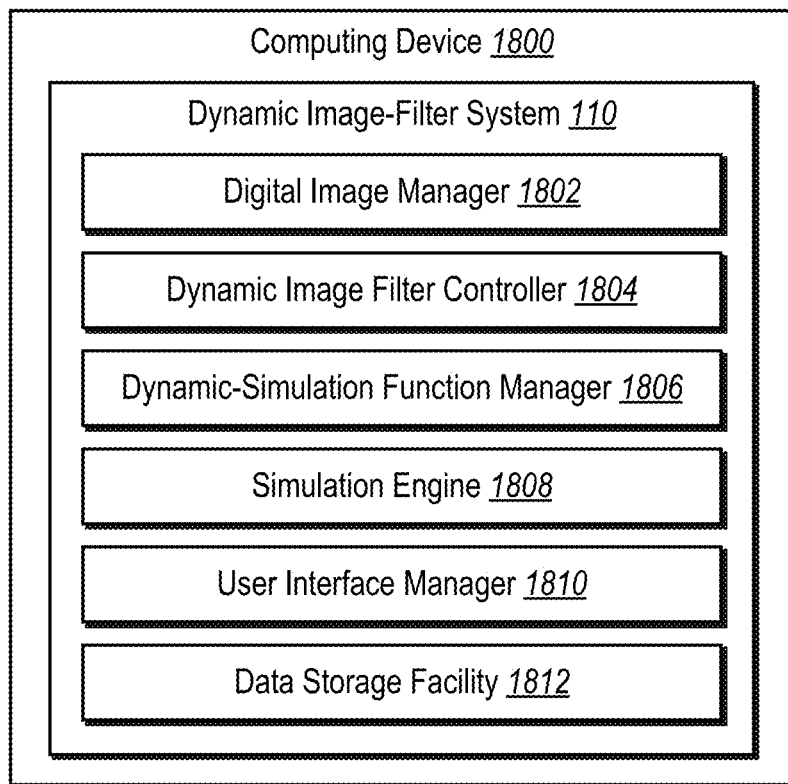
FIG. 18 illustrates an example schematic diagram of a dynamic image-filter system in accordance with one or more embodiments.

Turning to FIG. 18, additional detail will now be provided regarding various components and capabilities of the dynamic image-filter system 110. In particular, FIG. 18 illustrates an example schematic diagram of a computing device 1800 (e.g., the server(s) 102, the client device 106, and/or the computing devices 500-1700) implementing the dynamic image-filter system 110 in accordance with one or more embodiments of the present disclosure. As shown, the dynamic image-filter system 110 in one or more embodiments includes a digital image manager 1802, dynamic image filter controller 1804, a dynamic-simulation function manager 1806, a simulation engine 1808, a user interface manager 1810, and a data storage facility 1812.

The digital image manager 1802 receives, accesses, stores, transmits, modifies, generates, and/or renders digital images (as described in relation to the foregoing figures). In particular embodiments, the digital image manager 1802 accesses an image from the data storage facility 1812 or a data store. Additionally or alternatively, the digital image manager 1802 transmits a digital image to the user interface manager 1810 for presenting within a user interface.

The dynamic image filter controller 1804 stores, generates, presents, and/or transmits computer-executable instructions corresponding to one or more dynamic image filters (as described in relation to the foregoing figures). In particular embodiments, the dynamic image filter controller 1804 detects a user input to select a dynamic image filter for simulating, within a digital image, a dynamical system. Additionally, in certain implementations, the dynamic image filter controller 1804 communicates a user selection of dynamic image filter to the dynamic-simulation function manager 1806.

The dynamic-simulation function manager 1806 identifies one or more dynamic-simulation functions corresponding to a dynamic image filter (as described in relation to the foregoing figures). In particular embodiments, the dynamic-simulation function manager 1806 determines simulation values for a particular dynamical system based on the dynamic-simulation function. For example, the dynamic-simulation function manager 1806 generates a simulation flow field comprising at least one of the density values, the velocity values, or the temperature values for a particular dynamical system corresponding to a physical effect or property of a physical matter at spatial locations associated with the digital image.

The simulation engine 1808 modifies a digital image over time to simulate the dynamical system (as described in relation to the foregoing figures). In particular embodiments, the simulation engine 1808 updates simulation values for correspondingly updating pixel color values for one or more pixels of a digital image. For example, in some embodiments, the simulation engine 1808 executes a dynamic-simulation function at each spatial location to spatially translate or advect simulation values across a simulation flow field (e.g., to neighboring spatial locations). Based on the spatially translated simulation values, the simulation engine 1808 in certain implementations generates corresponding pixel color values.

The user interface manager 1810 in one or more embodiments provides, manages, and/or controls a graphical user interface (or simply "user interface"). In particular embodiments, the user interface manager 1810 generates and displays a user interface by way of a display screen composed of a plurality of graphical components, objects, and/or elements that allow a user to perform a function. For example, the user interface manager 1810 receives user inputs from a user, such as a click/tap to select a dynamic image filter or provide an image filter or an image modification that alters a simulation. Additionally, the user interface manager 1810 in one or more embodiments presents a variety of types of information, including text, digital images, simulated graphical content, or other information for presentation in a user interface (e.g., in series to present a dynamic simulation within a digital image over time).

The data storage facility 1812 maintains data for the dynamic image-filter system 110. The data storage facility 1812 (e.g., via one or more memory devices) maintains data of any type, size, or kind, as necessary to perform the functions of the dynamic image-filter system 110. In particular embodiments, the data storage facility 1812 coordinates storage mechanisms for other components of the computing device 1800 (e.g., for storing dynamic image filters, dynamic-simulation functions, and/or digital images).

Each of the components of the computing device 1800 can include software, hardware, or both. For example, the components of the computing device 1800 can include one or more instructions stored on a computer-readable storage medium and executable by processors of one or more computing devices, such as a client device or server device. When executed by the one or more processors, the computer-executable instructions of the dynamic image-filter system 110 can cause the computing device(s) (e.g., the computing device 1800) to perform the methods described herein. Alternatively, the components of the computing device 1800 can include hardware, such as a special-purpose processing device to perform a certain function or group of functions. Alternatively, the components of the computing device 1800 can include a combination of computer-executable instructions and hardware.

Furthermore, the components of the computing device 1800 may, for example, be implemented as one or more operating systems, as one or more stand-alone applications, as one or more modules of an application, as one or more plug-ins, as one or more library functions or functions that may be called by other applications, and/or as a cloud-computing model. Thus, the components of the computing device 1800 may be implemented as a stand-alone application, such as a desktop or mobile application. Furthermore, the components of the computing device 1800 may be implemented as one or more web-based applications hosted on a remote server.

The components of the computing device 1800 may also be implemented in a suite of mobile device applications or "apps." To illustrate, the components of the computing device 1800 may be implemented in an application, including but not limited to ILLUSTRATOR®, ADOBE FRESCO®, PHOTOSHOP®, LIGHTROOM®, ADOBE®

XD, or AFTER EFFECTS®. Product names, including "ADOBE" and any other portion of one or more of the foregoing product names, may include registered trademarks or trademarks of Adobe Inc. in the United States and/or other countries.

Figure 19:
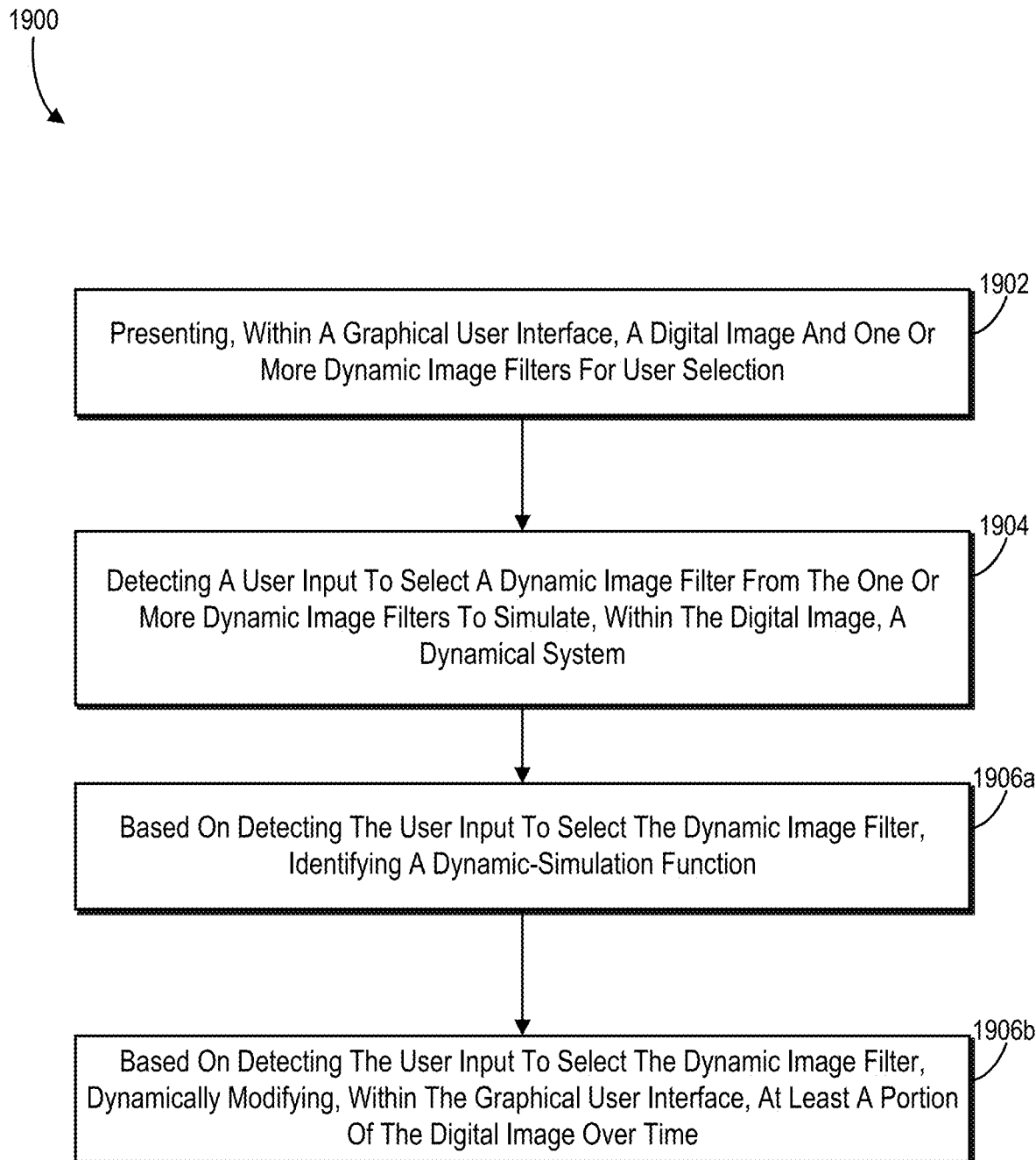
FIG. 19 illustrates a flowchart of a series of acts for dynamically modifying at least a portion of a digital image over time in accordance with one or more embodiments.

FIGS. 1-18, the corresponding text, and the examples provide several different systems, methods, techniques, components, and/or devices of the dynamic image-filter system 110 in accordance with one or more embodiments. In addition to the above description, one or more embodiments can also be described in terms of flowcharts including acts for accomplishing a particular result. For example, FIG. 19 illustrates a flowchart of a series of acts 1900 for dynamically modifying at least a portion of a digital image over time in accordance with one or more embodiments. The dynamic image-filter system 110 may perform one or more acts of the series of acts 1900 in addition to or alternatively to one or more acts described in conjunction with other figures. While FIG. 19 illustrates acts according to one embodiment, alternative embodiments may omit, add to, reorder, and/or modify any of the acts shown in FIG. 19. The acts of FIG. 19 can be performed as part of a method. Alternatively, a non-transitory computer-readable medium can comprise instructions that, when executed by one or more processors, cause a computing device to perform the acts of FIG. 19. In some embodiments, a system can perform the acts of FIG. 19.

As shown, the series of acts 1900 includes an act 1902 of presenting, within a graphical user interface, a digital image and one or more dynamic image filters for user selection. For instance, in some cases, the one or more dynamic image filters for user selection comprise dynamic image filters for simulating one or more of a physical effect or property of a physical matter or an effect or a property of an iterated function system.

In addition, the series of acts 1900 comprises an act 1904 of detecting a user input to select a dynamic image filter from the one or more dynamic image filters to simulate, within the digital image, a dynamical system. In some embodiments, simulating the dynamical system comprises simulating a particular dynamical system corresponding to a physical effect or property of a physical matter or an effect or property of an iterated function system. For example, simulating the particular dynamical system corresponding to the physical effect or property of the physical matter comprises simulating at least one of gravity, a fluid, smoke, fire, rain, a light ray, light refraction, an atmospheric cloud, interacting chemicals, reaction diffusion, cellular automata, or an image bloom.

Further, the series of acts 1900 includes an act 1906a of based on detecting the user input to select the dynamic image filter, identifying a dynamic-simulation function. In particular embodiments, the act 1906a includes identifying a dynamic-simulation function corresponding to the dynamical system.

In addition, the series of acts 1900 further includes an act 1906b of based on detecting the user input to select the dynamic image filter, dynamically modifying, within the graphical user interface, at least a portion of the digital image over time. In particular embodiments, the act 1906b includes dynamically modifying, within the graphical user interface, at least a portion of the digital image over time to simulate the dynamical system within the digital image according to the dynamic-simulation function. In certain implementations, the act 1906b comprises dynamically modifying at least the portion of the digital image corresponding to an image tonal region, an image color region, or an image edge region. Additionally or alternatively, the act 1906b comprises dynamically modifying at least the portion of the digital image corresponding to a range or set of either absolute image pixel coordinates or texel coordinates.

In these or other embodiments, the act 1906b comprises dynamically modifying, within the graphical user interface, pixel color values for one or more pixels of the digital image to simulate the dynamical system over time by utilizing the dynamic-simulation function to update one or more of the simulation values across the simulation flow field. In certain implementations, updating one or more of the simulation values across the simulation flow field comprises utilizing the dynamic-simulation function to determine a direction and an amount of a simulation value for a spatial location to spatially translate away from the spatial location at a next time step following an initial time step.

It is understood that the outlined acts in the series of acts 1900 are only provided as examples, and some of the acts may be optional, combined into fewer acts, or expanded into additional acts without detracting from the essence of the disclosed embodiments. Additionally, the acts described herein may be repeated or performed in parallel with one another or in parallel with different instances of the same or similar acts. As an example of an additional act not shown in FIG. 19, act(s) in the series of acts 1900 may include an act of: generating a simulation flow field comprising simulation values at spatial locations associated with the digital image, the simulation values corresponding to one of preset values or characteristics of the digital image; and dynamically modifying at least the portion of the digital image by modifying pixel color values for one or more pixels of the digital image to simulate the dynamical system by utilizing the dynamic-simulation function to update one or more of the simulation values across the simulation flow field.

In another example of an additional act not shown in FIG. 19, act(s) in the series of acts 1900 may include an act of: rendering, for an initial time step, pixel color values for the digital image to simulate the dynamical system within the digital image according to simulation values within a simulation flow field based on the dynamic-simulation function; detecting additional user input to apply an image filter or an image modification to the digital image; and based on detecting the additional user input, rendering, for a subsequent time step, adjusted pixel color values for the digital image to depict the digital image with the image filter or the image modification while simulating the dynamical system within the digital image.

As another example of an additional act not shown in FIG. 19, act(s) in the series of acts 1900 may include an act of: detecting, via the graphical user interface, additional user input to: alter, pause, rewind to, or bookmark one or more image frames corresponding to the simulation within the digital image of the dynamical system within the digital image; and capturing the one or more image frames at one or more particular times during the simulation within the digital image of the dynamical system. In certain implementations, altering the simulation of the dynamical system within the digital image comprises modifying one or more simulation values across the simulation flow field.

In yet another example of an additional act not shown in FIG. 19, act(s) in the series of acts 1900 may include an act of: detecting, via the graphical user interface, additional user input to bookmark a portion of the simulation; and continuing with the simulation; or returning to the bookmarked portion of the simulation to save an image frame of the digital image corresponding to the bookmarked portion or begin a new simulation starting from the bookmarked portion.

In a further example of an additional act not shown in FIG. 19, act(s) in the series of acts 1900 may include an act of detecting, via the graphical user interface, additional user input to increase or decrease a speed of simulating the dynamical system within the digital image.

In an additional example of an additional act not shown in FIG. 19, act(s) in the series of acts 1900 may include: based on detecting the user input to select the dynamic image filter, generating a mask that overlays the digital image; and dynamically modifying, within the graphical user interface, at least a portion of the mask over time to selectively reveal one or more portions of the digital image by simulating the dynamical system within the mask according to the dynamic-simulation function and one or more additional user inputs selecting one or more portions of the mask.

In another example of an additional act not shown in FIG. 19, act(s) in the series of acts 1900 may include an act of: determining, for a time step, at least one of density values, velocity values, or temperature values corresponding to the dynamical system for a physical effect or property of a physical matter utilizing the dynamic-simulation function; generating a simulation flow field corresponding to the digital image comprising at least one of the density values, the velocity values, or the temperature values for the physical effect or property of the physical matter at spatial locations associated with the digital image; and rendering, for the time step, updated pixel color values for the digital image to simulate the dynamical system for the physical effect or property of the physical matter according to at least one of the density values, the velocity values, or the temperature values within the simulation flow field based on the dynamic-simulation function.

In yet another example of an additional act not shown in FIG. 19, act(s) in the series of acts 1900 may include an act of generating a simulation flow field comprising simulation values at spatial locations associated with the digital image.

In a further example of an additional act not shown in FIG. 19, act(s) in the series of acts 1900 may include an act of updating one or more of the simulation values across the simulation flow field by utilizing the dynamic-simulation function to spatially translate a simulation value for a spatial location at an initial time step to a neighboring spatial location at a next time step following the initial time step.

In an additional example of an additional act not shown in FIG. 19, act(s) in the series of acts 1900 may include an act of: identifying a pixel with a set of pixel color values corresponding to a simulation value for a spatial location at an initial time step; spatially translating, at a next time step following the initial time step, a different simulation value to the spatial location from a neighboring spatial location in accordance with the dynamic-simulation function; and updating, at the next time step, the pixel to include a different set of pixel color values corresponding to the different simulation value spatially translated to the spatial location from the neighboring spatial location.

In another example of an additional act not shown in FIG. 19, act(s) in the series of acts 1900 may include an act of: generating a mask comprising an additional digital image that overlays the digital image; dynamically modifying, within the graphical user interface, at least a portion of the mask over time to selectively reveal one or more portions of the digital image by simulating the dynamical system within the mask according to the dynamic-simulation function and one or more additional user inputs selecting one or more portions of the mask; and based on revealing the one or more portions of the digital image, simultaneously hiding one or more corresponding portions of the additional digital image to dynamically generate a composite image of both the digital image and the additional digital image.

In yet another example of an additional act not shown in FIG. 19, act(s) in the series of acts 1900 may include an act of: determining, for a time step, at least one of density values, velocity values, temperature values, viscosity values, vorticity values, intensity values, concentration values, opacity values, or rate-of-diffusion values corresponding to the dynamical system for a physical effect or property of a physical matter utilizing the dynamic-simulation function; generating the simulation flow field comprising at least one of the density values, the velocity values, the temperature values, the viscosity values, the vorticity values, the intensity values, the concentration values, the opacity values, or the rate-of-diffusion values for the physical effect or property of the physical matter at the spatial locations associated with the digital image; and rendering, for the time step, updated pixel color values for the digital image to simulate the dynamical system for the physical effect or property of the physical matter according to at least one of the density values, the velocity values, the temperature values, the viscosity values, the vorticity values, the intensity values, the concentration values, or the rate-of-diffusion values within the simulation flow field based on the dynamic-simulation function.

In a further example of an additional act not shown in FIG. 19, act(s) in the series of acts 1900 may include an act of: prior to detecting a selection of the dynamic image filter, apply a parameterized-static-filter to generate a static version of the digital image; and based on detecting the user input to select the dynamic image filter, dynamically modify pixel color values for one or more pixels of the static version of the digital image to simulate the dynamical system over time.

In yet another example an additional act not shown in FIG. 19, act(s) in the series of acts 1900 may include an act of detecting an additional user input to select a portion of the digital image at which to apply the dynamic image filter.

As just mentioned, in one or more embodiments, act(s) the series of acts 1900 include based on detecting the user input to select the dynamic image filter, performing a step for simulating the dynamical system within the digital image over time. For instance, the act of identifying a dynamic-simulation function corresponding to a dynamical system and the acts described above in relation to FIGS. 4A-4B can comprise the corresponding acts (or structure) for performing a step for simulating the dynamical system within the digital image over time.

Embodiments of the present disclosure may comprise or utilize a special purpose or general-purpose computer including computer hardware, such as, for example, one or more processors and system memory, as discussed in greater detail below. Embodiments within the scope of the present disclosure also include physical and other computer-readable media for carrying or storing computer-executable instructions and/or data structures. In particular, one or more of the processes described herein may be implemented at least in part as instructions embodied in a non-transitory computer-readable medium and executable by one or more computing devices (e.g., any of the media content access devices described herein). In general, a processor (e.g., a microprocessor) receives instructions, from a non-transitory computer-readable medium, (e.g., memory), and executes those instructions, thereby performing one or more processes, including one or more of the processes described herein.

Computer-readable media can be any available media that can be accessed by a general purpose or special purpose computer system. Computer-readable media that store computer-executable instructions are non-transitory computer-readable storage media (devices). Computer-readable media that carry computer-executable instructions are transmission media. Thus, by way of example, and not limitation, embodiments of the disclosure can comprise at least two distinctly different kinds of computer-readable media: non-transitory computer-readable storage media (devices) and transmission media.

Non-transitory computer-readable storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to non-transitory computer-readable storage media (devices) (or vice versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. Thus, it should be understood that non-transitory computer-readable storage media (devices) can be included in computer system components that also (or even primarily) utilize transmission media.

Computer-executable instructions comprise, for example, instructions and data which, when executed by a processor, cause a general-purpose computer, special purpose computer, or special purpose processing device to perform a certain function or group of functions. In some embodiments, computer-executable instructions are executed by a general-purpose computer to turn the general-purpose computer into a special purpose computer implementing elements of the disclosure. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Embodiments of the present disclosure can also be implemented in cloud computing environments. As used herein, the term "cloud computing" refers to a model for enabling on-demand network access to a shared pool of configurable computing resources. For example, cloud computing can be employed in the marketplace to offer ubiquitous and convenient on-demand access to the shared pool of configurable computing resources. The shared pool of configurable computing resources can be rapidly provisioned via virtualization and released with low management effort or service provider interaction, and then scaled accordingly.

A cloud-computing model can be composed of various characteristics such as, for example, on-demand self-service, broad network access, resource pooling, rapid elasticity, measured service, and so forth. A cloud-computing model can also expose various service models, such as, for example, Software as a Service ("SaaS"), Platform as a Service ("PaaS"), and Infrastructure as a Service ("IaaS"). A cloud-computing model can also be deployed using different deployment models such as private cloud, community cloud, public cloud, hybrid cloud, and so forth. In addition, as used herein, the term "cloud-computing environment" refers to an environment in which cloud computing is employed.

Figure 20:
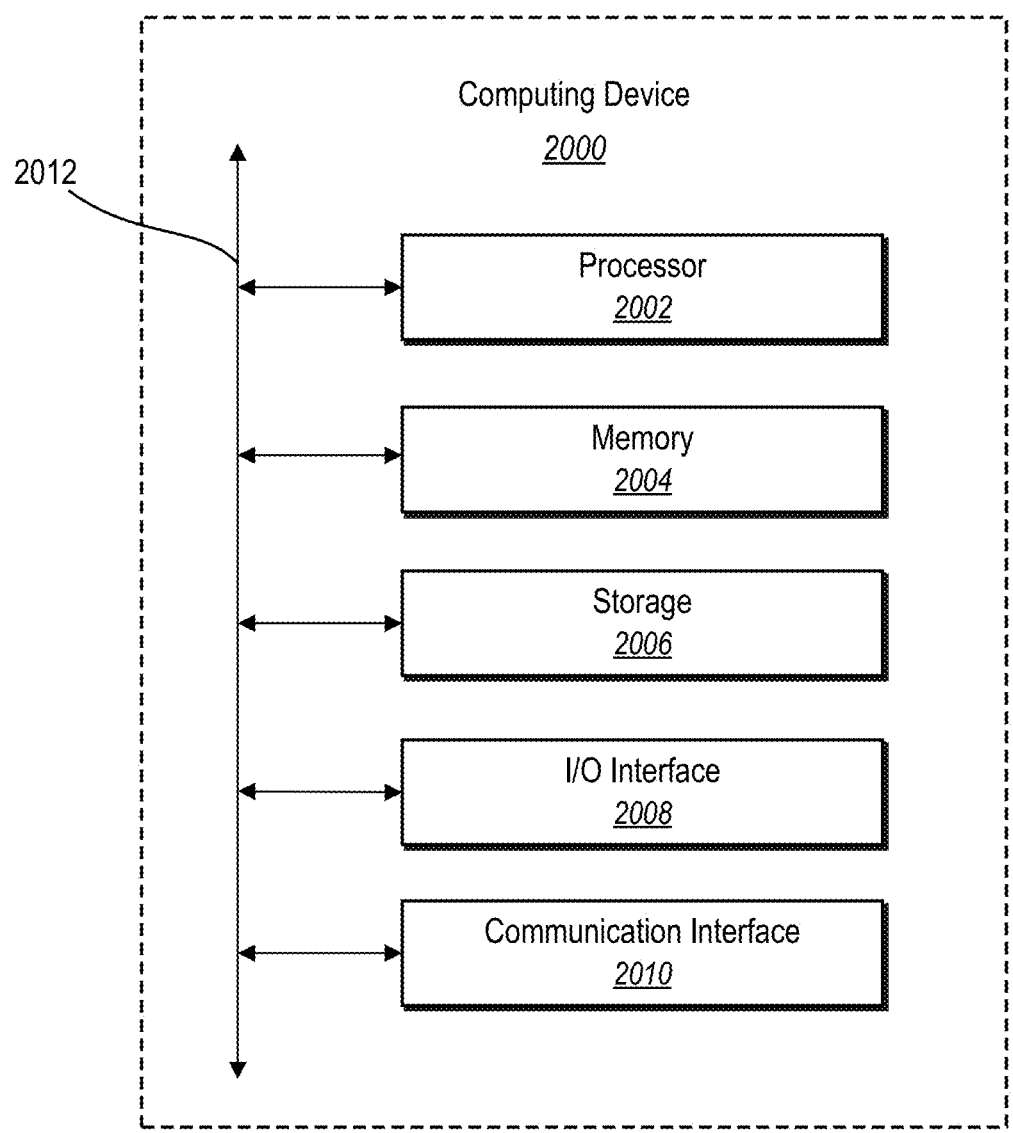
FIG. 20 illustrates a block diagram of an example computing device for implementing one or more embodiments of the present disclosure.

FIG. 20 illustrates a block diagram of an example computing device 2000 that may be configured to perform one or more of the processes described above. One will appreciate that one or more computing devices, such as the computing device 2000 may represent the computing devices described above (e.g., the server(s) 102, the client device 106, and/or the computing devices 500-1800,). In one or more embodiments, the computing device 2000 may be a mobile device (e.g., a mobile telephone, a smartphone, a PDA, a tablet, a laptop, a camera, a tracker, a watch, a wearable device, etc.). In some embodiments, the computing device 2000 may be a non-mobile device (e.g., a desktop computer or another type of client device). Further, the computing device 2000 may be a server device that includes cloud-based processing and storage capabilities.

As shown in FIG. 20, the computing device 2000 can include one or more processor(s) 2002, memory 2004, a storage device 2006, input/output interfaces 2008 (or "I/O interfaces 2008"), and a communication interface 2010, which may be communicatively coupled by way of a communication infrastructure (e.g., bus 2012). While the computing device 2000 is shown in FIG. 20, the components illustrated in FIG. 20 are not intended to be limiting. Additional or alternative components may be used in other embodiments. Furthermore, in certain embodiments, the computing device 2000 includes fewer components than those shown in FIG. 20. Components of the computing device 2000 shown in FIG. 20 will now be described in additional detail.

In particular embodiments, the processor(s) 2002 includes hardware for executing instructions, such as those making up a computer program. As an example, and not by way of limitation, to execute instructions, the processor(s) 2002 may retrieve (or fetch) the instructions from an internal register, an internal cache, memory 2004, or a storage device 2006 and decode and execute them.

The computing device 2000 includes memory 2004, which is coupled to the processor(s) 2002. The memory 2004 may be used for storing data, metadata, and programs for execution by the processor(s). The memory 2004 may include one or more of volatile and non-volatile memories, such as Random-Access Memory ("RAM"), Read-Only Memory ("ROM"), a solid-state disk ("SSD"), Flash, Phase Change Memory ("PCM"), or other types of data storage. The memory 2004 may be internal or distributed memory.

The computing device 2000 includes a storage device 2006 includes storage for storing data or instructions. As an example, and not by way of limitation, the storage device 2006 can include a non-transitory storage medium described above. The storage device 2006 may include a hard disk drive (HDD), flash memory, a Universal Serial Bus (USB) drive or a combination these or other storage devices.

As shown, the computing device 2000 includes one or more I/O interfaces 2008, which are provided to allow a user to provide input to (such as user strokes), receive output from, and otherwise transfer data to and from the computing device 2000. These I/O interfaces 2008 may include a mouse, keypad or a keyboard, a touch screen, camera, optical scanner, network interface, modem, other known I/O devices or a combination of such I/O interfaces 2008. The touch screen may be activated with a stylus or a finger.

The I/O interfaces 2008 may include one or more devices for presenting output to a user, including, but not limited to, a graphics engine, a display (e.g., a display screen), one or more output drivers (e.g., display drivers), one or more audio speakers, and one or more audio drivers. In certain embodiments, I/O interfaces 2008 are configured to provide graphical data to a display for presentation to a user. The graphical data may be representative of one or more graphical user interfaces and/or any other graphical content as may serve a particular implementation.

The computing device 2000 can further include a communication interface 2010. The communication interface 2010 can include hardware, software, or both. The communication interface 2010 provides one or more interfaces for communication (such as, for example, packet-based communication) between the computing device and one or more other computing devices or one or more networks. As an example, and not by way of limitation, communication interface 2010 may include a network interface controller (NIC) or network adapter for communicating with an Ethernet or other wire-based network or a wireless NIC (WNIC) or wireless adapter for communicating with a wireless network, such as a WI-FI. The computing device 2000 can further include a bus 2012. The bus 2012 can include hardware, software, or both that connects components of the computing device 2000 to each other.

In the foregoing specification, the invention has been described with reference to specific example embodiments thereof. Various embodiments and aspects of the invention(s) are described with reference to details discussed herein, and the accompanying drawings illustrate the various embodiments. The description above and drawings are illustrative of the invention and are not to be construed as limiting the invention. Numerous specific details are described to provide a thorough understanding of various embodiments of the present invention.

The present invention may be embodied in other specific forms without departing from its spirit or essential characteristics. The described embodiments are to be considered in all respects only as illustrative and not restrictive. For example, the methods described herein may be performed with less or more steps/acts or the steps/acts may be performed in differing orders. Additionally, the steps/acts described herein may be repeated or performed in parallel to one another or in parallel to different instances of the same or similar steps/acts. The scope of the invention is, therefore, indicated by the appended claims rather than by the foregoing description. All changes that come within the meaning and range of equivalency of the claims are to be embraced within their scope.

What is claimed is:

1. A non-transitory computer-readable storage medium comprising instructions that, when executed by at least one processor, cause a computing device to:
   present, within a graphical user interface, a digital image and one or more dynamic image filters for user selection;
   detect a user input to select a dynamic image filter from the one or more dynamic image filters to simulate, within the digital image, a dynamical system; and
   based on detecting the user input to select the dynamic image filter:
      identify a dynamic-simulation function corresponding to the dynamical system; and
      dynamically modify, within the graphical user interface, at least a portion of the digital image over time to simulate the dynamical system within the digital image according to the dynamic-simulation function.

2. The non-transitory computer-readable storage medium of claim 1, further comprising instructions that, when executed by the at least one processor, cause the computing device to dynamically modify at least the portion of the digital image over time to simulate the dynamical system by simulating a particular dynamical system corresponding to a physical effect or property of a physical matter or an effect or property of an iterated function system.

3. The non-transitory computer-readable storage medium of claim 2, further comprising instructions that, when executed by the at least one processor, cause the computing device to simulate the particular dynamical system corresponding to the physical effect or property of the physical matter by simulating at least one of gravity, a fluid, smoke, fire, rain, a light ray, light refraction, an atmospheric cloud, interacting chemicals, reaction diffusion, cellular automata, or an image bloom.

4. The non-transitory computer-readable storage medium of claim 1, further comprising instructions that, when executed by the at least one processor, cause the computing device to:
   generate a simulation flow field comprising simulation values at spatial locations associated with the digital image, the simulation values corresponding to one of preset values or characteristics of the digital image; and
   dynamically modify at least the portion of the digital image by modifying pixel color values for one or more pixels of the digital image to simulate the dynamical system by utilizing the dynamic-simulation function to update one or more of the simulation values across the simulation flow field.

5. The non-transitory computer-readable storage medium of claim 1, further comprising instructions that, when executed by the at least one processor, cause the computing device to:
render, for an initial time step, pixel color values for the digital image to simulate the dynamical system within the digital image according to simulation values within a simulation flow field based on the dynamic-simulation function;
detect additional user input to apply an image filter or an image modification to the digital image; and
based on detecting the additional user input, render, for a subsequent time step, adjusted pixel color values for the digital image to depict the digital image with the image filter or the image modification while simulating the dynamical system within the digital image.

6. The non-transitory computer-readable storage medium of claim 1, further comprising instructions that, when executed by the at least one processor, cause the computing device to dynamically modify at least the portion of the digital image corresponding to an image tonal region, an image color region, or an image edge region.

7. The non-transitory computer-readable storage medium of claim 1, further comprising instructions that, when executed by the at least one processor, cause the computing device to dynamically modify at least the portion of the digital image corresponding to a range or set of either absolute image pixel coordinates or texel coordinates.

8. The non-transitory computer-readable storage medium of claim 1, further comprising instructions that, when executed by the at least one processor, cause the computing device to detect, via the graphical user interface, additional user input to:
alter, pause, rewind to, or bookmark one or more image frames corresponding to a simulation of the dynamical system within the digital image; and
capture the one or more image frames at one or more particular times during the simulation within the digital image of the dynamical system.

9. The non-transitory computer-readable storage medium of claim 1, further comprising instructions that, when executed by the at least one processor, cause the computing device to:
detect, via the graphical user interface, additional user input to bookmark a portion of a simulation of the dynamic system within the digital image; and
continue with the simulation; or
return to the bookmarked portion of the simulation to save an image frame of the digital image corresponding to the bookmarked portion or begin a new simulation starting from the bookmarked portion.

10. The non-transitory computer-readable storage medium of claim 1, further comprising instructions that, when executed by the at least one processor, cause the computing device to detect, via the graphical user interface, additional user input to increase or decrease a speed of simulating the dynamical system within the digital image.

11. A system comprising:
one or more memory devices comprising a digital image and a set of dynamic image filters; and
one or more processors configured to cause the system to:
present, within a graphical user interface, the digital image and the set of dynamic image filters for user selection;
detect a user input to select a dynamic image filter from the set of dynamic image filters to simulate a dynamical system in the digital image; and
based on detecting the user input to select the dynamic image filter:
identify a dynamic-simulation function corresponding to the dynamical system;
generate a simulation flow field comprising simulation values at spatial locations associated with the digital image; and
dynamically modify, within the graphical user interface, pixel color values for one or more pixels of the digital image to simulate the dynamical system over time by utilizing the dynamic-simulation function to update one or more of the simulation values across the simulation flow field.

12. The system of claim 11, wherein the one or more processors are further configured to cause the system to update one or more of the simulation values across the simulation flow field by utilizing the dynamic-simulation function to spatially translate a simulation value for a spatial location at an initial time step to a neighboring spatial location at a next time step following the initial time step.

13. The system of claim 11, wherein the one or more processors are further configured to cause the system to:
identify a pixel with a set of pixel color values corresponding to a simulation value for a spatial location at an initial time step;
spatially translate, at a next time step following the initial time step, a different simulation value to the spatial location from a neighboring spatial location in accordance with the dynamic-simulation function; and
update, at the next time step, the pixel to include a different set of pixel color values corresponding to the different simulation value spatially translated to the spatial location from the neighboring spatial location.

14. The system of claim 11, wherein the one or more processors are further configured to cause the system to update one or more of the simulation values across the simulation flow field by utilizing the dynamic-simulation function to determine a direction and an amount of a simulation value for a spatial location to spatially translate away from the spatial location at a next time step following an initial time step.

15. The system of claim 11, wherein the one or more processors are further configured to cause the system to:
generate a mask comprising an additional digital image that overlays the digital image;
dynamically modify, within the graphical user interface, at least a portion of the mask over time to selectively reveal one or more portions of the digital image by simulating the dynamical system within the mask according to the dynamic-simulation function and one or more additional user inputs selecting one or more portions of the mask; and
based on revealing the one or more portions of the digital image, simultaneously hide one or more corresponding portions of the additional digital image to dynamically generate a composite image of both the digital image and the additional digital image.

16. The system of claim 11, wherein the one or more processors are further configured to cause the system to detect, via the graphical user interface, additional user input to alter the simulation of the dynamical system within the digital image by modifying one or more simulation values across the simulation flow field.

17. The system of claim 11, wherein the one or more processors are further configured to cause the system to:
  determine, for a time step, at least one of density values, velocity values, temperature values, viscosity values, vorticity values, intensity values, concentration values, opacity values, or rate-of-diffusion values corresponding to the dynamical system for a physical effect or property of a physical matter utilizing the dynamic-simulation function;
  generate the simulation flow field comprising at least one of the density values, the velocity values, the temperature values, the viscosity values, the vorticity values, the intensity values, the concentration values, the opacity values, or the rate-of-diffusion values for the physical effect or property of the physical matter at the spatial locations associated with the digital image; and
  render, for the time step, updated pixel color values for the digital image to simulate the dynamical system for the physical effect or property of the physical matter according to at least one of the density values, the velocity values, the temperature values, the viscosity values, the vorticity values, the intensity values, the concentration values, or the rate-of-diffusion values within the simulation flow field based on the dynamic-simulation function.

18. The system of claim 11, wherein the one or more processors are further configured to cause the system to:
  prior to detecting a selection of the dynamic image filter, apply a parameterized-static-filter to generate a static version of the digital image; and
  based on detecting the user input to select the dynamic image filter, dynamically modify pixel color values for one or more pixels of the static version of the digital image to simulate the dynamical system over time.

19. A computer-implemented method comprising:
  providing, for display within a graphical user interface, a digital image and a set of dynamic image filters for user selection;
  detecting, via the graphical user interface, a user input to select a dynamic image filter from the set of dynamic image filters to simulate, within the digital image, a dynamical system;
  based on detecting the user input to select the dynamic image filter:
    identify a dynamic-simulation function corresponding to the dynamical system; and
    dynamically modify, within the graphical user interface, at least a portion of the digital image over time to simulate the dynamical system within the digital image according to the dynamic-simulation function; and
  detecting, via the graphical user interface, additional user input to capture an image frame of a modified version of the digital image at a particular time during simulation of the dynamical system.

20. The computer-implemented method of claim 19, further comprising detecting an additional user input to select a portion of the digital image at which to apply the dynamic image filter.

* * * * *